(12) United States Patent
Minamiru et al.

(10) Patent No.: US 9,673,351 B2
(45) Date of Patent: Jun. 6, 2017

(54) METHOD OF MANUFACTURING SEMICONDUCTOR CHIPS

(71) Applicant: FUJI XEROX CO., LTD., Tokyo (JP)

(72) Inventors: Takeshi Minamiru, Ebina (JP); Michiaki Murata, Ebina (JP); Kenji Yamazaki, Ebina (JP); Tsutomu Otsuka, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 15/171,463

(22) Filed: Jun. 2, 2016

(65) Prior Publication Data
US 2016/0276525 A1 Sep. 22, 2016

Related U.S. Application Data

(63) Continuation of application No. 14/877,592, filed on Oct. 7, 2015, now Pat. No. 9,385,268.

(30) Foreign Application Priority Data

Nov. 10, 2014 (JP) .................. 2014-227664
Nov. 10, 2014 (JP) .................. 2014-227665
Nov. 25, 2014 (JP) .................. 2014-237293

(51) Int. Cl.
H01L 21/00 (2006.01)
H01L 33/00 (2010.01)
H01L 21/78 (2006.01)
H01S 5/02 (2006.01)

(52) U.S. Cl.
CPC .......... *H01L 33/0095* (2013.01); *H01L 21/78* (2013.01); *H01S 5/0202* (2013.01)

(58) Field of Classification Search
CPC ................................. H01L 33/0095

USPC ......................................... 438/462
See application file for complete search history.

(56) References Cited

U.S. PATENT DOCUMENTS

2014/0273402 A1   9/2014   Tsai et al.

FOREIGN PATENT DOCUMENTS

| JP | H11-177139 A | 7/1999 |
| JP | 2001-284293 A | 10/2001 |
| JP | 2003-124151 A | 4/2003 |
| JP | 2006-218571 A | 8/2006 |
| JP | 2009-088252 A | 4/2009 |
| JP | 2013-022713 A | 2/2013 |

(Continued)

OTHER PUBLICATIONS

Mar. 17, 2015 Office Action issued in Japanese Patent Application No. 2014-227664.

(Continued)

*Primary Examiner* — Anthony Ho
(74) *Attorney, Agent, or Firm* — Oliff PLC

(57) ABSTRACT

A method of manufacturing semiconductor chips includes: forming grooves on a front face side of a substrate; and forming grooves on a back face side of the substrate as defined herein, and in manufacturing conditions in which a variation range of a top section of the cutting member having a tapered tip end shape with no top face in the groove width direction changes from a range included in the groove on the front face side to a range away from the groove on the front face side as wear of the cutting member advances, the use of the cutting member is stopped before the variation range changes from the range included in the groove on the front face side to the range away from the groove on the front face side.

11 Claims, 19 Drawing Sheets

(56) References Cited

FOREIGN PATENT DOCUMENTS

| | | |
|---|---|---|
| JP | 2013-059833 A | 4/2013 |
| JP | 2014-103341 A | 6/2014 |
| JP | 2014-183310 A | 9/2014 |

OTHER PUBLICATIONS

Mar. 17, 2015 Office Action issued in Japanese Patent Application No. 2014-227665.
Mar. 2, 2016 Office Action issued in U.S Appl. No. 14/877,592.

| CURVATURE RADIUS OF TIP END CORNER SECTION (μm) | 1 | 2 | 3 | 4 | 5 | 6 | 7 | 8 | 9 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|
| KERF WIDTH (μm) | 25 | 25 | 25 | 25 | 25 | 25 | 24 | 24 | 23 | 19 | 18 | 17 | 16 | 15 | 14 | 13 | 11 | 10 | 9 | 8 |
| SUITABILITY OF USE | × | × | × | × | × | × | × | × | ○ | ○ | ○ | ○ | ○ | ○ | ○ | ○ | ○ | ○ | × | × |

| THICKNESS T OF STEPPED SECTION (μm) | WIDTH Sa (μm) OF GROOVE ON FRONT FACE SIDE | | | |
|---|---|---|---|---|
| | 5 | 7.5 | 10 | 15 |
| 45 | A | A | A | A |
| 25 | D | B | A | A |

| A | ±7.5 μm OR MORE |
|---|---|
| B | ±5 TO 7.5 μm |
| C | ±3 TO 5 μm |
| D | LESS THAN ±3 μm |

● : RADICAL
○ : ION

METHOD OF MANUFACTURING SEMICONDUCTOR CHIPS

CROSS-REFERENCE TO THE RELATED APPLICATIONS

This application is a continuation application of U.S. patent application Ser. No. 14/877,592 filed Oct. 7, 2015, which is based on and claims priority under 35 USC 119 from Japanese Patent Application No. 2014-227664 filed on Nov. 10, 2014, Patent Application No. 2014-227665 filed on Nov. 10, 2014 and Patent Application No. 2014-237293 filed on Nov. 25, 2014, the entire contents of which are incorporated by reference herein.

BACKGROUND

Technical Field

The present invention relates to a method of manufacturing semiconductor chips.

SUMMARY

According to an aspect of the invention, there is provided a method of manufacturing semiconductor chips comprising: a step of forming grooves on a front face side of a substrate; and a step of forming grooves on a back face side of the substrate communicating with the grooves on the front face side using a rotating cutting member having a thickness thicker than width of inlet portions of the grooves on the front face side from the back face side of the substrate and dicing the substrate into semiconductor chips, wherein in manufacturing conditions in which a variation range of a top section of the cutting member having a tapered tip end shape with no top face in the groove width direction changes from a range included in the groove on the front face side to a range away from the groove on the front face side as wear of the cutting member advances, the use of the cutting member is stopped before the variation range changes from the range included in the groove on the front face side to the range away from the groove on the front face side.

BRIEF DESCRIPTION OF THE DRAWINGS

Exemplary embodiments of the present invention will be described in detail based on the following figures, wherein.

DESCRIPTION OF REFERENCE NUMERALS AND SIGNS

Figure 1:
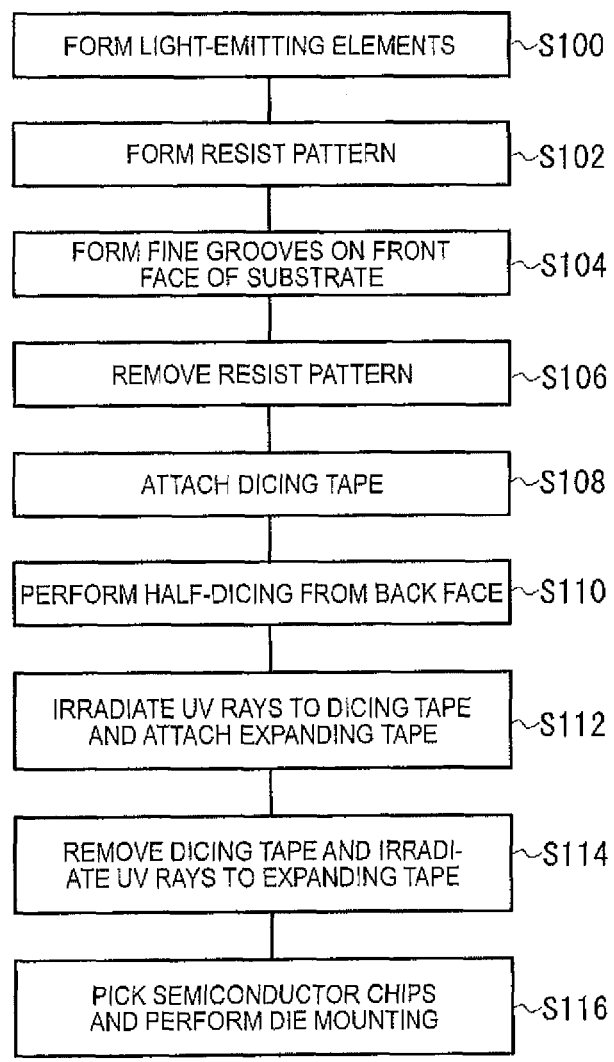
FIG. 1 is a flowchart showing an example of a semiconductor chip manufacturing process according to an Example of the present invention.

100: light-emitting element
120: cutting region (scribe line)
130: resist pattern
140: groove on front face side (fine groove)
160: dicing tape
170: groove on back face side
180, 200: ultraviolet rays
190: expanding tape
210: semiconductor chip
300, 300A, 302: dicing blade
310, 320: side face
330, 332, 352, 362: curved face
340: top face
350, 360: chamfered section
400: stepped section
410: root region
500, 502, 504, 506, 508: dicing blade
510, 520: side face
512, 522: inclined face
530, 534, 536: pointed top section
532, 532A: flat face
610: shaping board
620: motor
630: dicing blade
640: chuck

DETAILED DESCRIPTION

A method of manufacturing semiconductor chips according to the present invention is applied to a method of manufacturing individual semiconductor chips by dividing (dicing) a substrate-shaped member, such as a semiconductor wafer, on which, for example, a plurality of semiconductor elements are formed. The semiconductor elements to be formed on the substrate are not limited particularly and include light-emitting elements, active elements, passive elements, etc. In a preferable mode, the manufacturing method according to the present invention is applied to a method of taking out semiconductor chips containing light-emitting elements from the substrate, and the light-emitting elements can be, for example, surface-emitting semiconductor lasers, light-emitting diodes and light-emitting thyristors. A single semiconductor chip may contain a single light-emitting element or may contain a plurality of light-emitting elements arranged in an array and can additionally contain a drive circuit for driving such a single or a plurality of light-emitting elements. Furthermore, the substrates can be those made of, for example, silicon, SiC, compound semiconductor and sapphire, but the substrates are not limited to these substrates, and substrates made of other materials may also be used, provided that the substrates contain at least semiconductors (hereafter generally referred to as semiconductor substrates). Preferably, the substrates are semiconductor substrates made of III-V compounds, such as GaAs, on which light-emitting elements, such as surface-emitting semiconductor lasers, light-emitting diodes, are formed.

A method of forming a plurality of light-emitting elements on a semiconductor substrate and taking out individual semiconductor chips from the semiconductor substrate will be described below referring to the accompanying drawings. Since the scales and shapes shown in the drawings are emphasized for easy understanding of the characteristics of the present invention, it should be noted that the scales and shapes of the devices shown therein are not necessarily identical to those of actual devices.

FIG. 1 is a flowchart showing an example of a semiconductor chip manufacturing process according to an Example of the present invention. As shown in FIG. 1, a method of manufacturing semiconductor chips according to the Example includes a step (S100) of forming light-emitting elements, a step (S102) of forming a resist pattern, a step (S104) of forming fine grooves on the front face of a semiconductor substrate, a step (S106) of removing the resist pattern, a step (S108) of attaching a dicing tape to the front face of the semiconductor substrate, a step (S110) of performing half-dicing from the back face of the semiconductor substrate, a step (S112) of irradiating ultraviolet (UV) rays to the dicing tape and attaching an expanding tape to the back face of the semiconductor substrate, a step (S114) of removing the dicing tape and irradiating ultraviolet rays to the expanding tape, and a step (S116) of picking semiconductor chips and performs die mounting on a circuit board or the like. The cross-sectional views showing the semiconductor substrate in FIGS. 2A to 2D and FIGS. 3E to 3I respectively correspond to steps S100 to S116.

Figure 2A:
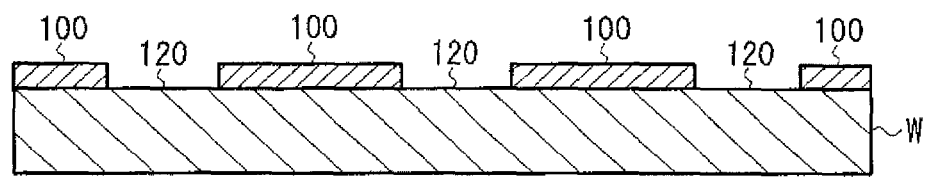
FIGS. 2A, 2B, 2C and 2D are schematic cross-sectional views each showing a semiconductor substrate in the semiconductor chip manufacturing process according to the Example of the present invention.

At step (S100) of forming the light-emitting elements, as shown in FIG. 2A, a plurality of light-emitting elements 100 are forming on the front face of a semiconductor substrate W made of GaAs, for example. The light-emitting elements 100 are surface emitting semiconductor lasers, light-emitting diodes, light-emitting thyristors, etc. Although a single region is indicated as the light-emitting element 100 in the figures, it should be noted that a single light-emitting element 100 indicates, as an example, an element contained in an individualized single semiconductor chip and that not only a single light-emitting element but also a plurality of light-emitting elements and other circuit elements can be contained at the region of the single light-emitting element 100.

Figure 4:
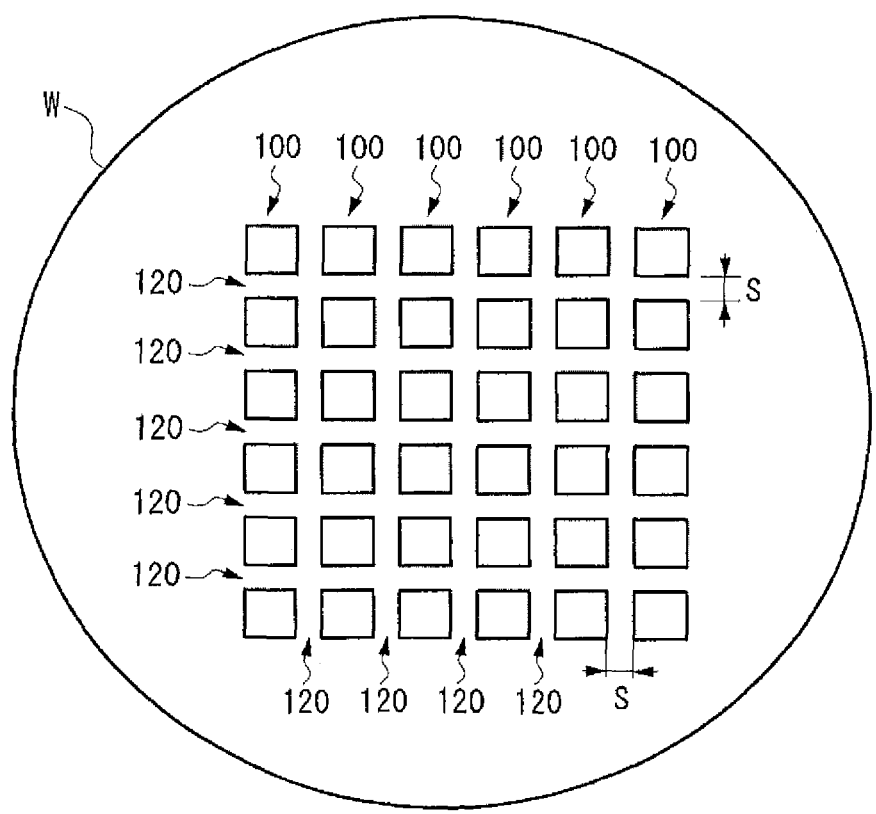
FIG. 4 is a schematic plan view showing a semiconductor substrate (wafer) at the time when circuit formation is completed.

FIG. 4 is a plan view showing an example of the semiconductor substrate W at the time when the step of forming the light-emitting elements is completed. In the figure, only the light-emitting elements 100 located at the central portion are shown as examples for convenience. On the front face of the semiconductor substrate W, the plurality of light-emitting elements 100 are formed in arrays in the matrix directions. The flat region of a single light-emitting element 100 has a nearly rectangular shape, and the respective light-emitting elements 100 are arranged in a lattice shape so as to be separated by cutting regions 120 that are defined by scribe lines or the like spaced at a constant space S.

Figure 2B:
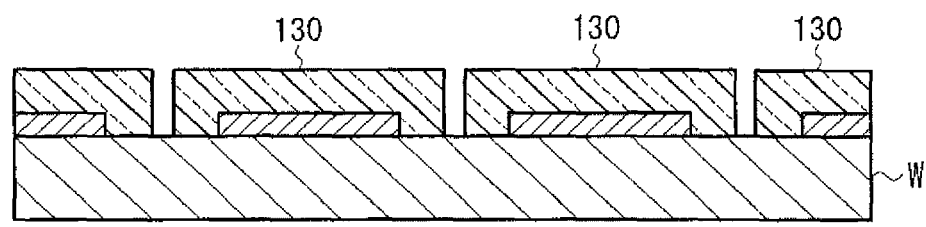

Next, when the formation of the light-emitting elements is completed, a resist pattern is formed on the front face of the semiconductor substrate W (at S102). As shown in FIG. 2B, a resist pattern 130 is processed so that the cutting regions 120 defined by the scribe lines or the like on the front face of the semiconductor substrate W are exposed. The processing of the resist pattern 130 is performed at a photolithography step.

Figure 2C:
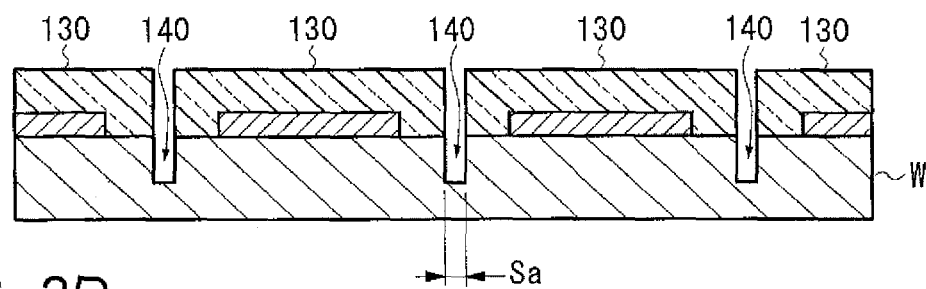

Next, fine grooves are formed on the front face of the semiconductor substrate W (at S104). As shown in FIG. 2C, fine grooves having a constant width (hereafter referred to as fine grooves or grooves on the front face side for convenience) 140 are formed on the front face of the semiconductor substrate W by using the resist pattern 130 as a mask. These kinds of grooves can be formed, for example, by anisotropic etching, and preferably can be formed by anisotropic plasma etching (reactive ion etching) serving as anisotropic dry etching. Although, a thin dicing blade or isotropic etching may also be used to form the grooves, the anisotropic dry etching can form narrower and deeper grooves on the front face side than the isotropic etching and can suppress the influence of vibration, stress, etc. on the light-emitting elements 100 in the peripheries of the fine grooves more effectively than the method using the dicing blade, thereby being preferable. The width Sa of the fine groove 140 is nearly equal to the width of the opening formed in the resist pattern 130 and is in the range of several μm to ten-odd μm, for example. Preferably, the width Sa is approximately 3 μm to approximately 15 μm. Furthermore, its depth is in the range of approximately 10 μm to approximately 100 μm, for example, and the depth is made at least deeper than the depth at which a function element, such as a light-emitting element, is formed. Preferably, the depth of the microgroove 140 is approximately 30 μm to approximately 80 μm. In the case that the fine grooves 140 are formed by using an ordinary dicing blade, the space S of the cutting region 120, i.e., the total of the groove width obtained by the dicing blade itself and a margin width in consideration of the amount of chipping, becomes large up to approximately 40 to 80 μm. On the other hand, in the case that the fine grooves 140 are formed in a semiconductor process, the groove width can be made narrower and the margin width for the cutting can also be made narrower than the margin width in the case that the dicing blade is used. In other words, the space S of the cutting region 120 can be made smaller, whereby the light-emitting elements can be arranged on the wafer at high density and the number of semiconductor chips to be acquired can be increased. The "front face side" in the Example refers to the side of the face on which function elements, such as light-emitting elements, are formed, and the "back face side" refers to the side of the face on the opposite side of the "front face side".

Figure 2D:
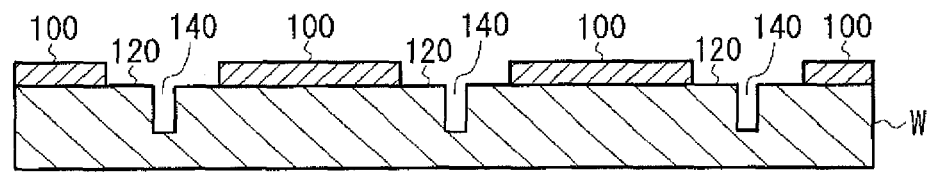

Next, the resist pattern is removed (at S106). As shown in FIG. 2D, when the resist pattern 130 is removed from the front face of the semiconductor substrate, the fine grooves 140 formed along the cutting regions 120 are exposed on the front face. The details of the shape of the fine grooves 140 will be described later.

Figure 3E:
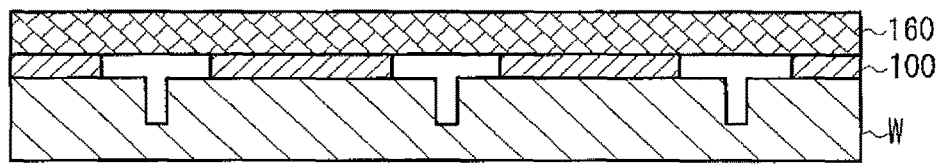
FIGS. 3E, 3F, 3G, 3H and 3I are schematic cross-sectional views each showing a semiconductor substrate in the semiconductor chip manufacturing process according to the Example of the present invention.
Figure 3F:
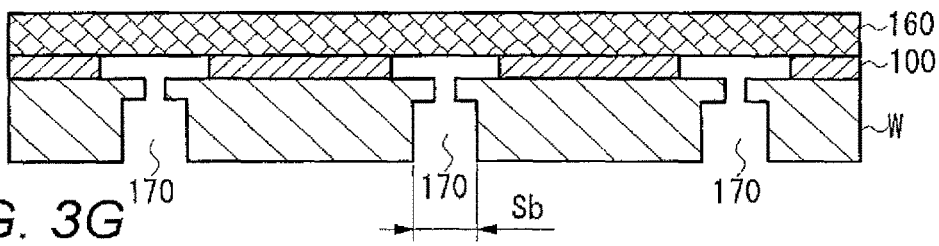

Next, an ultraviolet-curing dicing tape is attached (at S108). As shown in FIG. 3E, a dicing tape 160 having an adhesive layer is attached to the side of the light-emitting elements. Then, half-dicing is performed along the fine grooves 140 using the dicing blade from the back face side of the substrate (at S110). The dicing blade is positioned by a method in which an infrared camera is disposed above the back face side of the substrate and the positions of the fine grooves 140 are detected indirectly using an infrared ray transmitted through the substrate, by a method in which a camera is disposed above the front face side of the substrate and the positions of the fine grooves 140 are detected directly, or by other known methods. On the basis of this kind of positioning, as shown in FIG. 3F, the half-dicing is performed using the dicing blade and grooves 170 are formed on the back face side of the semiconductor substrate. The groove 170 has a depth reaching the fine groove 140 formed on the front face of the semiconductor substrate. The width of the fine groove 140 is made narrower than that of the groove 170 that is formed on the back face side by the dicing blade. This is because, in the case that the fine grooves 140 having a width narrower than that of the grooves 170 on the back face side are formed, the number of semiconductor chips that can be acquired from a single wafer can be increased in comparison with a case in which a semiconductor substrate is cut using only the dicing blade. If fine grooves having a depth in the range of several μm to ten-odd μm shown in FIG. 2C can be formed from the front face to the back face of the semiconductor substrate, it is not required to from the grooves on the back face side using the dicing blade, in the first place. However, it is not easy to form fine grooves having such a depth. Hence, as shown in FIG. 3F, the half-dicing from the back face using the dicing blade is performed in combination with the etching.

Figure 3G:
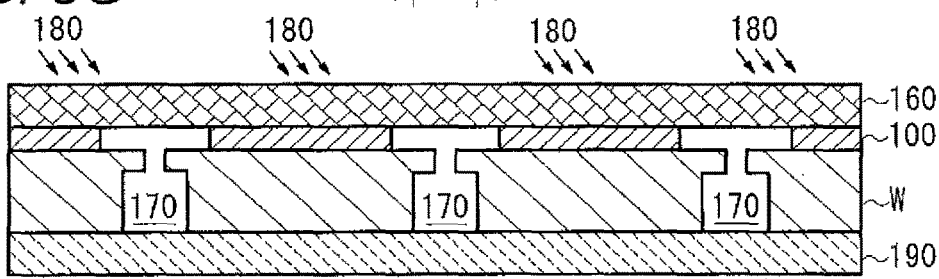

Next, ultraviolet (UV) rays are irradiated to the dicing tape and an expanding tape is attached (at S112). As shown in FIG. 3G, ultraviolet rays 180 are irradiated to the dicing tape 160, whereby the adhesive layer of the tape is hardened. Then, an expanding tape 190 is attached to the back face of the semiconductor substrate.

Figure 3H:
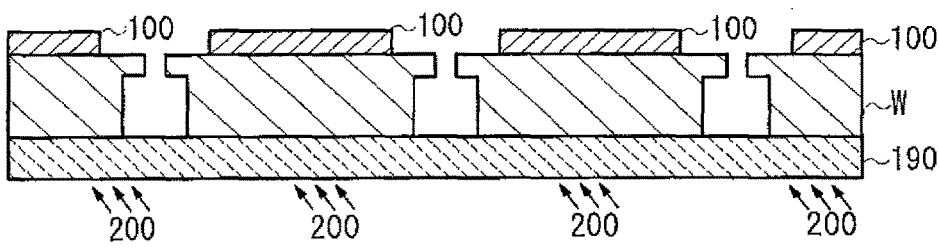

Next, the dicing tape is removed and ultraviolet rays are irradiated to the expanding tape (at S114). As shown in FIG. 3H, the dicing tape 160 is removed from the front face of the semiconductor substrate. Furthermore, ultraviolet rays 200 are irradiated to the expanding tape 190 on the back face of the substrate, whereby the adhesive layer of the tape is hardened. The expanding tape 190, the base material of which has elasticity, is stretched so that the picking up of the semiconductor chips that have been individualized after the dicing can be facilitated, whereby the spaces between the light-emitting elements are extended.

Figure 3I:
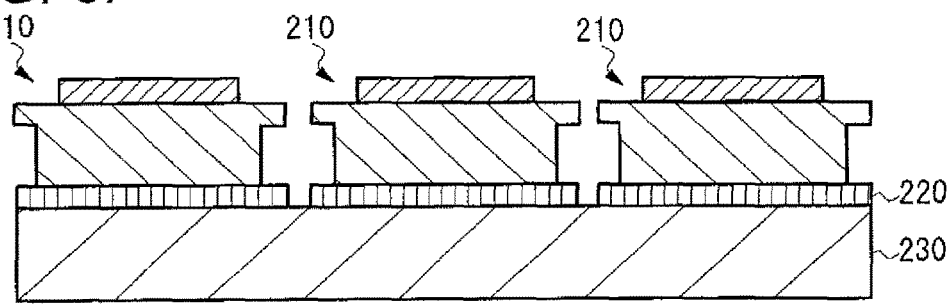

Next, the picking and die-mounting of the individualized semiconductor chips are performed (at S116). As shown in FIG. 3I, the semiconductor chips 210 having been picked from the expanding tape 190 are mounted on a circuit board 230 via a fastening member 220, for example, a conductive paste, such as an adhesive or solder.

Figure 5A:
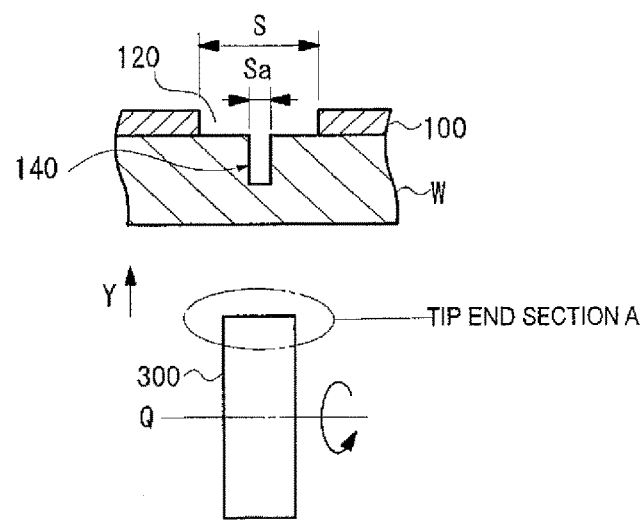
FIG. 5A is a cross-sectional view illustrating the cutting operation of a dicing blade.

Next, the details of the half-dicing using the dicing blade will be described below. FIG. 5A is a cross-sectional view at the time when the half-dicing is performed as shown in FIG. 3F using the dicing blade.

As described above, on the front face of the semiconductor substrate W, the plurality of light-emitting elements 100 are formed, and the respective light-emitting elements 100 are separated by the cutting regions 120 defined by, for example, the scribe lines spaced at the constant interval S. In the cutting region 120, the fine groove 140 having the width Sa is formed by anisotropic etching. On the other hand, a dicing blade 300 is a disc-shaped cutting member rotating around an axis Q as shown in FIG. 5A and has a thickness corresponding to the kerf width Sb of the groove 170. The dicing blade 300 is positioned in a direction parallel to the back face of the semiconductor substrate W outside the semiconductor substrate W. In addition, the dicing blade 300 is moved by a predetermined amount in the direction Y that is perpendicular to the back face of the semiconductor substrate W, thereby being positioned in the thickness direction of the semiconductor substrate W so that a stepped section 400 has a desired thickness T. Furthermore, after the positioning, at least the dicing blade 300 or the semiconductor substrate W is moved in a direction horizontal to the back face of the semiconductor substrate W while the dicing blade 300 is rotated, whereby the groove 170 is formed in the semiconductor substrate W. Since the kerf width Sb is larger than the width Sa of the fine groove 140, when the groove 170 reaches the fine groove 140, the cantilevered eave-shaped stepped sections 400 having the thickness T are formed due to the difference between the width Sb and the width Sa. If the center of the dicing blade 300 is completely coincident with the center of the fine groove 140, the length of the stepped section 400 extending in the horizontal direction is (Sb−Sa)/2.

A) Explanation of the Tip End Section

Figure 5B:
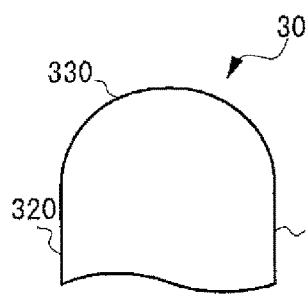
FIGS. 5B, 5C, 5D, 5E and 5F are enlarged cross-sectional views showing the tip end sections of dicing blades according to this Example.
Figure 5C:
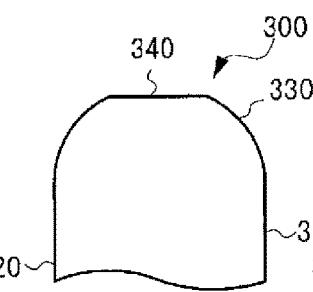
Figure 5D:
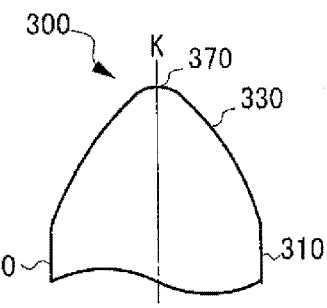
Figure 5E:
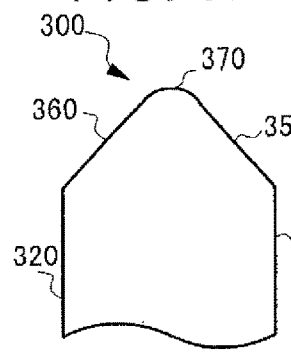
Figure 5F:
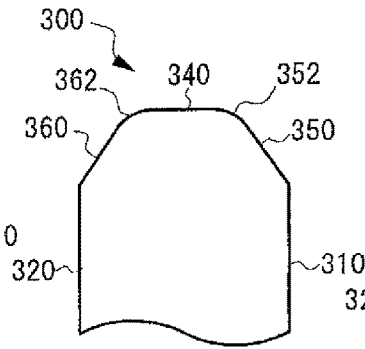
Figure 5G:
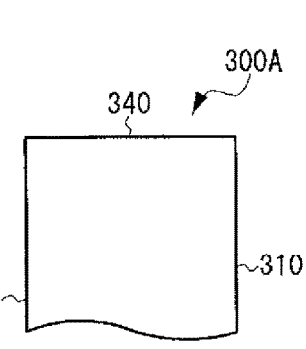
FIG. 5G is an enlarged cross-sectional view showing the tip end section of a dicing blade for use in general full dicing.

FIGS. 5B to 5F are enlarged cross-sectional views showing the tip end sections A of the dicing blades 300 taken as examples according to the Example of the present invention, and FIG. 5G is an enlarged cross-sectional view showing the tip end section A of a dicing blade that is used for general full dicing. The tip end section of a dicing blade 300A that is used for general full dicing has a side face 310 on one side, a side face 320 on the opposite side thereof and a flat face 340 that is nearly orthogonal to both the side faces 310 and 320 as shown in FIG. 5G. In other words, the tip end section has a rectangular cross-section as viewed from the rotation direction. On the other hand, the tip end sections of the dicing blades 300 have tapered shapes in which the thicknesses of the dicing blades 300 gradually become thinner in the direction toward the top sections in the tip end sections of the dicing blades 300, for example, as shown in FIG. 5B to 5F.

In the Example, the "top section" is the topmost portion of the dicing blade, and in the case of the shapes shown in FIGS. 5B, 5D and 5E, the top section is a topmost point. Furthermore, in the case of the shapes shown in FIGS. 5C and 5F, the top sections are flat faces except for minute irregularities, and the flat faces are referred to as "top faces". Furthermore, the shape having a portion in which the thickness of the tip end section of the dicing blade 300 becomes smaller toward the top section is referred to as a "tapered" shape. FIGS. 5B to 5F all show examples of tapered shapes.

The respective shapes shown in FIGS. 5B to 5G are initial shapes at the time when the cutting of semiconductor substrates is performed in a mass-production process. In other words, the dicing blades 300 according to the Example shown in FIGS. 5B to 5F preliminarily have these shapes as the initial shapes in a mass-production process. In addition, although the tip end section having the rectangular shape shown in FIG. 5G and to be used for general full dicing has a rectangular shape in its initial state, the tip end section wears into tapered shapes having such curved faces 330 as shown in FIGS. 5B to 5D as the dicing blade is used continuously.

The example shown in FIG. 5B has a pair of side faces 310 and 320 and a curved face 330 provided between the pair of side faces 310 and 320. More specifically, the distance between the pair of side faces 310 and 320 is the width corresponding to the kerf width Sb, and tip end section has the semicircular curved face 330 between both the side faces 310 and 320 but does not have such top faces 340 as shown in FIGS. 5C and 5F. The example shown in FIG. 5C has an intermediate shape between the shapes shown in FIGS. 5B and 5G and has a top face 340 and curved faces 330 at its tip end corner sections. The example shown in FIG. 5D does not have a top face 340 but has curved faces 330, the curvature radius of which is larger than the curvature radiuses of the tip end corner sections shown in FIGS. 5B and 5C, and a curved face 370 having a curvature radius smaller than that of the curved face 330 is formed at the position of the top section. In the curved faces 330 shown in FIGS. 5B to 5D, the thicknesses of the dicing blades 300 become smaller toward the top sections of the dicing blades 300.

In the example shown in FIG. 5E, a curved face 370 is formed between two chamfered sections 350 and 360. Also in this case, the top section 340 is not formed as in the case of FIG. 5D. In the example shown in FIG. 5F, opposed side faces 310 and 320 are formed, a top face 340 is provided between the side faces 310 and 320, and chamfered sections 350 and 360 are formed between the top face 340 and the side faces 310 and 320. Furthermore, a curved face 352 is formed at the corner section between the chamfered section 350 and the top face 340, and a curved face 362 is formed at the corner section between the chamfered section 360 and the top face 340.

The tip end section of the dicing blade according to the Example may merely have a tapered shape rather than the rectangular shape of the tip end section shown in FIG. 5G and may not have a top face, unless otherwise specified. Moreover, the tip end sections of the dicing blades 300 according to the Example shown in FIGS. 5B to 5F have shapes linearly symmetric with respect to the center K of the thickness of the dicing blade 300 shown in FIG. 5D. However, the tip end section is not always required to have a linearly symmetric shape and the position of the top section (top face) may deviate in the thickness direction of the dicing blade 300, unless otherwise specified.

B) Explanation of Simulations and the Results of Experiments

Next, in a case in which fine grooves having widths in the range of several μm to ten-odd μm are communicated mutually, simulations and experiments conducted to confirm what kind of breakage is induced by what kind of cause will be described below.

B-1) Explanation of Simulation Relating to the Tip End Shape

Figure 6A:
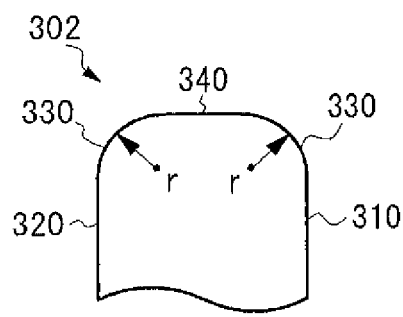
FIG. 6A is an enlarged cross-sectional view showing the tip end section of a dicing blade that is used for a simulation.

FIGS. 6A to 6D, 7 and 8 are views for explaining a simulation conducted to grasp the relationship between the curvature radius of the tip end corner section of the dicing blade and the stress applied to the stepped section and for explaining the results of the simulation. FIG. 6A shows an example of a dicing blade 302 used for the simulation. FIG. 6A shows the cross-sectional shape of the tip end section as viewed from the rotation direction of the dicing blade 302. As shown in FIG. 6A, the tip end section of the dicing blade 302 has side faces 310 and 320, a top face 340 having a constant length, and curved faces 330 having a curvature radius r and formed between the top face 340 and the side faces 310 and 320, and the tip end section is configured so as to be symmetric with respect to the line orthogonal to the rotation axis.

Figure 6B:
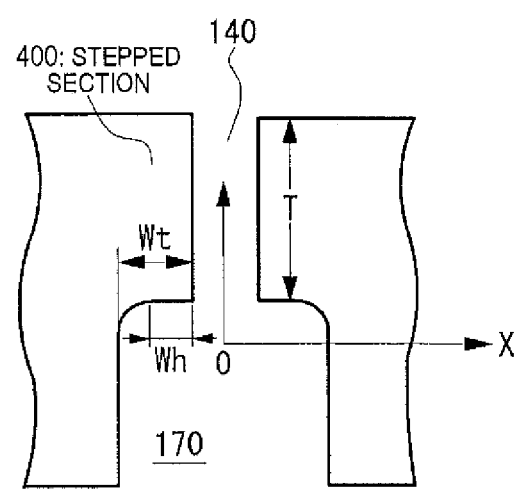
FIG. 6B is a cross-sectional view showing the shape of a groove that is formed in the semiconductor substrate at the time when the dicing blade shown in FIG. 6A is used.

FIG. 6B shows the shape of a groove formed in the semiconductor substrate in the case that the dicing blade 302 having the tip end shape shown in FIG. 6A is used. As shown in the figure, a step having a width Wt is generated between the vertical side face of the groove 140 on the front face side and that of the groove 170 on the back face side due to the difference between the position of the side face of the groove 140 on the front face side of the substrate and the position of the groove 170 on the back face side of the substrate, and an eave-shaped region having a thickness T, that is, the stepped section 400, is formed by this step. In other words, the stepped section 400 is a portion between the step formed at the connection section of the groove 140 on the front face side and the groove 170 on the back face side and the front face of the semiconductor substrate.

Figure 6C:
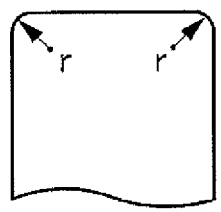
FIGS. 6C and 6D are enlarged cross-sectional views showing the tip end sections of dicing blades that are used for the simulation, the curvature radiuses thereof being r=0.5 and r=12.5.
Figure 6D:
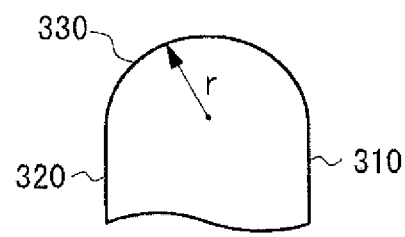

In this simulation, when the curvature radius r (μm) of the curved face 330 in the dicing blade 302 is changed to r=0.5, r=2.5, r=5.0, r=7.5, r=10.0 and r=12.5, the values of the stress applied to the stepped section 400 are calculated by the simulation. The thickness of the dicing blade 302 is 25 μm. FIG. 6C shows the shape of the tip end section at r=0.5, and FIG. 6D shows the shape of the tip end section at r=12.5. The tip end section shown in FIG. 6D has a semicircular shape in which the curvature radius of the tip end corner section is ½ of the thickness of the dicing blade 302. The substrate to be processed is a GaAs substrate. The width of the groove 140 on the front face side is 5 μm, the thickness T of the stepped section 400 is 40 μm, and setting is performed so that a load of 2 mN is applied to the stepped section 400 in the direction from the groove 170 on the back face side to the front face side of the substrate. Furthermore, the simulation is conducted in a state in which the center of the width of the groove 140 on the front face side is aligned with the center of the thickness of the dicing blade 302.

Figure 7:
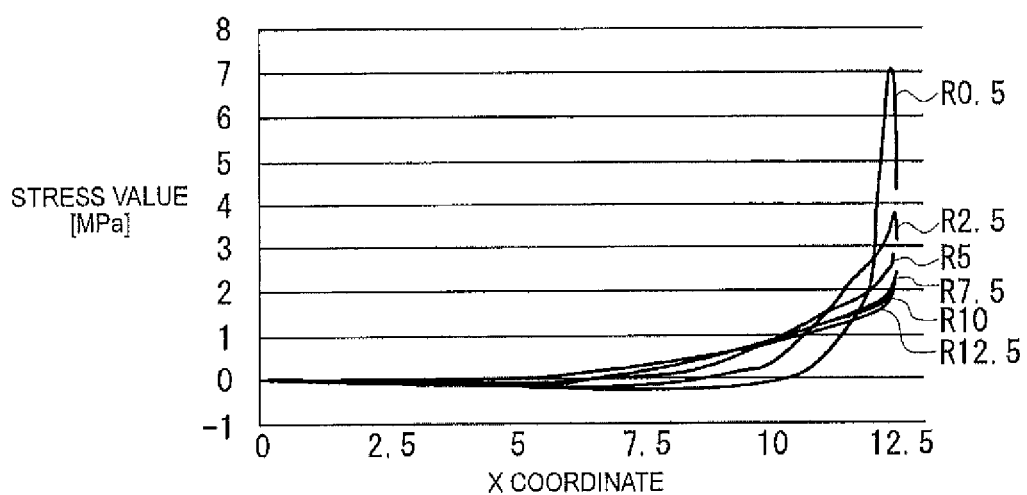
FIG. 7 is a graph showing the relationship between the curvature radius of the tip end section of the dicing blade and the stress value generated in the corner section of a stepped section at the time of the simulation.

The graph shown in FIG. 7 shows the results of the simulation and shows the change in the value of the stress applied to the stepped section 400 when the curvature radius of the tip end corner section is changed. In the graph, the vertical axis represents a stress value [Mpa], and the horizontal axis represents the X coordinate at the time when the center of the groove 140 on the front face side shown in FIG. 6B is used as the origin. According to the graph, in each curvature radius r, the stress becomes larger as the X coordinate becomes closer to 12.5 μm, that is, the stress becomes larger as the tip end corner section becomes close to the root side of the stepped section 400 from the center of the groove 170 on the back face. In addition, it is found that as the value of the curvature radius r becomes larger, the stress applied to the root side of the stepped section 400 lowers and the rising of the stress becomes gentler. In other words, in the range of the tip end shape that is used in the simulation conducted at this time, that is, in the case of the tip end shape having a tapered degree smaller than that of the semicircular tip end section shown in FIG. 6D, the maximum stress occurs on the root side of the stepped section 400. Furthermore, the stress applied to the root side of the stepped section 400 in the case that the tip end shape is semicircular as shown in FIG. 6D is smaller than that in the case that the tip end shape is nearly rectangular as shown in FIG. 6C. In other words, the stress applied to the root side of the stepped section 400 becomes smaller as the tapered degree is larger. Moreover, in the case that the tip end shape is nearly rectangular as shown in FIG. 6C, for example, in the case of r=0.5, in the range in which the X coordinate is up to approximately 11 μm, the stress is smaller than that in the case that the curvature radius r is larger. However, in the range exceeding the above-mentioned range, that is, at a portion closer to the root, the stress becomes larger abruptly, and it is found that the stress is concentrated at a position close to 12.5 μm in the X coordinate.

Figure 8:
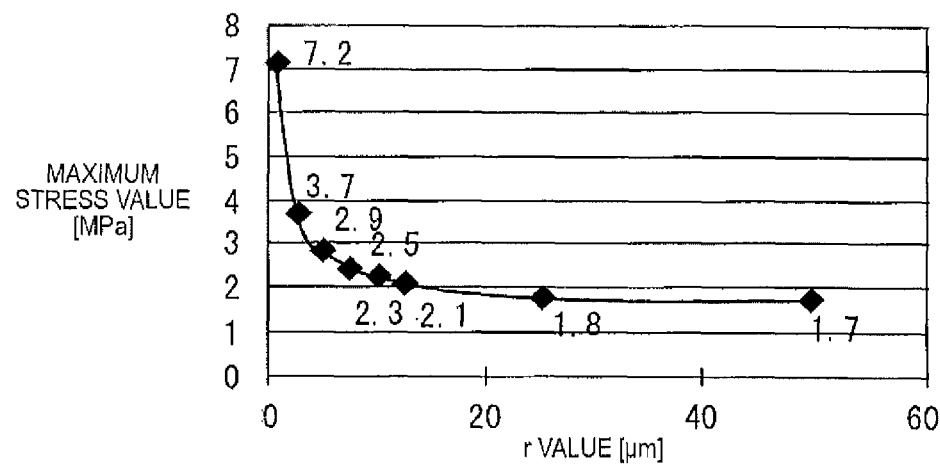
FIG. 8 is a graph showing the relationship between the curvature radius of the tip end section of the dicing blade and the maximum stress value at the time of the simulation.

Next, FIG. 8 shows the relationship between the curvature radius on the horizontal axis and the maximum stress value on the vertical axis. In this graph, a simulation is performed at r=25 μm and at r=50 μm in addition to the values of the curvature radius r shown in FIG. 7, and the results of the simulation are also included and indicated. In the case that the curvature radius r is larger than the curvature radius 12.5 μm of the semicircular shape, for example, 25 μm or 50 μm, the tip end shape has a larger tapered degree as shown in FIG. 5D, for example. According to this graph, as the curvature radius r is smaller, that is, as the tip end shape is closer to a rectangular shape, the maximum stress value becomes higher, and the changing degree of the maximum stress depending on the change in the curvature radius r also becomes larger abruptly. Conversely, the maximum stress value lowers as the curvature radius r increases, and the changing degree of the maximum stress depending on the change in the curvature radius r becomes lower. In the curvature radius range of 12.5 μm and 50 μm, that is, in the range in which the tapered shape does not have top faces as those shown in FIGS. 6D and 5D, it is found that the change in the maximum stress value is almost constant.

Figure 9A:
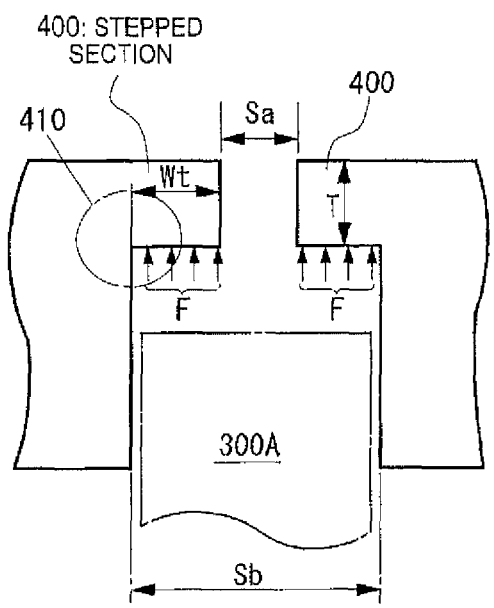
FIG. 9A is a cross-sectional view illustrating the stress applied to the corner section of the stepped section.
Figure 9B:
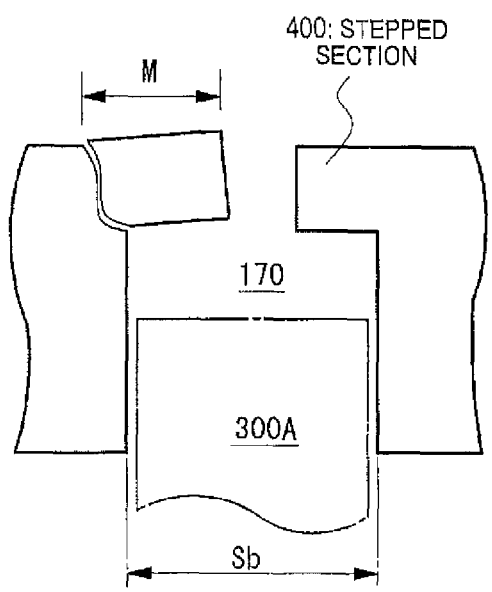
FIG. 9B is a cross-sectional view illustrating an example in which the stepped section is broken by the stress generated in the corner section of the stepped section.

A mechanism of how a semiconductor chip is broken will be described referring to FIGS. 9A, 9B, 11A and 11B according to the results of the above-mentioned simulations. As shown in FIG. 9A, in the case that the tip end section has a rectangular shape as in the dicing blade 300A (in the case that the value of the curvature radius r is very small), the top face 340 of the dicing blade 300A presses the semiconductor substrate when the groove 170 having the kerf width Sb is formed from the back face of the semiconductor substrate. Although the force F exerted by the dicing blade 300A is wholly applied to the stepped section 400, it is assumed that the force F applied to the stepped section 400 is concentrated on the root side region (root region 410) of the stepped section 400 by the principle of leverage. Then, when the stress concentrated on the root region 410 exceeds the breaking stress of the wafer, the stress causes breakage (chipping, cracking or picking) in the root region 410 of the stepped section 400 as shown in FIG. 9B. If breakage occurs at the stepped section 400, a margin M for the cutting of the stepped section 400 is required to be secured; this means that the space S of the cutting region 120 is required to be equal to or more than the margin M. According to the results of the simulation shown in FIG. 8, when the stress in the case of r=0.5 is compared with the stress in the case of r=12.5, the stress applied to the root region 410 of the stepped section 400 in the former case is different, that is, nearly four times larger than that in the latter case. This indicates that, in the range in which the value of the curvature radius r is smaller than that of such a semicircular tip end section as shown in FIGS. 5B and 6D, that is, in the range in which the tip end shape has a top face, the stress applied to the root region 410 of the stepped section 400 changes significantly depending on the value of the curvature radius r of the tip end corner section. In the case that a stepped portion being parallel to the face of the substrate is formed by using the tip end shape having such top faces as those shown in FIGS. 5C, 5F and 5G, the "root region" in the Example is assumed to be a region on the side closer to the vertical side face of the groove 170 on the back face side than the ½ position of the width Wh of the stepped portion that is parallel to the face of the substrate, the side face being formed on each of both sides of the groove on the front face side. FIG. 6B shows the relationship between the width Wh and the width Wt. Furthermore, in the case that the stepped portion being parallel to the face of the substrate is not formed, for example, in the case that the tapered tip end shape having no top face as in such tip end shapes as shown in FIGS. 5B, 5D and 5E is used, the region is assumed to be the region of the stepped section corresponding to the ⅓ of the thickness of the dicing blade on each of both sides of the central region of the dicing blade in the case that the dicing blade is equally divided in three regions in the thickness direction.

Figure 10:
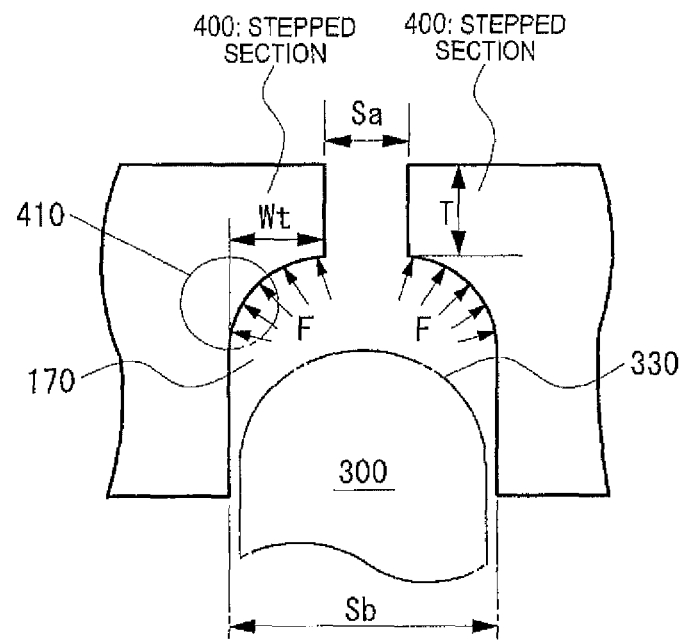
FIG. 10 is a view illustrating the stress applied to the stepped section at the time when the dicing blade shown in FIG. 5B is used.

FIG. 10 is a cross-sectional view illustrating the application of a stress to the stepped section 400 at the time when the groove 170 is formed by the dicing blade 300 according to the Example shown in FIG. 5B. FIG. 10 shows an example in which the tip end section of the dicing blade 300 has a semicircular shape. In this case, the shape of the groove 170 also becomes semicircular so as to follow the shape of the tip end section. As a result, the force F applied to the stepped section 400 by the tip end section of the dicing blade 300 is distributed in the direction along the semicircular shape of the groove. Hence, it is assumed that the stress is suppressed from being concentrated on the root region 410 of the stepped section 400 unlike the case shown in FIG. 9A, whereby the chipping and cracking of the stepped section 400 are suppressed.

B-2) Simulation Relating to Positional Deviation

Figure 11A:
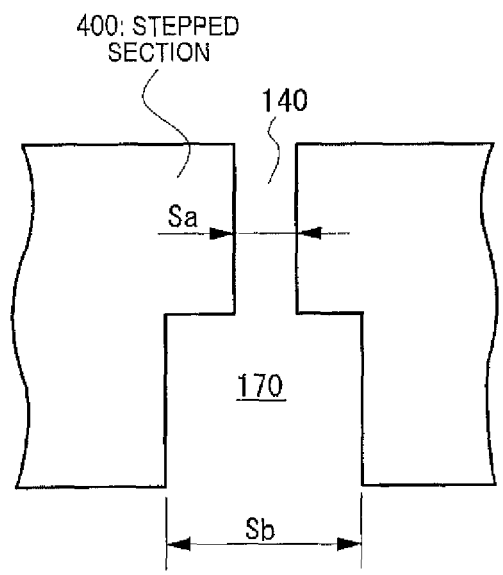
FIG. 11A is a cross-sectional view showing the stepped section at the time when the center of a groove 140 coincides with the center of a groove 170.
Figure 11B:
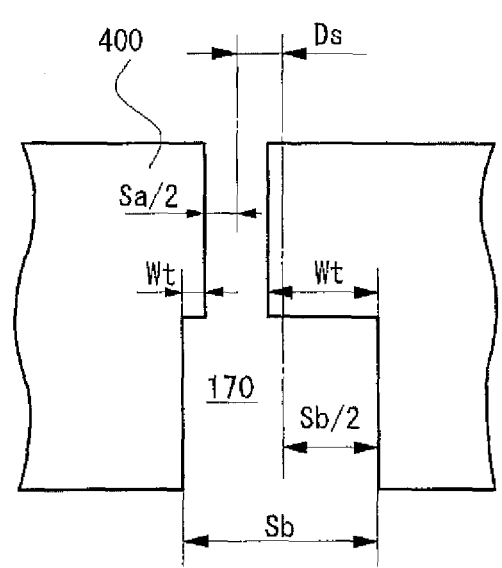
FIG. 11B is a cross-sectional view showing the stepped section at the time when a positional deviation has occurred between the center of the groove 140 and the center of the groove 170.

Next, the amount of the positional deviation of the dicing blade in the groove width direction will be described below. FIGS. 11A and 11B are views illustrating the positional relationship between the width Sa of the groove 140 on the front face side formed on the front face of the substrate and the kerf width Sb of the groove 170 to be formed by the dicing blade. It is ideal that the center of the kerf width Sb coincides with the center of the width Sa of the groove 140 on the front face side. However, in reality, the center of the kerf width Sb deviates from the center of the width Sa of the groove 140 on the front face side as shown in FIG. 11B due to variation in manufacturing. In addition, as the result of the positional deviation, a difference occurs between the widths Wt of the left and right stepped sections 400. It is herein assumed that the difference between the center of the width Sa of the groove 140 on the front face side and the center of the kerf width Sb is a positional deviation amount Ds. The variation in manufacturing is determined mainly by manufacturing conditions, such as the positioning accuracy (including the detection accuracy of alignment marks and the like) of a manufacturing apparatus to be used and the degree of deformation (the amounts of the bending and warping) of the dicing blade.

Next, a simulation conducted to grasp the relationship between the positional deviation amount Ds of the dicing blade in the groove width direction and the stress applied to the stepped section 400 and a simulation conducted to grasp the relationship between the kerf width Sb of the dicing blade and the stress applied to the stepped section 400 will be described below. In these simulations, four kinds of values, Sb=25, Sb=20.4, Sb=15.8 and Sb=11.2, are used as the kerf widths Sb (μm) at the position 12.5 μm away from the top section of the dicing blade, and the stress values at the respective kerf widths at the time when the positional deviation amount Ds (μm) from the groove 140 on the front face side is changed to Ds=0, Ds=2.5 and Ds=7.5 are calculated by the simulations. Although the tip end shapes used for these simulations of this time are different from the tip end shapes used in the simulation relating to FIG. 6, the simulations of this time are common to the simulation relating to FIGS. 6A to 6D in that a plurality of tip end shapes having different tapered degrees are used. The substrate to be processed is a GaAs substrate, the thickness of the dicing blade is set to 25 μm, each of the curvature radiuses of the tip end corner sections is set to r=5 μm, the width Sa of the groove 140 on the front face side of the semiconductor substrate is set to r=5 μm, and the thickness T of the stepped section 400 is set to 40 μm. Furthermore, setting is performed so that a total load of 10 mN is applied in the normal direction of the stepped section 400 and the side face of the groove 170 on the back face side. The load to the side face of the groove 170 on the back face side is included in consideration of the vibration in the horizontal direction of the dicing blade at the time of actual cutting.

Figure 12A:
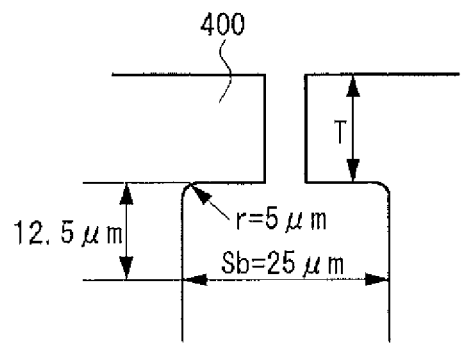
FIGS. 12A, 12B, 12C and 12D are views illustrating four kinds of dicing blades that are used for a simulation relating to positional deviation.
Figure 12B:
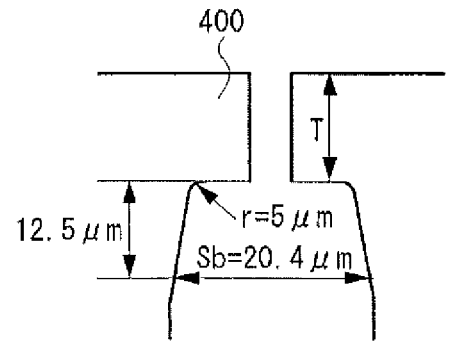
Figure 12C:
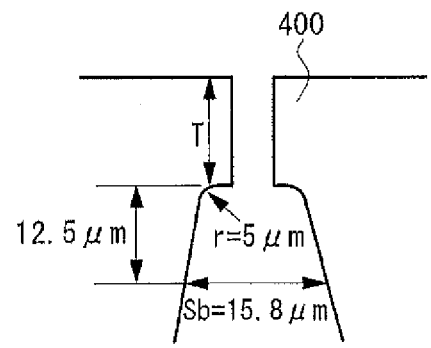
Figure 12D:
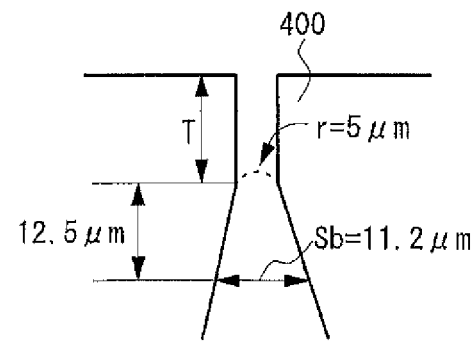

FIGS. 12A to 12D show the shapes of the grooves in a state in which the positional deviation amount Ds is zero in the case of the four kinds of kerf widths (corresponding to the tip end shapes of the dicing blades) used in the simulations. FIG. 12A shows the shape at Sb=25 μm, FIG. 12B shows the shape at Sb=20.4 μm, FIG. 12C shows the shape at Sb=15.8 and FIG. 12D shows the shape at Sb=11.2 μm. In each shape, the faces of the tip end corner sections other than the curved faces are linear, and in the case of Sb=11.2 μm in FIG. 12D, the curvature radius at the region of the top section is set to 5 μm as shown in the figure so that the shape has no tip end corner section.

Figure 13:
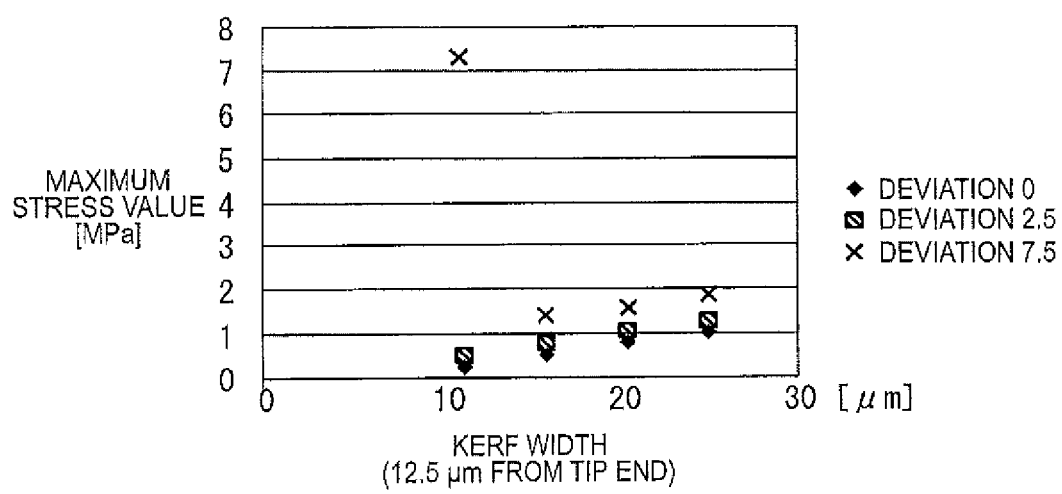
FIG. 13 is a graph showing the results of a simulation on the influence of a positional deviation amount and a kerf width on the stepped section.

FIG. 13 shows the results of the simulation relating to the influence of the positional deviation amount Ds and the kerf width Sb on the stepped section. The vertical axis represents the maximum stress value applied to the stepped section 400, and the horizontal axis represents the kerf width Sb. The kerf width Sb on the horizontal axis is the width at a position of 12.5 μm from the top section of the dicing blade, and the results obtained in the case that the positional deviation amounts Ds (μm) are Ds=0, Ds=2.5 and Ds=7.5 are plotted.

As clearly shown in the graph of FIG. 13, it is found that, in each kerf width Sb, the maximum stress applied to the stepped section 400 becomes larger as the positional deviation amount Ds of the dicing blade in the groove width direction is larger. Furthermore, although not shown in FIG. 13, the maximum stress is generated in the root region 410 on the side in which the width Wt of the stepped section 400 is larger due to the positional deviation of the dicing blade. It is assumed that this occurs because, when the positional deviation amount Ds becomes larger, a larger stress is liable to be applied by the principle of leverage to the root region 410 of the stepped section 400 on the side in which the step becomes larger.

Moreover, the maximum stress value tends to become smaller on the side in which the kerf width Sb is narrower (the side in which the tapered degree is larger), and it is assumed that this occurs because the stress for pressing the stepped section 400 to the front face side of the substrate becomes weaker due to the large tapered degree, whereby the stress is hardly concentrated on the root region 410 of the stepped section 400. Still further, when the kerf width Sb is very narrow (Sb=11.2 μm) and the positional deviation amount Ds is large (Ds=7.5 μm), it is found that the location in which the maximum stress value is generated changes abruptly, and the stress value (approximately 7.2) increases. It is assumed that this occurs because, in the case of a dicing blade having a wide kerf width Sb (a dicing blade having a small tapered degree), a wide face is used to apply the stress to the stepped section 400, but in the case of a dicing blade having a very narrow kerf width Sb (a dicing blade having a very large tapered degree) and in the case that the top section (top point) deviates from the range of the groove 140 on the front face side of the semiconductor substrate, the stress is concentrated on the region of the tapered top section (top point). Although not shown in FIG. 13, according to the results of the simulation, the maximum stress at the time when the kerf width Sb is very narrow (Sb=11.2 μm) and the positional deviation amount Ds is large (Ds=7.5 μm) is generated in the region of the top section (top point), and this position is indicated by P in FIG. 14. "The region of the top section" according to the Example is a region including the top section and located on the side of the center of the groove on the back face side rather than the root region 410 of the stepped section 400.

B-3) Explanation of the Results of First Experiment

Figures 14, 15, 16:
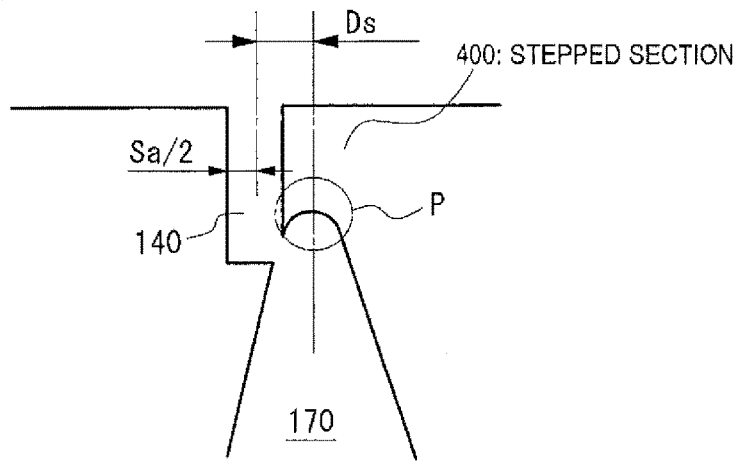
FIG. 14 is a view showing an example of a position in which the maximum stress is generated at the time when the kerf width Sb is very narrow and the positional deviation amount Ds is large.
FIG. 15 is a view showing the results of an experiment at the time when an actual substrate is cut using various kinds of dicing blades being different in the kerf width Sb and the curvature radius of the tip end corner section.
FIG. 16 is a view showing the results of an experiment conducted to confirm the influence of the difference in the width of the groove on the front face side on the breakage of the stepped section and the influence of the difference in the thickness of the stepped section on the breakage of the stepped section.

FIG. 15 shows the results of an experiment in which a plurality of dicing blades having different tapered degrees are prepared and actual substrates are cut. In this experiment, the tip ends of dicing blades having a thickness of 25 μm are processed to prepare a plurality of dicing blades having curvature radiuses r in the range of 1 μm to 23 μm at the tip end corner sections and having kerf widths in the range of 5 μm and 25 μm at the position of 5 μm from the top sections. The specific combinations of the curvature radiuses and the kerf widths are shown in FIG. 15 and the plurality of dicing blades are prepared so that the tapered degrees are distributed nearly equally. Furthermore, GaAs substrates are used, the width of the groove 140 on the front face side is set to approximately 5 μm, the thickness T of the stepped section 400 is set to approximately 40 μm, and the positional deviation amount Ds of the dicing blade in the groove width direction is set to less than ±7.5 μm. Since the thickness of the dicing blade is 25 μm, the tip end section has a tapered shape having no top face in the range in which the curvature radius of the tip end corner section is 12.5 μm or more. On the other hand, in the range in which the curvature radius is less than 12.5 μm, the tapered degree becomes smaller as the curvature radius is smaller, and in the case that the curvature radius is 1 μm, the tip end section has a nearly rectangular tip end shape.

The mark in FIG. 15 indicates that the breakage of the stepped section 400 is suppressed sufficiently and the tapered degree corresponding thereto can be used for a mass-production process, and the "x" mark indicates that the breakage of the stepped section 400 is not suppressed sufficiently and the tapered degree corresponding thereto cannot be used for a mass-production process. In FIG. 15, unusable ranges are present in both the range in which the tapered degree is small (the curvature radius r is 8 μm or less) and the range in which the tapered degree is large (the curvature radius r is 22 μm or more), and the range in which the tapered degree is appropriate is present between the two ranges. This is because of the following reason. In the range in which the tapered degree is small, the stress is concentrated on the root region 410 of the stepped section 400 and the stepped section 400 is broken; in the range in which the tapered degree is large, the stress is concentrated on the position of the top section (top point) of the dicing blade and the stepped section 400 is broken, as described in the results of the simulation described above. It can be said that the range in which the curvature radius r is 8 μm or less is the range in which the stepped section is broken because the tapered degree is small and that the range in which the curvature radius r is 22 μm or more is the range in which the stepped section is broken because the tapered degree is large.

The maximum stress to be received by the stepped section 400 changes significantly depending on the tapered degree of the tip end section as described in the explanation of the simulation shown in FIG. 8. Hence, it is found that, even if breakage occurs in the case that a rectangular tip end shape or any other tip end shapes are used, the breakage of the stepped section can be suppressed to a level not causing problems in a masa-production process by confirming the range of appropriately tapered degrees and by controlling the tip end shape so that the tapered degree is set within the range as indicated in the experiment shown in FIG. 15, without changing manufacturing conditions, that is, without increasing the thickness T of the stepped section 400 (widening and deepening the width of the groove 140 on the front face side) so that the strength of the stepped section is enhanced.

B-4) Explanation of the Results of Second Experiment

FIG. 16 shows the results of an experiment that is conducted to confirm the influence of the difference in the width of the groove on the front face side on the breakage of the stepped section and the influence of the difference in the thickness of the stepped section on the breakage of the stepped section. In this experiment, GaAs substrates are used, the thickness T of the stepped sections 400 is set to 25 μm and 40 μm, and the dicing blades having a kerf width of 16.7 μm at the position of 5 μm from the tip end section are used. Then, for each width Sa of the groove 140 on the front face side and for each thickness T of the stepped section 400, a confirmation is made as to how much positional deviation of the dicing blade in the groove width direction is allowable in order that the breakage of the stepped section 400 can be suppressed and that the dicing blade can be used for a mass-production process. "A" to "D" in FIG. 16 indicate the ranges of the positional deviation amounts Ds obtained from the results in which the breakage of the stepped section 400 is suppressed sufficiently.

For example, in the case that the thickness T of the stepped section is 25 μm and the width Sa of the groove on the front face side is 7.5 μm, the range is "B", and this indicates that, even in the case that the dicing blade deviates in the range of ±5 μm to less than ±7.5 μm in the groove width direction, the breakage of the stepped section 400 is suppressed sufficiently and the dicing blade can be used for a mass-production process, and also indicates that, in the case of the positional deviation of ±7.5 μm or more, the breakage of the stepped section 400 is not suppressed sufficiently. Furthermore, in the case that the thickness T of the stepped section 400 is 45 μm and the width Sa of the groove on the front face side is 5 μm, the range is "A", and this indicates that, even in a state in which the dicing blade deviates by ±7.5 μm or more in the groove width direction, the breakage of the stepped section 400 is suppressed sufficiently and the dicing blade can be used for a mass-production process. Moreover, in the case that the thickness T of the stepped section 400 is 25 μm and the width Sa of the groove on the front face side is 5 μm, the range is "D", and this indicates that, only in the case that the deviation of the dicing blade in the groove width direction is less than ±3 μm, the breakage of the stepped section 400 is suppressed sufficiently, and in the case that the deviation is ±3 μm or more, the breakage of the stepped section 400 is not suppressed sufficiently.

The results of the experiment shown in FIG. 16 indicate that the stepped section 400 is stronger against the positional deviation of the dicing blade in the groove width direction as the width Sa of the groove 140 on the front face side is larger. In other words, the stepped section 400 is less broken by the stress from the dicing blade as the width Sa of the groove 140 on the front face side is wider. It is assumed that this is because the principle of leverage hardly works since the width Wt of the stepped section 400 becomes narrower as the width Sa of the groove 140 on the front face side is wider. Besides, the results indicate that the stepped section is stronger against the positional deviation of the dicing blade in the groove width direction as the thickness T of the stepped section 400 is thicker. In other words, as the thickness T of the stepped section 400 is thicker, the stepped section 400 is less likely to be broken by the stress from the dicing blade. This is because the strength against the stress becomes higher as the thickness T of the stepped section 400 is thicker.

C) Method of Designing the Tip End Section

Next, a method of designing the tip end shape of the dicing blade and a method of manufacturing semiconductor chips will be described on the basis of the results of the simulations and the experiments described above. The respective Examples described below are based on the manufacturing flow according to the Example shown in FIG. 1, unless otherwise specified.

Figure 17:
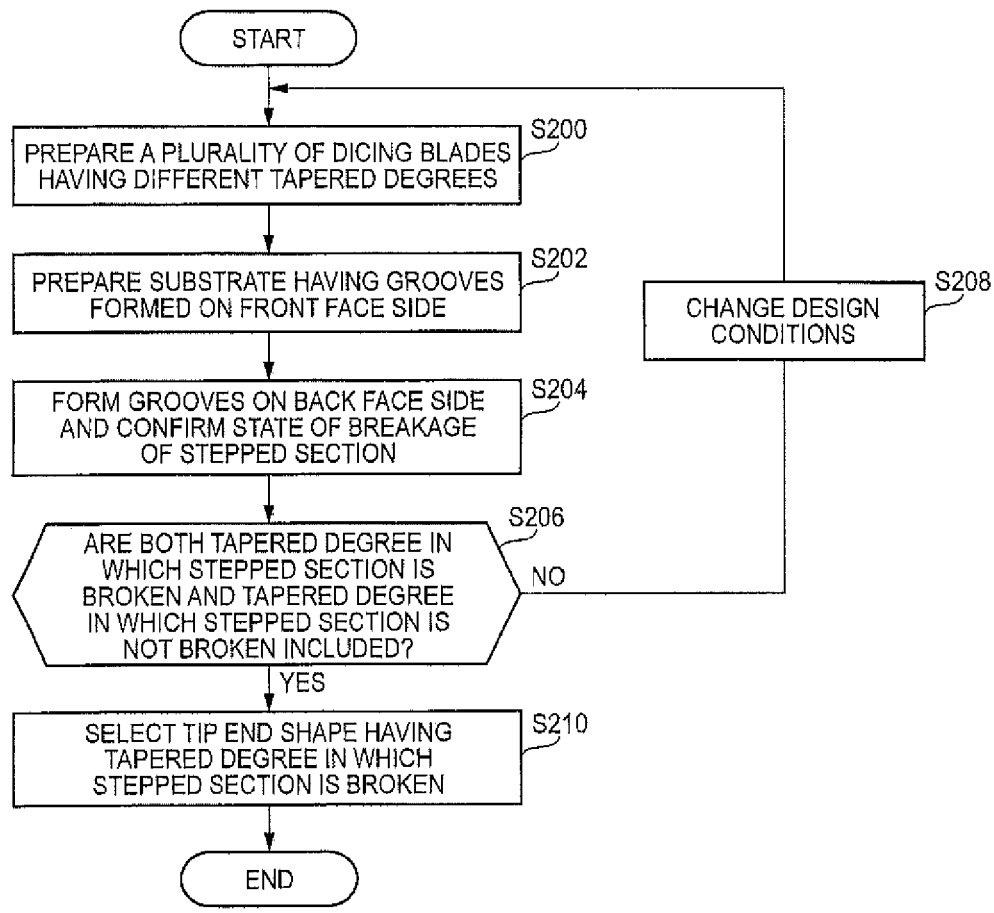
FIG. 17 is a flowchart illustrating a method of designing the tip end shape of a dicing blade to be used for a method of manufacturing semiconductor chips according to the Example of the present invention.

FIG. 17 is a flowchart illustrating a method of designing the tip end shape of a dicing blade to be used for a method of manufacturing semiconductor chips according to the Example of the present invention. A series of steps in FIG. 17 may be carried out using actual semiconductor substrates and actual dicing blades or may be carried out using a simulation without using actual semiconductor substrates and actual dicing blades.

According to the flowchart of FIG. 17, first, at S200, a plurality of dicing blades, the tapered degrees of the tip end shapes thereof being made different, are prepared. For example, as in the experiment shown in FIG. 15, a plurality of dicing blades, the tapered degrees thereof being made different at constant intervals, are prepared. The tip end shape for use in full dicing serving as a general dicing method is such a rectangular shape as that shown in FIG. 5G. Hence, in order that a plurality of dicing blades having different tapered degrees are prepared by using dicing blades having such a rectangular shape, dicing blades having such a rectangular shape are required to be processed beforehand. For example, a plurality of dicing blades having a rectangular shape are acquired and used to actually dice a member for tip end processing, such as a dummy wafer, whereby the degree of wear at the tip end shape due to cutting may merely be made different for each dicing blade. The details of the method of tapering the dicing blades will be described later.

At S200, a plurality of dicing blades having different tapered degrees may be prepared by acquiring them from other entities (others), instead of processing tip end shapes in-house. Furthermore, the step S200 can be read as a step of preparing a plurality of dicing blades having different degrees of stress applied to the root region 410 of the stepped section 400. Moreover, the dicing blades are not required to be prepared collectively at a time. For example, the following method may be used. A dicing blade having a single kind of tapered degree may be prepared first, and the process in the flow may be performed up to S204 that is described later, and dicing blades having other tapered degrees may be prepared, and then the process in the flow may be performed again up to S204. Furthermore, the plurality of dicing blades are not always required to be separate, but a plurality of dicing blades having different tapered degrees may be prepared by gradually changing the tip end shape of a single dicing blade.

The "tapered degree" in the Example is determined, for example, by the curvature radius of the tip end corner section of the dicing blade, the curvature radius of the top section (top point) thereof and the thickness of the blade at a predetermined distance from the top section. For example, the tapered degree becomes larger as the curvature radius of the tip end corner section is larger and the curvature radius of the top section (top point) is smaller. Furthermore, since the tapered degree becomes larger as the thickness of the blade at the predetermined distance from the top section is thinner, the tapered degree can be referred to as the thickness of the blade at the predetermined distance from the top section. Still further, the tapered degree also becomes larger in the case that the dicing blade is worn and the thickness of the tip end corner section thereof becomes thinner. The tapered degree can be referred to as the degree of the stress applied to the root region 410 of the stepped section 400, and the degree of stress applied to the root region 410 of the stepped section 400 becomes smaller as the tapered degree is larger. The tapered degree is referred to as the tapered degree in the shape of the tip end side in the range from the top section of the dicing blade to the distance corresponding to approximately twice as large as the thickness of the dicing blade, unless otherwise specified.

Next, at S202, a semiconductor substrate having a plurality of grooves of the same shape, the grooves being formed on the front face side and to be adopted for a mass-production process, are prepared in order to confirm the state of the breakage of the stepped section in the case that the plurality of dicing blades prepared at S200 are used. The pitch of the grooves on the front face side may be the pitch to be used for a mass-production process or may be a different pitch. In other words, the pitch may merely be set so that the state of the breakage of the stepped section in a mass-production process can be estimated for each tapered degree. In addition, at S202, in the case of a semiconductor substrate in which no groove is formed, the preparation of the semiconductor substrate may be done by forming grooves on the front face side of the substrate as in the case of S104 in FIG. 1, or such a semiconductor substrate in which grooves have been formed may be acquired from other entities (others). The "same shape" does not mean that the shapes are completely the same, but means a substantially identical shape having errors or the like that may occur in the case that the grooves are formed so as to have the same shape.

Next, the grooves 170 on the back face side are formed in the semiconductor substrate prepared at S202 by using each of the plurality of dicing blades prepared at S200. Then, the state of the breakage of the stepped section in the case that each of the plurality of dicing blades is used is confirmed. In other words, a confirmation is made as to whether the state of breakage causes a problem in a mass-production process. For example, the existence and degree of chipping, cracking, etc. around the stepped section are confirmed using a microscope or the like. It is preferable that the formation of the grooves on the back face side and the confirmation of the state of breakage should be performed a plurality of times for each tip end shape in order to specify the tapered degree at which the stepped section is not broken (the shape in which breakage is suppressed to the extent that the dicing blade can be used for a mass-production process). Furthermore, it is preferable that the confirmation should be performed under deviation conditions so that the stepped section is liable to be broken, in consideration of the variations in the position of the dicing blade. Consequently, as the results of the above-mentioned continuation, the tapered degree of each dicing blade and a determination as to whether the stepped section is broken due to the tapered degree (whether the tapered degree can be used for a mass-production process) are listed as shown in FIG. 15, for example.

Next, at S206, a configuration is made as to whether both the tapered degree in which the stepped section is broken and the tapered degree in which the stepped section is not broken are included in the plurality of dicing blades prepared at S200. For example, in the case of FIG. 15, since both the tapered degree in which the stepped section is broken and the tapered degree in which the stepped section is not broken are included, the flow advances to S210. The case in which both the tapered degrees are included as described above means that at least part of the range of the tapered degrees usable for a mass-production process and at least part of the range of the tapered degrees not usable for a mass-production process can be specified. For example, in the case that the stepped section is broken at a small tapered degree and that the stepped section is not broken at a large tapered degree, it is assumed that the breakage at the small tapered degree is caused by the stress applied to the root region of the stepped section. Hence, it can be judged that the range of the tapered degrees smaller than the small tapered degree is an unusable range. Furthermore, it can be judged that at least the tapered degree in which the stepped section is not broken is a tapered degree that can be used. Conversely, in the case that the stepped section is broken at a large tapered degree and that the stepped section is not broken at a small tapered degree, it is assumed that the breakage at the large tapered degree is caused due to the concentration of the stress on the region of the tapered top section. Hence, it can be judged that the range of the tapered degrees larger than the large tapered degree is an unusable range. Furthermore, it can be judged that at least the tapered degree in which the stepped section is not broken can be used. As described above, at S206, the case in which both the tapered degree in which the stepped section is broken and the tapered degree in which the stepped section is not broken are included means that at least part of the range of the tapered degrees usable for a mass-production process and at least part of the range of the tapered degrees not usable for a mass-production process can be specified for the narrow and shallow grooves on the front face side that may cause the breakage of the stepped section in the case that a dicing blade having an arbitrary tip end shape is used.

On the other hand, the case in which the stepped section is broken at all the tapered degrees of the dicing blades prepared at S200 means that the tapered degrees being usable for a mass-production process have not been specified at all. Hence, in this case, the flow advances to S208. In addition, in the case that the stepped section is not broken at all the tapered degrees, manufacturing conditions may not be appropriate, for example, the groove on the front face side is unnecessarily wide and deep, whereby the strength of the stepped section is eventually set unnecessarily high. Hence, also in this case, the flow advances to S208.

At S208, design conditions, such as the shape (width, depth, etc.) of the groove 140 on the front face side, are changed. According to the results of the experiment shown in FIG. 16, the strength of the stepped section becomes lower and the stepped section is more liable to be broken as the depth of the groove 140 on the front face side is shallower and the width Sa of the groove 140 on the front face side is narrower. In other words, in the case that the stepped section is broken at all the tapered degrees of the dicing blades having been prepared at S200, it is assumed that the groove 140 on the front face side is too shallow or too narrow, whereby the strength of the stepped section is too weak. Hence, in this case, the strength of the stepped section is made higher by changing the shape of the groove 140 on the front face side. More specifically, at least the width Sa of the groove 140 on the front face side is made wider or the depth thereof is made deeper.

In addition, according to the results of the simulations shown in FIGS. 12 and 13, the stepped section is more liable to be broken as the positional accuracy of the tip end section of the dicing blade in the groove width direction at the time when the groove 170 on the back face side is formed is lower. Hence, manufacturing conditions exerting influence on the positional accuracy may be changed so that the positional accuracy of the tip end section of the dicing blade in the groove width direction is improved. For example, the existing dicing apparatus may be changed to a dicing apparatus having high accuracy for positioning the dicing blade. As described above, the conditions are changed so that the breakage of the stepped section hardly occurs by changing at least the shape of the groove 140 on the front face side or the positional accuracy of the dicing blade in the groove width direction.

Furthermore, in the case that the stepped section is not broken at all the tapered degrees of the dicing blades prepared at S200, it is assumed that the groove 140 on the front face side is unnecessarily wide and deep, whereby the strength of the stepped section has been set unnecessarily high. In this case, the groove width may be changed so as to be narrower, whereby the number of semiconductor chips capable of being obtained from a single semiconductor substrate can be increased. In the case that the groove width is made narrower, it is difficult to form deep grooves, and the strength of the stepped section becomes weaker. However, as shown in FIG. 8, the stress changes significantly depending on the tapered degree. Hence, the groove 170 on the back face side can be formed without causing the breakage of the stepped section of the narrower and shallower groove 140 on the front face side by specifying an appropriate tapered degree. Hence, in the case that the stepped section is not broken at all the tapered degrees of the prepared dicing blades at S206, the design conditions are changed so that the number of semiconductor chips capable of being obtained from a single semiconductor substrate is increased by making the groove 140 on the front face side narrower (or narrower and shallower), and the flow from S200 is performed again, and the flow from S200 to S208 is repeated until the flow reaches S210. It has been described that, if the groove 140 is narrow, it becomes difficult to form deep grooves. This is because, for example, in the case that the groove 140 on the front face side is formed by dry etching, if the groove is narrow, an etching gas hardly intrudes deeply into the groove, the progress of the etching at the bottom section of the groove is interrupted, and in the case of performing groove formation using a thin dicing blade, the blade is liable to be broken.

In addition, for example, in the case that the number of the kinds of the dicing blades prepared at S200 are limited and the tapered degrees are unbalanced so as to be excessively large or excessively small, the state in which both the tapered degree in which the stepped section is broken and the tapered degree in which the stepped section is not broken are included does not hardly occur at S206. Hence, in that case, the design conditions may be changed at S208 so that the number of the kinds of the tip end shapes of the dicing blades to be prepared at S200 is increased.

As described above, the design conditions are changed at S208, and the flow from S200 is performed again. Then, the flow from S200 to S208 is repeated until the flow reaches S210.

At S210, the initial tip end shape of the dicing blade for use in a mass-production process is selected from the tip end shapes having the tapered degrees in which the stepped section is not broken. Furthermore, the tapered degrees in which the stepped section is broken are excluded from the objects to be selected so that they are not used throughout a mass-production period as a matter of course. In other words, they are excluded from the range of the objects to be selected. However, the tip end shape having the tapered degree being identical to the tapered degree having been used for the experiment is not always necessary to be selected as the tip end shape to be used for a mass-production process. It may be possible that the range of the tapered degrees in which the stepped section is not broken is estimated, and a tapered degree included in the estimated range may be selected. For example, in the results of the experiment in FIG. 15, it is estimated that the range of the curvature radius r of the tip end corner section, 13 µm to 21 µm, corresponds to the range of the tapered degrees in which the stepped section is not broken, and the tip end shape corresponding to the curvature radius r of 14.5 µm or 18.5 µm is selected as the initial tip end shape of the dicing blade to be used for a mass-production process, and control is performed so that the curvature radius does not deviate from the range of 13 µm to 21 µm throughout a mass-production period. In other words, in the case that the number of the tapered degrees in which the stepped section is not broken is plural, it is estimated that the range of the degrees is the range in which the stepped section is not broken, and the tip end shape having the tapered degree included in the range may merely be selected.

In the range of the tapered degrees in which the stepped section is not broken, it is preferable that a tip end shape having a tapered degree smaller than the tapered degree at the center of the range should be selected as the initial tip end shape of the dicing blade to be used for a mass-production process. For example, according to the results of the experiment shown in FIG. 15, a tip end shape in which the curvature radius r of the tip end corner section is in the range of 13 µm to 17 µm should be selected instead of selecting a tip end shape in which the curvature radius r is in the range of 17 µm to 21 µm. The state in which the tapered degree is small is a state in which the tip end section is not worn more than the tip end section having a large tapered degree; in other words, the life of the dicing blade having the small tapered degree is longer. Moreover, in the case that a dicing blade having a general rectangular shape is used and its tip end shape is processed, the time required for preliminarily forming the tip end shape into a shape having a desired tapered degree can be reduced.

What's more, in the case that tapered degrees in which the stepped section is broken are present on the side in which the tapered degrees are larger than the tapered degrees in which the stepped section is not broken, it is preferable that control should be performed in a mass-production process so that the tip end section of the dicing blade is not formed into a shape having such a tapered degree as the wear of the tip end section of the dicing blade advances. For example, in FIG. 15, the tapered degrees in which the stepped section is broken, that is, the curvature radiuses are in the range of 22 µm to 23 µm, are present on the side (the range exceeding 21 µm) in which the curvature radiuses of the tip end corner sections are larger than the range of 13 µm to 21 µm corresponding to the tapered degrees in which the stepped section is broken. Hence, in the case of the results of the experiment shown in FIG. 15, it is preferable that control should be performed in a mass-production process so that the curvature radius of the tip end corner section does not exceed 21 µm as the wear of the tip end section of the dicing blade advances. More specifically, before the tapered degree reaches such a tapered degree, it is preferable that the use of the dicing blade should be stopped and the dicing blade should be replaced. It is noted that "replacement" in the Example means not only replacing the dicing blade with a completely separate dicing blade but also reprocessing (dressing) the tip end shape of the same dicing blade.

The flow for the method of designing the tip end shape of the dicing blade according to the Example has been described above. With this designing method, when the tip end shape of the dicing blade to be used for a mass-production process is determined, it is possible to adopt the groove 140 on the front face side having a shallower depth in a mass-production process than the depth that is determined without considering the relationship between the tapered degree of the tip end shape and the breakage of semiconductor chips. Conventionally, in the case that fine grooves having a width of several µm to ten-odd µm are communicated mutually, it is not known clearly that what kind of breakage is induced by what kind of cause. Hence, in an actual mass-production process, it is difficult to adopt the manufacturing process shown in FIG. 1. In addition, if the manufacturing process shown in FIG. 1 is attempted to be adopted, the groove on the front face side becomes unnecessarily wide and deep. On the other hand, in the case of the method of designing the tip end shape of the dicing blade according to the Example, attention is paid to the fact that the stress received by the stepped section changes significantly depending on the tapered degree as shown in FIGS. 7 and 8, and a plurality of dicing blades having different tapered degrees are prepared at S200 in FIG. 17. Furthermore, at S206 in FIG. 17, only in the case that both the tapered degree in which the stepped section is broken and the tapered degree in which the stepped section is not broken are included, the selection of the tip end shape is performed. Hence, the groove 140 on the front face side being narrower and shallower can be adopted in a mass-production process, although the time and effort required for the design are more than those required in the case that a dicing blade having an arbitrary tip end shape is used.

Next, a specific method of preparing a plurality of dicing blades having different tapered degrees at S200 in FIG. 17 will be described below. First, diamond blades or blades in which a diamond blade and an aluminum substrate are integrated can be used as dicing blades for cutting GaAs compound semiconductors, for example. Generally, the tip ends of these dicing blades that are commercially available, for example, are formed into a rectangular shape having no curved face at the tip end section as shown in FIG. 5G. For this reason, in the case of such a dicing blade having a rectangular shape but not having a desired shape, the tip end section thereof is required to be processed.

This process includes the following steps. That is to say, dicing blades being commercially available, for example, are acquired, and a material for processing the tip end sections of the acquired dicing blades is selected. For example, a substrate made of Si, SiC or another compound semiconductor material is selected as a material for processing use. Other materials may also be used, provided that they can process the tip end sections into desired shapes.

Next, the cutting of the semiconductor substrate to be processed is repeated using the dicing blade, whereby the tip end section is worn so as to be formed into a desired shape. The angle formed by the substrate to be processed and the dicing blade, the rotation speed of the dicing blade, grinding time, polishing agent, etc. can be selected appropriately to obtain a desired curved face. As described above, before the dicing step, the dicing blade is formed into a desired tapered shape using the material for processing use prepared for processing the tip end section. With this kind of method, even a rectangular-shaped dicing blade to be used for general full dicing can be used in common as the dicing blade to be prepared at S200 in FIG. 17.

Next, the details of what kind of tapered degree should be prepared at S200 in FIG. 17 will be described below.

As a first mode, it is preferable that at least one kind of dicing blade that is more tapered than a dicing blade having a semicircular tip end section should be included. In other words, it is preferable that at least one kind of dicing blade having a tapered degree in which the maximum stress is generated in the root region of the stepped section is smaller than that in the dicing blade having a semicircular tip end section should be included. As clearly shown in FIG. 8, the maximum stress is saturated at a low level in the range (r is more than 12.5 µm) in which the tip end section is more tapered than the semicircular tip end section. In other words, a confirmation can be made as to whether the stepped section is broken under conditions close to the conditions in which the maximum stress applied to the root region becomes smallest by preparing at least one kind of dicing blade having a tapered degree included in the range. Moreover, for example, in the case that the stepped section is broken, it is judged easily at S208 that the width and depth of the groove 140 on the front face side are required to be changed so that the stepped section is hardly broken, instead of changing the design conditions so that the number of the kinds of the tip end shapes to be prepared is increased.

As a second mode, it is preferable that, in addition to a dicing blade having a tip end section more tapered than the semicircular tip end section, a dicing blade having a tip end section being less tapered than the semicircular tip end section should be included. In other words, it is preferable that both the dicing blade having a tapered degree in which the maximum stress to be generated in the root region of the stepped section is smaller than that in the dicing blade having the semicircular tip end section and the dicing blade having a tapered degree in which the maximum stress is larger should be included. As clearly shown in FIG. 8, the maximum stress is saturated at the low level in the range (r is more than 12.5 µm) in which the tip end section is more tapered than the semicircular tip end section. On the other hand, the variation in the maximum stress is large in the range (r is 12.5 µm or less) in which the tip end section is less tapered than the semicircular tip end section. In other words, in the case that the dicing blades having tapered degrees included in the respective ranges are prepared, it is highly possible that the dicing blades have tapered degrees in which the stepped section is broken and also have tapered degrees in which the stepped section is not broken. Hence, the flow easily advances to S210 in FIG. 17 from S206 in FIG. 17. In other words, the selection of the tip end shapes is facilitated.

As a third mode, it is preferable that a plurality of dicing blades having tapered degrees smaller than that of the cutting section having the semicircular tip end section should be included. In other words, it is preferable that a plurality of dicing blades having tapered degrees in which stresses larger than that generated in the dicing blade having the semicircular tip end section are generated in the root region of the stepped section should be included. As clearly shown in FIG. 8, in the range (r is less than 12.5 µm) in which stresses larger than that generated in the dicing blade having the semicircular tip end section are generated in the root region of the stepped section, the change in the maximum stress with respect to the tapered degree is larger than that in the range (r is 12.5 µm or more) in which the tapered degree is made larger than that in the range. Hence, in the case that a plurality of dicing blades inside the range in which the change in the maximum stress is large are prepared, a confirmation as to whether the stepped section is not broken even if to what extent the tapered degree is decreased is facilitated.

As a fourth mode, it is preferable that three or more kinds of dicing blades having tapered degrees smaller than that of the cutting section having the semicircular tip end section should be included. In other words, it is preferable that at least three kinds of dicing blades having tapered degrees in which stresses larger than that generated in the dicing blade having the semicircular tip end section are generated in the root region of the stepped section should be included. As clearly shown in FIG. 8, in the range (r is 12.5 µm or less) in which stresses larger than that generated in the dicing blade having the semicircular tip end section are generated in the root region of the stepped section, the change in the maximum stress is large, and the stress changes not linearly but nonlinearly. Hence, in the case that at least three kinds of dicing blades inside the range in which the stress changes nonlinearly are used, a confirmation as to whether the stepped section is not broken even if to what extent the tapered degree is decreased is facilitated in comparison with a case in which two kinds of dicing blades are used.

As a fifth mode, it is preferable that the dicing blades to be prepared should include a dicing blade having a tapered tip end shape with no top face at the top section and having a tapered degree in which the maximum stress is generated in the region of the top section away from the width of the groove on the front face side in the case that the position of the top section of the dicing blade in the groove width direction is away from the width of the groove on the front face side at the time when the groove on the back face side is formed. Unless this kind of dicing blade is included, in the case that the position of the top section in the groove width direction becomes away from the width of the groove on the front face side, a confirmation as to whether the stepped section is not broken even if to what extent the tapered degree is increased cannot be made at all. Furthermore, in the case that a plurality of such dicing blades are included, the confirmation as to whether the stepped section is not broken even if to what extent the tapered degree is increased is facilitated in comparison with a case in which only one kind of dicing blade is used. In the case that it is known that the top section of the dicing blade does not become away from the width of the groove on the front face side, it is not necessary to include this kind of dicing blade.

As a sixth mode, it is preferable that dicing blades in which the tapered degrees thereof provided at nearly equal intervals as shown in FIG. 15 should be prepared. Furthermore, although dicing blades having at least two kinds of tapered degrees are required to be prepared at S200 in FIG. 17, it is preferable that dicing blades having as many kinds of tapered degrees as possible should be prepared as shown in FIG. 15 in order to use narrower and shallower grooves on the front face side.

D) Example Based on the Relationship Between the Position of the Blade and the Groove Width D-1) Relationship Between Cutting Accuracy and the Groove on the Front Face Side Next, the relationship between the variation range of the tip end section of the dicing blade in the groove width direction and the width Sa of the groove 140 on the front face side will be described below, and a method of designing the tip end shape of the dicing blade and a method of manufacturing semiconductor chips on the basis of the relationship will also be described below. The variation range of the tip end section of the dicing blade in the groove width direction is a range in which the position of the tip end section of the dicing blade varies in the groove width direction due to the variation in manufacturing throughout a mass-production period. The range is determined by manufacturing conditions including, for example, the positioning accuracy of a manufacturing apparatus to be used and the degree of deformation (the amounts of the bending and warping) of the dicing blade. Furthermore, the positioning accuracy of the manufacturing apparatus includes the detection accuracy of a camera or the like for detecting alignment marks and the like and also includes accuracy gradually accumulated while cutting is performed along a plurality of lines. The bending and warping of the dicing blade will occur depending on the thickness of the dicing blade, the accuracy of the face to which the dicing blade is fixed and the method of the fixing, stress during cutting, the rotation speed of the apparatus, etc.

As described referring to FIG. 13, in a dicing blade having a large tapered degree, in the case that the tapered top section having no top face is away from the range of the groove 140 on the front face side of the semiconductor substrate in the groove width direction, stress may be concentrated on the region of the top section and the stepped section may be broken in some cases. In other words, in the case that a dicing blade having a tapered degree in which stress is concentrated on the region of the tapered top section having no top face is used, it is preferable that the tip end shape of the dicing blade, the shape (width and depth) of the groove 140 on the front face side, etc. should be determined so that the stepped section is not broken even if the top section is in the relationship between manufacturing conditions in which the top section is away from the range of the groove 140 on the front face side of the semiconductor substrate in the groove width direction and the width of the groove 140 on the front face side.

On the other hand, even in a dicing blade having a very large tapered degree, the stress applied to the stepped section does not change abruptly in the case of manufacturing conditions in which the top section thereof does not become away from the width of the groove 140 on the front face side due to the variation in manufacturing. In other words, in the case of manufacturing conditions in which the tapered top section having no top face is included in the width of the groove 140 on the front face side, the stepped section is not broken even in the case that the tapered degree is very large, that is, the curvature radius of the tip end corner section shown in FIG. 15 is 22 μm or 23 μm, for example. Conversely, the maximum stress applied to the stepped section becomes smaller as the tapered degree of the dicing blade is larger. Hence, the dicing blade with a large tapered degree is preferable from the viewpoint of making the maximum stress smaller.

Moreover, since the tapered top section having no top face is usually formed at the center of the thickness of the dicing blade, it is possible to say that the manufacturing conditions in which the tapered top section having no top face does not become away from the width of the groove 140 on the front face side are manufacturing conditions in which the variation range of the center of the thickness of the dicing blade in the groove width direction is included in the width of the groove 140 on the front face side. However, the tapered top section having no top face may become away from the center of the thickness of the dicing blade in some cases due to partial wear depending on the conditions at the time when the tip end shape is processed beforehand and the state of wear in an actual manufacturing process. That is to say, the position of the tapered top section having no top face and the center of the thickness of the dicing blade are not always coincident with each other.

From the viewpoint of accuracy, it is preferable to consider whether the actual position of the top section becomes away from the width of the groove 140 on the front face side. However, since the top section is usually formed at the center of the thickness of the dicing blade as described above, in the case that the center position of the thickness of the dicing blade is considered, unexpected breakage of the stepped section is suppressed in comparison with the case in which nothing is considered. In spite of the above-mentioned difference, since unexpected breakage of the stepped section is suppressed similarly, "the manufacturing conditions in which the variation range of the center of the thickness of the dicing blade in the groove width direction is included in the width of the groove 140 on the front face side (or becomes away from the width of the groove 140 on the front face side)" according to the Example can be read as "the manufacturing conditions in which the variation range of the tapered top section having no top face in the groove width direction is included in the width of the groove 140 on the front face side (or becomes away from the width of the groove 140 on the front face side)" unless otherwise specified and if there is no contradiction in technology.

In this Example, the term "inclusion" in the Example also includes a case in which the position of the top section is exactly coincident with the groove width. In addition, a judgment as to whether the variation range of the top section or the center of the thickness of the tip end section of the dicing blade in the groove width direction is included or not in the width of the groove 140 on the front face side is made depending on whether the state of being away from the width occurs due to factors including the factor of the passage of time in a mass-production period. The variation range of the top section or the center of the thickness is determined by, for example, manufacturing conditions including the positional accuracy of a manufacturing apparatus to be used and the deformation degree (the amounts of the bending and warping) of the dicing blade as described above. However, for the purpose of grasping the amounts of the bending and warping of the dicing blade, the amounts are required to be grasped through actual experiments or the like, and this requires time and effort. On the other hand, the positional accuracy of the manufacturing apparatus can be grasped relatively easily according to the specifications or the like described in catalogs or the like. Hence, in the case that the amounts of the bending and warping are not grasped, for example, in the case that it is difficult to grasp the amounts of the bending and warping, only the positional accuracy of the manufacturing apparatus may merely be considered. In other words, in the Example, the judgment may be made depending on the condition as to whether the range of the positional accuracy of the manufacturing apparatus to be used is included in the width of the groove 140 on the front face side, instead of the judgment condition as to whether the variation range of the top section or the center of the thickness of the tip end section of the dicing blade is included or not in the width of the groove 140. In this case, as the range of the positional accuracy of the manufacturing apparatus, the values described in the catalogs or the like of the product to be used are used as described above. However, in the case that the specifications are not described in the catalogs or the like or the specifications cannot be acquired from the manufacturer, actual measurements are required to be conducted. In this case, actual measurements are conducted a plurality of times in consideration of environmental conditions and other conditions, the average value and the standard deviation of the accuracy are calculated on the basis of the results of the measurements, and the values obtained by adding values in the range of the triple value (3-sigma) to the quadruple value (4-sigma) of the standard deviation to the average value are set as the range of the positional accuracy of the manufacturing apparatus. In the case that the positional accuracy depends on the accuracy levels of a plurality of apparatuses, the square average value of the accuracy levels of the respective apparatuses is used.

With respect to the width of the groove on the front face side required for the judgment as to whether the top section is included in the width of the groove 140 on the front face side, in the case that the width of the groove on the front face side is not constant as shown in FIGS. 27A to 27D described later, the maximum width from the position of the bottom section of the groove on the front face side to the position at which the top section of the dicing blade arrives is used as the width. For example, in the case that it is difficult to make the judgment as to whether the top section is included in the width of the groove 140 on the front face side or not and that the judgment cannot be made, even if either an example in which the top section is supposed to be included or the other example in which the top section is supposed to be not included (away from the width) is adopted, it is assumed that there is no significant difference in the degree of breakage at the stepped section therebetween. Hence, either one may merely be selected arbitrarily.

D-2) In the Case that the Top Section of the Blade is Included in the Groove on the Front Face Side Next, a method of designing the tip end shape of the dicing blade and a method of manufacturing semiconductor chips will be described on the basis of the relationship between the position of the dicing blade in the groove width direction and the width of the groove 140 on the front face side. First, an exemplary embodiment in the manufacturing conditions in which the variation range of the center of the thickness of the dicing blade in the groove width direction is included in the width of the groove 140 on the front face side is explained.

As a first mode, in the manufacturing conditions in which the variation range of the center of the thickness of the dicing blade in the groove width direction is included in the width of the groove 140 on the front face side, the tip end shape of the dicing blade may be designed as described below. For example, when the tip end shape of the dicing blade is designed according to the flow shown in FIG. 7, it is not necessary to prepare dicing blades having very large tapered degrees at S200. On the basis of the results of the simulation shown in FIG. 8, in the range of the curvature radiuses r of 25 μm or more, the maximum stress changes only 0.1 MPa. Hence, it is almost meaningless to prepare a dicing blade having a tapered degree in which the curvature radius of the tip end corner section is 25 μm or more (the curvature radius of the tip end corner section is not less than the thickness of the dicing blade). In other words, the plurality of dicing blades to be prepared may merely include at least a dicing blade having a tapered degree in which a stress larger than the stress generated by the curvature radius of the tip end corner section that is not less than the thickness of the dicing blade is generated in the root region of the stepped section. The dicing blade having the tapered degree in which a stress smaller than that is generated in the root region of the stepped section may not be included.

As a second mode, in the manufacturing conditions in which the variation range of the center of the thickness of the dicing blade in the groove width direction is included in the width of the groove 140 on the front face side, semiconductor chips may be manufactured using a manufacturing method described below. For example, the range of the tapered degrees in which the stepped section is broken because the tapered degree of the tip end shape of the dicing blade is small is confirmed in the flow shown in FIG. 17. Dicing blades having tip end shapes provided with tapered degrees larger than the tapered degrees included in this range are used. Conversely, dicing blades having tip end shapes provided with tapered degrees smaller than the tapered degrees in this range are not used. This is because, in the manufacturing conditions in which the center of the thickness of the dicing blade is included in the width of the groove 140 on the front face side, even if the tapered degree is large, the stress applied to the stepped section does not change abruptly, unlike the case in which the kerf width is very narrow (Sb=11.2) and the positional deviation amount Ds is large (Ds=7.5 μm) as shown in FIG. 13, whereby only the range on the side in which the tapered degree is smaller may merely be considered in design.

The range of the tapered degrees in which the stepped section is broken due to a small tapered degree is a range in which the curvature radius of the tip end corner section is not more than 8 μm according to FIG. 15. In addition, in the manufacturing conditions in which the variation range of the center of the thickness of the dicing blade in the groove width direction is included in the width of the groove 140 on the front face side, in the case that the stepped section is broken as the groove on the back face side is formed, this means that the stress to the root region of the stepped section is too large. Hence, in the case that the stepped section is broken as a result of the formation of the groove on the back face side using a dicing blade having a certain tapered degree, dicing blades having tapered degrees smaller than the tapered degree may merely be not used.

As a third mode, in the manufacturing conditions in which the variation range of the center of the thickness of the dicing blade in the groove width direction is included in the width of the groove 140 on the front face side, a dicing blade having a shape being more tapered than that of the dicing blade having such a semicircular tip end section as shown in FIG. 6D as the initial tip end shape at the time of cutting is used. As clearly shown in FIG. 8, in the range (r<12.5 μm) in which the tapered degree is smaller than that of the semicircular tip end section (r=12.5 μm), the maximum stress varies significantly in the case that the tapered degree varies. On the other hand, in the range (r>12.5 μm) in which the tapered degree is larger than that of the semicircular tip end section, the maximum stress is saturated at a low level. When it is assumed that the tip end shape more tapered than the tip end section having the semicircular shape is the initial tip end shape at the time of cutting, the state in which the stress to the stepped section is suppressed at the low level can be maintained throughout a mass-production period even in the case that the dicing blade is worn thereafter. Furthermore, in the case that the shape of the region in which the stress is saturated at the low level is formed into the initial tip end shape, the variation of the stress applied to the stepped section can be suppressed and a narrower and shallower groove can be adopted more easily on the front face side even in the case that the tip end shape varies when the dicing blades having the initial shape are prepared. As a result, the breakage of the stepped section is suppressed in comparison with the case in which the tip end shape having a tapered degree smaller than that of the semicircular tip end section is used as the initial tip end shape.

The dicing blade having a shape more tapered than the dicing blade having the semicircular tip end section may be prepared by processing a rectangular dicing blade as described at S200 in FIG. 17 or may be prepared by acquiring such a dicing blade from other entities (others) instead of performing the process in-house. Furthermore, a confirmation may be made as to whether the variation range of the center of the thickness of the dicing blade in the groove width direction is included in the width of the groove on the front face side, and in the case that the range is included in the width, a determination may be made so that, for example, a dicing blade preliminarily having a shape more tapered than that of the dicing blade having a semicircular tip end section as an initial tip end shape at the time of cutting is used.

As a fourth mode, in the manufacturing conditions in which the variation range of the center of the thickness of the dicing blade in the groove width direction is included in the width of the groove 140 on the front face side, semiconductor chips may be manufactured by using the manufacturing method described below. For example, in the case that the stepped section has a strength such that the stepped section is broken in the case that a dicing blade having a rectangular tip end shape in cross section as viewed from the rotation direction is used, a dicing blade having a tip end shape provided with a tapered degree that is larger than the range of the tapered degrees in which the stepped section is broken is used to form the groove 170 on the back face side. In other words, in such a case as described above, a dicing blade having a tip end shape that is tapered so that a stress equal to or larger than the stress capable of breaking the stepped section is not applied to the root region of the stepped section is used to form the groove 170 on the back face side. With the manufacturing conditions, even in the shape of the groove on the front face side that is narrow and shallow to the extent that the stepped section may be broken in the case that a rectangular dicing blade being used generally and frequently is used, the semiconductor substrate can be diced so that the stepped section of the semiconductor chip is not broken by the stress applied from the dicing blade.

As clearly shown in FIG. 8, the stress received by the stepped section varies four or more times depending on the tapered degree of the tip end section. Hence, this exemplary embodiment is based on two findings: one is that a tapered degree in which the stepped section is not broken is present even if the groove shape on the front face side is narrow and shallow to the extent that the stepped section may be broken in the case that the dicing blade having a rectangular tip end shape is used, and the other is that the stress applied to the stepped section does not change abruptly even if the tapered degree is made larger in the manufacturing conditions in which the variation range of the center of the thickness of the dicing blade in the groove width direction is included in the width of the groove 140 on the front face side.

By the use of a dicing blade having a tip end section being tapered more than a semicircular tip end section or by the use of a dicing blade having a tapered degree in which a stress smaller than that generated by the semicircular tip end section is generated in the root region of the stepped section, the region in which the stress applied to the stepped section is saturated at the low level can be used. Hence, the use of these dicing blades is preferable from the viewpoint of stress.

D-3) In the Case that the Top Section of the Blade Becomes Away from the Groove on the Front Face Side.

The exemplary embodiment in the manufacturing conditions in which the variation range of the center of the thickness of the dicing blade in the groove width direction is included in the width of the groove 140 on the front face side has been described above. Next, an exemplary embodiment in the manufacturing conditions in which the variation range of the center of the thickness of the dicing blade in the groove width direction becomes away from the width of the groove 140 on the front face side will be described below.

First, as a first mode, in the manufacturing conditions in which a dicing blade having a tapered tip end shape with no top face at the top section is used and the variation range of the top section in the groove width direction becomes away from the width of the groove on the front face side, semiconductor chips can be manufactured by using the manufacturing method described below. For example, the groove on the back face side is formed using a dicing blade that has a tip end shape having a tapered degree smaller than the range of the tapered degrees in which the maximum stress is applied at the region of the top section and the stepped section is broken. In other words, the dicing blade having such a shape as that described above is used throughout a mass-production period.

With this kind of manufacturing method, it is possible to prevent a situation in which a dicing blade having a tapered degree in which the maximum stress may be applied at the region of the top section and the stepped section may be broken eventually is used unknowingly even in the manufacturing conditions in which the variation range of the tapered top section having no top face in the groove width direction becomes away from the groove width on the front face side. As a result, unexpected breakage can be suppressed, whereby the breakage of the stepped section can be suppressed effectively in comparison with the case wherein the dicing blade having the tip end shape in which the maximum stress is applied at the region of the top section and the stepped section is broken is used. In the case that the range of the tapered degrees in which the maximum stress is applied to the stepped section is desired to be confirmed, the confirmation can be made, for example, by performing such stress simulations as shown in FIGS. 12 and 13 or by actually forming a groove on the back face side and by checking the state of the breakage thereof. In the case that a groove is actually formed on the back face side and the state of the breakage is confirmed, for example, in the case that a groove is actually formed on the back face side for a narrow and shallow groove on the front face side, and in the case that the stepped section is broken, a confirmation may merely be made as to whether the breakage has occurred at the region of the top section or at the root region.

As a second mode, in the manufacturing conditions in which a dicing blade having a tapered tip end shape with no top face at the top section is used and the variation range of the top section in the groove width direction becomes away from the width of the groove on the front face side, the dicing blade is replaced before the tapered degree gets in the range of the tapered degrees in which the maximum stress is applied at the region of the top section and the stepped section is broken due to the wear of the dicing blade. With this method, the breakage of the stepped section by the occurrence of the maximum stress at the region of the top section due to the wear of the dicing blade is prevented. Furthermore, in the case that this kind of manufacturing method is used, it may be possible, by using the designing method shown in FIG. 17, that the grooves on the back face side are formed using a plurality of dicing blades having tip end shapes provided with different tapered degrees in a state in which the position of each top section in the groove width direction becomes away from the groove width on the front face side, that the tapered degree that may be used and the tapered degree that should not be used are confirmed according to the results of the formation of the grooves on the back face side, and that the dicing blade is replaced before the tapered degree reaches the tapered degree that is obtained from the results of the confirmation and that should not be used.

As a third mode, in the manufacturing conditions in which a dicing blade having a tapered tip end shape with no top face at the top section is used and the variation range of the top section in the groove width direction becomes away from the width of the groove on the front face side, semiconductor chips may be manufactured by using the manufacturing method described below. For example, in the manufacturing conditions in which a dicing blade having a tapered tip end shape with no top face is used and in manufacturing conditions in which a dicing blade having a tapered degree in which the maximum stress is applied to the stepped section at the region of the top section when the position of the top section in the groove width direction becomes away from the groove width on the front face side, manufacturing is performed in conditions in which the shape (width and depth) of the groove on the front face side and the depth at which the top section arrives are set so that the stepped section is not broken by the maximum stress when the position of the top section in the groove width direction becomes away from the groove width on the front face side. With this kind of manufacturing method, in the manufacturing conditions in which the position of the top section of the dicing blade in the groove width direction becomes away from the groove width on the front face side, the breakage of the stepped section is suppressed even in the case that the dicing blade having a tip end shape in which the maximum stress is applied to the stepped section at the region of the top section is used unknowingly. If the above-mentioned setting has not be done, in the case that the position of the top section of the dicing blade in the groove width direction becomes away from the groove width on the front face side, unexpected breakage may occur. Since the shape of the stepped section is determined by the shape (width and depth) of the groove on the front face side and the depth at which the top section arrives and the strength of the stepped section is determined by the shape of the stepped section, it is assumed that the strength of the stepped section is set by the setting of the shape (width and depth) of the groove on the front face side and the depth at which the top section arrives.

As a fourth mode, in the manufacturing conditions in which a dicing blade having a tapered tip end shape with no top face at the top section is used and the variation range of the top section in the groove width direction becomes away from the width of the groove on the front face side, semiconductor chips may be manufactured by using the manufacturing method described below. For example, in the case that the tip end section is worn so as to have a tapered degree in which the maximum stress is applied to the stepped section in the region of the top section during the use period of the dicing blade, manufacturing is performed in the conditions in which the shape of the groove on the front face side and the depth at which the top section arrives are set so that the stepped section is not broken by the maximum stress. With this kind of manufacturing method, in the manufacturing conditions in which the position of the top section of the dicing blade in the groove width direction becomes away from the groove width on the front face side, even in the case that the dicing blade having the tip end shape in which the maximum stress is applied to the stepped section at the region of the top section is used unknowingly, the breakage of the stepped section is suppressed. If the above-mentioned setting has not been done, unexpected breakage may occur.

As a fifth mode, in the manufacturing conditions in which the variation range of the center of the thickness of the dicing blade in the groove width direction becomes away from the width of the groove 140 on the front face side, semiconductor chips may be manufactured by using the manufacturing method described below. For example, in the manufacturing conditions in which the variation range of the center of the thickness of the dicing blade in the groove width direction becomes away from the width of the groove on the front face side, semiconductor chips may merely be manufactured by confirming both the range of the tapered degrees in which the stepped section is broken because the tapered degree of the tip end shape of the dicing blade is small and the range of the tapered degrees in which the stepped section is broken because the tapered degree of the tip end shape of the dicing blade is large, as indicated in the results of the experiment shown in FIG. 15 and then by forming the groove on the back face side using the tip end shape having a tapered degree included in the range of the tapered degrees between the above-mentioned two ranges.

The reason for this is that, in the case that the tip end shape of the dicing blade is determined without confirming the range of the tapered degrees in which the stepped section is broken due to the large tapered degree of the tip end shape of the dicing blade in spite of the manufacturing conditions in which the variation range of the center of the thickness of the dicing blade in the groove width direction becomes away from the width of the groove 140 on the front face side, unexpected breakage may occur. Furthermore, in the case that the range of the tapered degrees in which the maximum stress is generated in the root region of the stepped section and the range of the tapered degrees in which the maximum stress is generated in the region of the top section are included in the range between the two ranges, it is preferable that the groove on the back face side should be formed using a cutting member having a tip end shape provided with a tapered degree included in the range of the tapered degrees in which the maximum stress is generated in the root region of the stepped section. This is because the life of the cutting member is made longer by the amount corresponding to the tapered degree that is decreased in comparison with the case in which a cutting member having a tip end shape provided with a tapered degree included in the range of the tapered degrees in which the maximum stress is generated in the root region of the stepped section is used.

D-4) Method of Setting the Width of the Groove on the Front Face Side and Method of Setting Manufacturing Conditions Next, a method of setting the width of the groove on the front face side and a method of setting manufacturing conditions in consideration of the relationship between the width of the groove on the front face side and the variation range of the top section (or the thickness direction center) of the dicing blade in the groove width direction will be described below.

Figure 18:
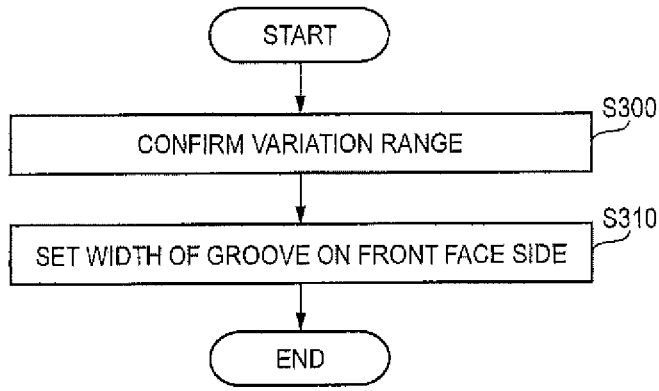
FIG. 18 is a flowchart illustrating a method of setting the width of the groove on the front face side according to the Example of the present invention.

FIG. 18 is a view illustrating a method of setting the width of the groove on the front face side according to the Example of the present invention. First, at S300, the variation range of the thickness direction center of a dicing blade in the groove width direction is confirmed. For example, the variation range of the thickness direction center of the dicing blade in the groove width direction is grasped by making a confirmation by referring to product catalogs or through actual measurements. Next, at S310, the width of the groove on the front face side is determined to a width included in the variation range confirmed at S300. A groove having this width is then formed. With this kind of setting method, unlike the case in which the kerf width is very narrow (Sb=11.2) and the positional deviation amount Ds is large (Ds=7.5 μm) as shown in FIG. 13, the stress is not concentrated on the region of the top section and the breakage of the stepped section is suppressed. The "setting" of the groove width includes the determination of the groove width and the formation of the groove having the groove width in an actual substrate.

Furthermore, at S300 in FIG. 18, in the case that a dicing blade having a tapered top section having no top face is used, the variation range of the top section in the groove width direction may be confirmed, and the width of the groove on the front face side may be determined so as to include the range. Moreover, the range of the positional accuracy of a manufacturing apparatus to be used may be confirmed and the width of the groove on the front face side may be determined so as to include the range. It is preferable that the width including the variation range should be determined so as to be as narrow as possible. This is because the number of semiconductor chips to be acquired from a single substrate decreases in the case that the width of the groove on the front face side is too wide. For example, in the case that the variation range of the thickness direction center of the dicing blade in the groove width direction is ±3 μm, the width of the groove on the front face side may merely be set preferably to approximately 6 to 9 μm, that is, approximately ±50% of the variation range of the thickness direction center of the dicing blade, instead of setting the width of the groove on the front face side to 10 μm or more. However, in the case that a groove having no constant width is adopted as shown in FIGS. 27A to 27D described later, a groove shape may merely be formed such that the maximum width between the position of the bottom section of the groove on the front face side and the position at which the top section of the dicing blade arrives includes the variation range.

Figure 19:
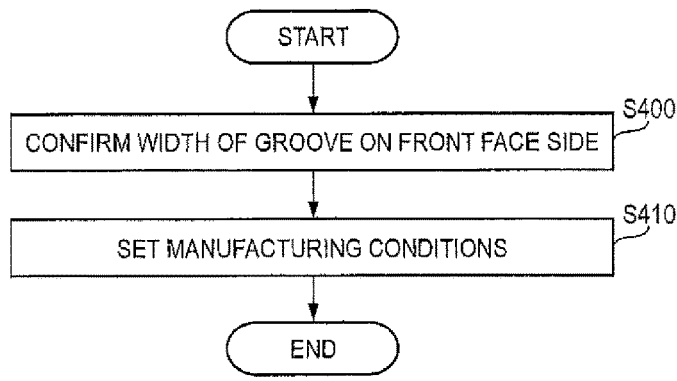
FIG. 19 is a flowchart illustrating a method of selecting a manufacturing apparatus according to the Example of the present invention.

FIG. 19 is a view illustrating a method of setting manufacturing conditions according to the Example of the present invention. First, at S400, the width of the groove on the front face side is confirmed. More specifically, the maximum width between the position of the bottom section of the groove on the front face side and the position at which the top section of the dicing blade arrives is confirmed. The maximum width may merely be confirmed by, for example actually measuring the groove on the front face side formed in the substrate as the method of the confirmation. Next, at S410, in order that the variation range of the thickness direction center of the dicing blade in the groove width direction is included in the confirmed width on the front face side, manufacturing conditions exerting influence on the variation range are set. More specifically, a manufacturing apparatus, such as a dicing apparatus, having accuracy in which the variation range of the thickness direction center of the dicing blade in the groove width direction is included in the confirmed width of the groove on the front face side is selected, a dicing blade being less warped and less bent is selected, and an optimal rotation speed is set. Then, a manufacturing system (manufacturing line) conforming to the manufacturing conditions having been selected and determined as described above is constructed and used to manufacture semiconductor chips. The "setting" of the manufacturing conditions herein means the selection of an apparatus, the determination of other conditions and the preparation of a manufacturing system on the basis of the selection and determination. With the manufacturing condition setting method described above, unlike the case in which the kerf width is very narrow (Sb=11.2) and the positional deviation amount Ds is large (Ds=7.5 μm) as shown in FIG. 13, the provability of the stress concentration on the region of the top section becomes low, and the breakage of the stepped section is suppressed. Furthermore, not only the accuracy of the manufacturing apparatus, but also manufacturing conditions, such as the thickness of the dicing blade, the accuracy of the fixing face for fixing the dicing blade and the method of the fixing, the stress during cutting and the rotation speed of the apparatus, are considered, and these may be used as conditions for preventing the variation range from becoming away from the width of the groove on the front face side. In other words, the breakage of the stepped section due to the concentration of the stress on the region of the top section is suppressed by setting the manufacturing conditions exerting influence on the variation range of the dicing blade, that is, the manufacturing conditions including the accuracy range of the manufacturing apparatus to be used and the range of the variation due to the deformation (bending and warping) of the dicing blade, so that the variation range of the thickness direction center of the dicing blade in the groove width direction is included in the width of the groove on the front face side.

Furthermore, at S410 in FIG. 19, in the case that a dicing blade having a tapered top section having no top face is used, manufacturing conditions exerting influence on the variation range of the dicing blade may be set so that the variation range of the top section in the groove width direction is included in the confirmed width. The deformation (bending and warping) of the dicing blade may not be considered particularly in some cases, such as a case in which the thickness of the dicing blade is thick or a case in which the depth of cutting is shallow. However, in a case in which the thickness of the dicing blade is thin or a case in which the depth of cutting is deep, it is preferable that the setting of the conditions should be considered.

Figure 20:
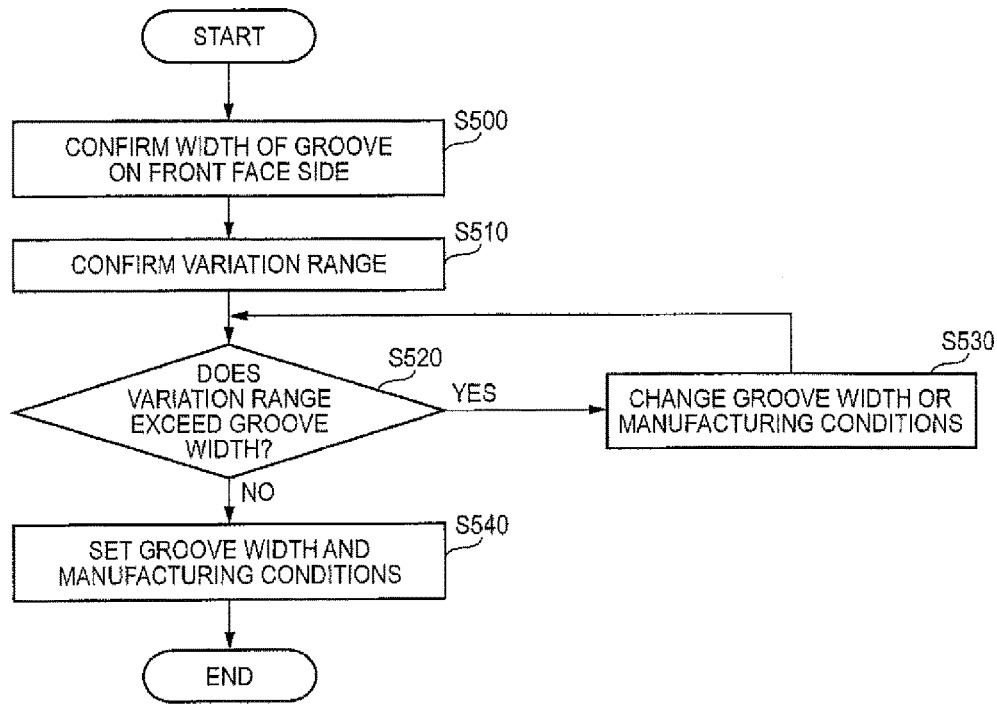
FIG. 20 is a flowchart illustrating other examples of the method of setting the width of the groove on the front face side and the method of selecting a manufacturing apparatus according to the Example of the present invention.

FIG. 20 is a view illustrating other examples of the method of setting the width of the groove on the front face side and the method of setting the manufacturing conditions according to the Example of the present invention. First, at S500 and S510, the width of the groove on the front face side and the variation range of the dicing blade in the groove width direction are confirmed. The details thereof are similar to those shown in FIGS. 18 and 19. Next, at S520, a confirmation is made as to whether the variation range of the thickness direction center (or the top section) of the dicing blade in the groove width direction becomes away from the width of the groove on the front face side. In the case that the variation range does not become away from the width of the groove, the flow advances to S540, and the groove width and the manufacturing conditions are set. On the other hand, in the case that the variation range becomes away from the width of the groove, the flow advances to S530, and at least the width of the groove on the front face side or the manufacturing conditions exerting influence on the variation range are changed so that the variation range of the thickness direction center (or the top section) of the dicing blade in the groove width direction does not become away from the width of the groove on the front face side. For example, the dicing apparatus is replaced with a dicing apparatus having higher positional accuracy, the amount of warping of the blade is reduced by making the blade thicker, or other conditions, such as rotation speed, are optimized. With this change, unlike the case in which the kerf width is very narrow (Sb=11.2) and the positional deviation amount Ds is large (Ds=7.5 µm) as shown in FIG. 13, the stress is not concentrated on the region of the top section and the breakage of the stepped section is suppressed. Also in the Example, when the confirmation as to whether the center of the dicing blade becomes away from the width of the groove on the front face side is made, only the accuracy range of the manufacturing apparatus to be used may be considered or both the accuracy range and the variation range due to the deformation (bending and warping) of the dicing blade may be considered.

The method of designing the tip end shape of the dicing blade, the method of manufacturing the semiconductor chips, the method of setting the width of the groove on the front face side, the method of setting the manufacturing conditions, etc. on the basis of the relationship between the position of the dicing blade in the groove width direction and the width of the groove on the front face side has been described above. In these examples, "the manufacturing conditions in which the variation range of the center of the thickness of the dicing blade in the groove width direction is included in the width of the groove 140 on the front face side (or becomes away from the width of the groove 140 on the front face side)" can be read as "the manufacturing conditions in which the variation range of the tapered top section having no top face in the groove width direction is included in the width of the groove 140 on the front face side (or becomes away from the width of the groove 140 on the front face side)" unless otherwise specified and if there is no contradiction in technology. Furthermore, the manufacturing conditions can also be read as "the manufacturing conditions in which the positional accuracy range of the manufacturing apparatus to be used is included in the width of the groove 140 on the front face side (or becomes away from the width of the groove 140 on the front face side)". Moreover, these conditions are not required to be satisfied throughout the period from the start time of the use of the dicing blade to the replacement of the dicing blade but may merely be satisfied in part of the use period, unless otherwise specified. What's more, a step of confirming whether the variation range of the center of the thickness or the top section of the dicing blade is included in the width of the groove 140 on the front face side may be provided or may not be provided, unless otherwise specified. Still further, the configurations and the conditions of the respective examples may be combined mutually, if there is no contradiction in technology.

E) Example of the Step of Preliminarily Processing the Tip End Shape

Next, a step of preparing a dicing blade for use in an actual mass-production process will be described below. This processing step may or may not be applied to the respective Examples described above. In this processing step, before the groove on the back face side is formed in an actual mass-production process, it is necessary to prepare a desired tip end shape selected by, for example, the design flow shown in FIG. 17. The method of the preparation may be similar to the method described at S200 in FIG. 17. In other words, for example, a dicing blade having a rectangular tip end shape is prepared, and a processing step of preliminarily forming the tip end shape into the desired tip end shape is provided. In this processing step, the acquired dicing blade is processed until the tapered degree in which the stepped section is not broken is obtained. The desired tip end shape to be obtained by the processing step may be the shape determined by the flow shown in FIG. 17 or may be a shape that is determined by a method different from that shown in the flow of FIG. 17. Furthermore, the processing step may or may not be applied to the respective Examples described above.

Next, a further preferable embodiment of the processing step of preliminarily forming the tip end shape into the desired tip end shape will be described below. As a first mode, although a rectangular tip end shape or other arbitrary tip end shapes are used for general dicing, in the processing step according to the Example, a dicing blade having a tip end shape, such as a rectangular shape or a shape close to the rectangular shape, in which a stress not less than the stress of breaking the stepped section is applied to the root region of the stepped section, is tapered so that the tip end shape is preliminarily processed so as to have a tapered degree in which the stepped section is not broken. For example, the tip end section is preliminarily worn until the tapered degree in which the stepped section is not broken is obtained. With this processing, even if the dicing blade has a tip end shape in which a stress not less than the stress of breaking the stepped section is applied to the root region of the stepped section, the dicing blade can be used as a dicing blade capable of suppressing the breakage of the stepped section. But, in the case that the stepped section is not broken because the width of the groove on the front face side is wide and deep even if a dicing blade having a rectangular tip end section is used, such a preliminary processing step as in the Example is not required. However, in the case that the width of the groove on the front face side is narrow and shallow, that is, in the case that a stress not less than the stress of breaking the stepped section is applied to the root region of the stepped section when a rectangular tip end shape or other arbitrary tip end shapes are used, it is preferable that the step of preliminarily processing the tip end section should be provided as in this Example.

As a second mode, at the step of preliminarily processing the tip end section, the dicing blade may be more tapered than a dicing blade having a semicircular tip end section. For example, even in the case that the stepped section is not broken when the tip end section is not more tapered than the tip end section having a semicircular shape, the tip end section may be more tapered than the semicircular tip end section. This is because, as clearly shown in FIG. 8, in the range in which the tapered degree of the tip end section is larger than that of the semicircular dicing blade, the change in the maximum stress is small and the stress is suppressed sufficiently, whereby the variation of the stress in the root region of the stepped section is suppressed even if the tip end shape varies and becomes different from a desired shape in the processing step. As a result, the variation of the stress in the root region of the stepped section can be suppressed even in the case the tip end shape varies in the processing step in comparison with the case in which the dicing blade is not more tapered than the dicing blade having a semicircular tip end section.

As a third mode, in the case that the step of preliminarily processing the tip end section is a step of processing the tip end section into a tapered tip end shape having no top face at the top section, it is preferable that the relationship between the variation range of the preliminarily processed top section in the groove width direction and the groove width on the front face side should be a relationship in which the variation range of the preliminarily processed top section in the groove width direction is included in the groove width on the front face side. In the case that the tip end section is preliminarily processed, the position of the top section deviates in some cases from the thickness direction center of the dicing blade. Hence, even if the variation of the tip end shape in the processing step is considered, if the top section is included in the groove width on the front face side, the breakage of the stepped section due to the concentration of the stress on the region of the top section is suppressed even in the case that the tip end shape varies in the processing step.

As a fourth mode, in the case that the dicing blade having the preliminarily processed tip end section is used, it is preferable that the relationship between the variation range of the thickness direction center of the dicing blade in the groove width direction and the groove width on the front face side should be a relationship in which the variation range of the thickness direction center of the dicing blade in the groove width direction is included in the groove width on the front face side. In the case that the dicing blade has been tapered at the processing step of the Example, the tapered top section is liable to be formed at the thickness direction center of the dicing blade. Hence, in the case that the variation range of the thickness direction center of the dicing blade is included in the groove width on the front face side, even in the case that the tip end section is processed so as to have a tapered degree in which the stress is concentrated on the region of the top section, the breakage of the stepped section due to the concentration of the stress on the region of the stepped section is suppressed in comparison with the case in which the variation range is not included in the groove width. Moreover, even in the case that the tip end section is not tapered to the extent that the stress is concentrated on the region of the top section, the breakage of the stepped section due to the concentration of the stress on the region of the stepped section in the case that the tip end section is tapered due to wear in a mass-production process is suppressed.

As a fifth mode, as the tip end shape of the dicing blade before it is preliminarily processed, it is preferable that a dicing blade having a substantially rectangular shape in cross section as viewed from the rotation direction should be prepared. This is because the dicing blade having such a substantially rectangular shape in cross section is frequently used for full dicing and is easily acquired and the dicing blade is easily processed so as to have an arbitrarily tapered degree by the processing step. Furthermore, in the case that the dicing blade having the substantially rectangular shape is used, it is preferable that a confirmation as to whether the stepped section is broken by the dicing blade having the substantially rectangular shape in a preliminary design step should be made. If the stepped section is not broken and in the case that it is not intended to change, for example, the shape of the groove on the front face side, the dicing blade having the substantially rectangular shape may merely be used without modification in a mass-production process. Then, the step of preliminarily processing the tip end may merely be performed for only the tip end shape in which the stepped section is broken. With the Example, the confirmation as to whether the stepped section is broken by the tip end shape to be used in a mass-production process is made, and the processing step is performed only in the case that the stepped section is broken, whereby it is needless to perform the processing step. "The substantially rectangular shape" includes a shape having slightly curved faces formed at the tip end corner sections due to variation in manufacturing and the like as a result of the manufacturing intended so that the tip end shape is formed into a rectangular shape. For example, the dicing blades having been manufactured so as to be formed into a rectangular shape and having been sold and described in catalogs or the like are included in the dicing blades having "the substantially rectangular shape" according to the Example, regardless of the size of the curved faces at the tip end corner sections.

Next, as a sixth mode, in the case that it is assumed that the top section (the thickness direction center) of a dicing blade having a tapered degree in which the maximum stress is generated in the region of the top section becomes away from the groove width of the groove 140 on the front face side of the semiconductor substrate, a process to be performed in the case that the dicing blade having the tapered degree in which the stepped section is broken by the maximum stress will be described below. As shown in the results of the simulation in FIG. 13, when the top section (the thickness direction center) of the dicing blade having a large tapered degree becomes away from the width of the groove 140 on the front face side of the semiconductor substrate, the stress is concentrated on the region of the top section of the dicing blade instead of the root region of the stepped section of a semiconductor chip. In the case that the strength of the stepped section in the semiconductor substrate to be processed cannot withstand the stress at the region of the top section at this time, the stepped section is broken. A determination as to whether the tapered degree is a tapered degree in which the maximum stress is applied at the region of the top section and the stepped section is broken depends on not only the tip end shape but also, for example, the strength of the stepped section in the semiconductor substrate to be processed. Hence, the tapered degree is grasped by actually processing the semiconductor substrate to be processed or by performing another simulation, for example. The strength of the stepped section depends on the shape of the groove 140 on the front face side, such as the width and depth of the groove 140 on the front face side. FIGS. 21A to 21E show the examples of dicing blades 500, 502, 504, 506 and 508 having tip end shapes in which the maximum stress is applied to the stepped section at the region of the top section. In the case that a dicing blade having such a tip end shape is acquired, when the dicing blade having the initial state is attempted to be used without modification and in a mass-production process, breakage occurs in the stepped section depending on the relationship between the tip end shape and the strength or the like of the stepped section. Hence, it is desired to suppress this breakage.

Figure 21A:
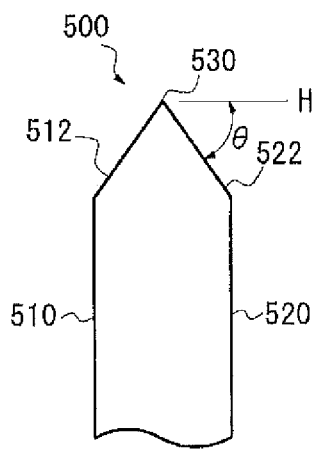
FIGS. 21A, 21B, 21C, 21D and 21E are enlarged cross-sectional views showing examples of the tip end section of the dicing blade according to the Example of the present invention.

The dicing blade 500 shown in FIG. 21A has a pair of side faces 510 and 520 and a pair of inclined faces 512 and 522 obliquely and linearly extending from the pair of side faces 510 and 520. A pointed top section 530 is formed at the intersection portion of the pair of the inclined faces 512 and 522. The inclination angle θ of the pointed top section 530 is defined by the angle of the face H orthogonal to the side faces 510 and 520 and the inclined faces 512 and 522 or the angle of the face H parallel to the rotation axis of the dicing blade and the inclined faces 512 and 522. Furthermore, the distance between the pair of side faces 510 and 520 corresponds to the kerf width Sb.

Figure 21B:
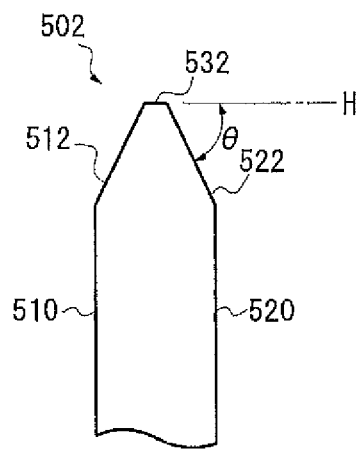
Figure 21C:
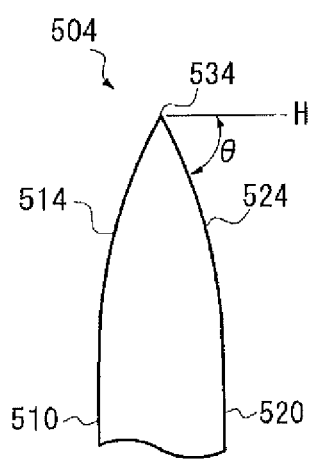
Figure 21D:
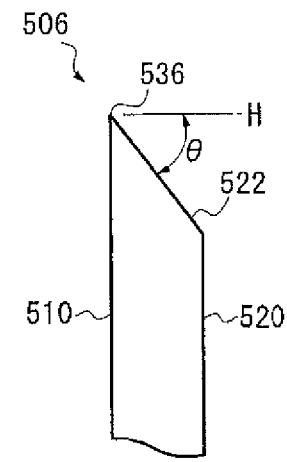
Figure 21E:
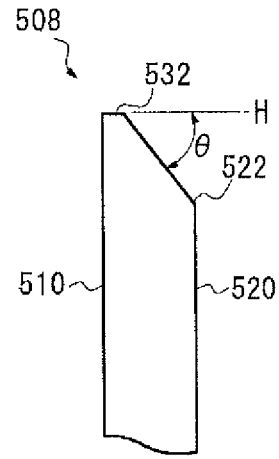

The dicing blade 502 shown in FIG. 21B has a flat face (top face) 532 formed at the pointed top section 530 shown in FIG. 21A. In this case, the angle of the face H parallel to the flat face 532 and the inclined faces 512 and 522 is the inclination angle θ of the top section (top face). In the dicing blade 504 shown in FIG. 21C, inclined faces 514 and 524 extending from the pair of side faces 510 and 520 are curved, and a pointed top section 534 is formed at the intersection portion of the inclined faces 514 and 524. In the dicing blade 506 shown in FIG. 21D, the side face 510 having a linear shape intersects with an inclined face 522 linearly extending obliquely from the other side face 520, and a pointed top section 536 is formed at the intersection. The dicing blade 508 shown in FIG. 21E has a flat face (top face) 532 formed at the pointed top section 536 of the dicing blade shown in FIG. 21D.

The dicing blades shown in FIGS. 21A to 21E in which the maximum stress is applied at the region of the top section are taken as examples and may have configurations other than those described above. For example, in the range of the shape in which the maximum stress is applied at the region of the top section, the inclination angle θ of the top section may be set arbitrarily, and the inclined faces 512 and 522 shown in FIG. 21A may have inclination angles different from each other (in other words, they may not be linearly symmetrical with the center line of the thickness). In addition, in the range of the shape in which the maximum stress is applied at the region of the top section, the flat face 532 shown in FIG. 21B may be curved into a convex shape, or a flat face may be formed at the top section 534 shown in FIG. 21C.

In the case that the dicing blades having tapered shapes at the tip end sections in which the maximum stress is applied at the regions of the top sections are used for a mass-production process, and in the case that the top section (the thickness direction center) of each dicing blade becomes away from the width of the groove 140 on the front face side of the semiconductor substrate and the stepped section cannot withstand the stress, breakage occurs at the stepped section. More specifically, in the case that the top section (the thickness direction center) of the dicing blade is included in the width of the groove 140 on the front face side of the semiconductor substrate, no breakage occurs at the stepped section. However, in the case that the top section becomes away from the width of the groove 140 on the front face side due to variation in manufacturing, breakage occurs at the stepped section. Hence, the rate of breakage in the amount of production increases in comparison with the case in which, for example, variation in manufacturing is small and the top section (the thickness direction center) of the dicing blade is always included in the width of the groove 140 on the front face side.

Figure 22:
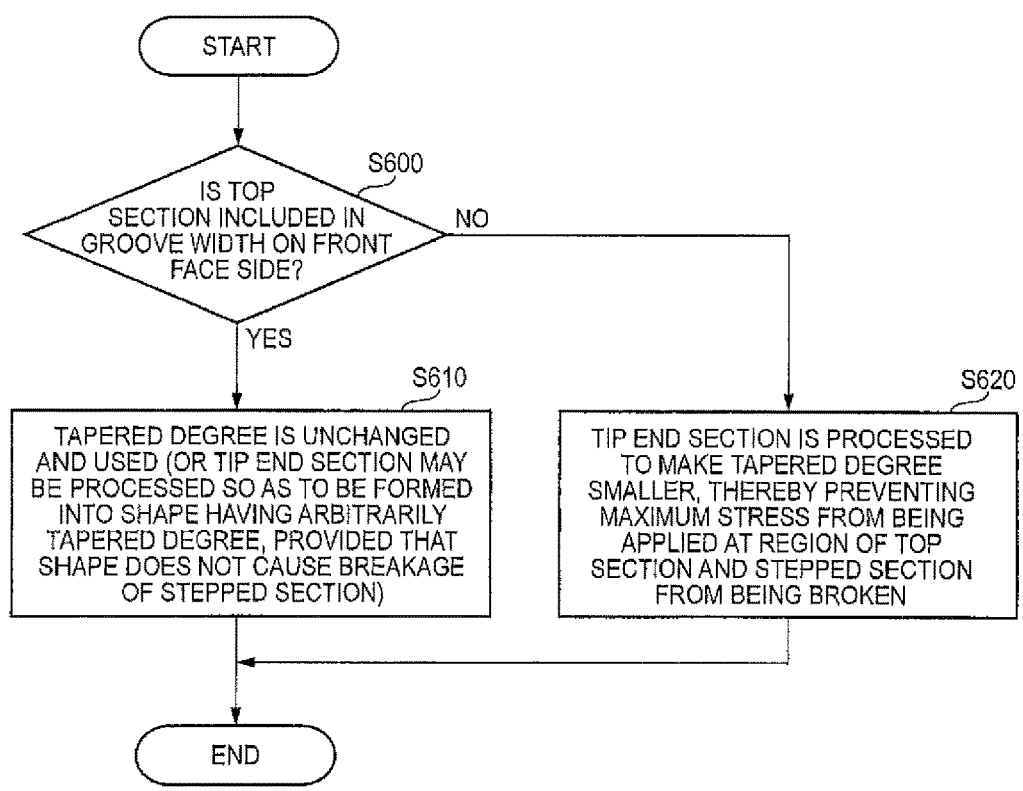
FIG. 22 is a flowchart illustrating a first processing method for processing the tip end shape of the dicing blade according to the Example of the present invention.

Accordingly, in the Example, in the case that this kind of dicing blade is to be mass-produced, the tip end shape of the dicing blade is processed preliminarily so that the breakage of the stepped section by the stress generated in the region of the top section is suppressed. FIG. 22 is a flowchart illustrating a first processing method according to the Example. First, a confirmation as to whether the variation range of the top section (the thickness direction center) of the dicing blade in the groove width direction is included in the groove width on the front face side is made (at S600). The variation range of the top section or the center of the thickness thereof is determined, for example, by manufacturing conditions including the positional accuracy of the manufacturing apparatus (dicing apparatus) to be used and the deformation degree (the amounts of the bending and warping) of the dicing blade. However, for the purpose of grasping the amounts of the bending and warping of the dicing blade, the amounts are required to be grasped through actual experiments or the like, and this requires time and effort. On the other hand, the positional accuracy of the manufacturing apparatus can be grasped relatively easily according to the specifications or the like described in catalogs or the like. Hence, in the case that it is difficult to grasp the amounts of the bending and warping, only the positional accuracy of the manufacturing apparatus may merely be considered. This confirmation is made by a person in charge of the processing of the tip end shape.

In the case that the variation range is included in the groove width, the flow advances to S610, and it is determined that a dicing blade having such a tapered tip end shape as one of those shown in FIGS. 21A to 21E is used without modification for mass production from the beginning. In the manufacturing conditions in which the top section of the dicing blade is included in the groove width, even if the dicing blade having the tapered tip end section is used continuously, the stress applied to the stepped section does not change abruptly, unlike the case in which the kerf width is very narrow (Sb=11.2) and the positional deviation amount Ds is large (Ds=7.5 μm) as shown in FIG. 13, whereby the breakage of the stepped section is suppressed. However, step S610 is not intended to completely prohibit the processing of the tip end shape of the tip end section of the dicing blade, but the tip end section may be processed so as to be formed into a shape having an arbitrarily tapered degree as necessary, provided that the shape does not cause the breakage of the stepped section.

On the other hand, in the case that the top section is not included in the groove width on the front face side, the flow advances to S620, and the tip end shape is processed so that the tapered degree of the tip end section of the dicing blade becomes smaller (so that the tapered degree is moderated). In other words, the tip end section is processed so as to have a tapered degree in which the maximum stress is not applied at the region of the top section of the dicing blade and the stepped section is not broken. If a dicing blade having a large tapered degree is used in the manufacturing conditions in which the top section becomes away from the groove width on the front face side, the rate of breakage of the stepped section becomes higher as the dicing is continued. On the other hand, in the case that the tapered degree of the tip end section is made smaller, the stress exerted by the top section is dispersed and no large stress is concentratedly applied to one point of the stepped section, whereby the possibility of the breakage of the stepped section becomes lower.

Next, a specific processing method for changing the tapered degree will be described below. Dicing blades are capable of cutting various kinds of substrates made of GaAs, sapphire, glass, silicon, etc. Such dicing blades include an electrocast blade in which, on the side face of a substrate made of aluminum or the like, diamond abrasive grains or the like are bonded by metal plating, a resinoid blade in which diamond abrasive grains or the like are bonded with a resin bond, and a metal blade in which diamond abrasive grains or the like are baked and solidified using a metal bond. The configuration of such a dicing blade is determined depending on the type of the substrate to be cut. When the dicing blade is used repeatedly for cutting, its tip end section wears gradually and changes to a shape not suited for cutting in some cases. For example, the tip end section thereof becomes tapered excessively or wears unevenly, thereby being formed into an unexpected shape in some cases. In such a case, the reprocessing (dressing) of the tip end section of the dicing blade is known as a method of returning the tip end shape of the dicing blade to a desired shape. In the Example, such a technology for reprocessing the tip end section having been deformed as described above is used to process the tip end shape of the dicing blade in which the maximum stress is applied at the region of the top section.

Figure 23A:
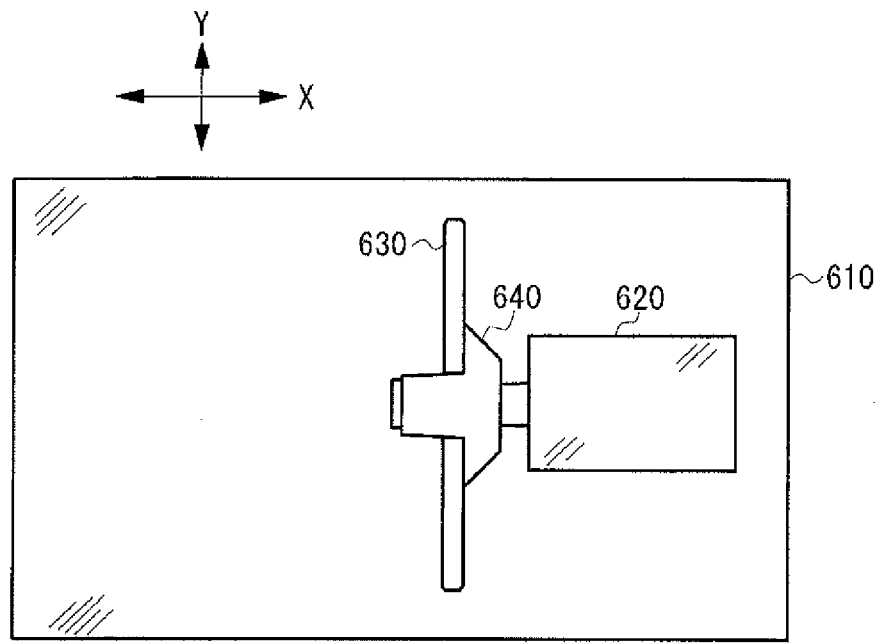
FIG. 23A is a schematic plan view showing an example of a processing apparatus that is used for processing the tip end shape of the dicing blade and is applicable to the Example of the present invention.
Figure 23B:
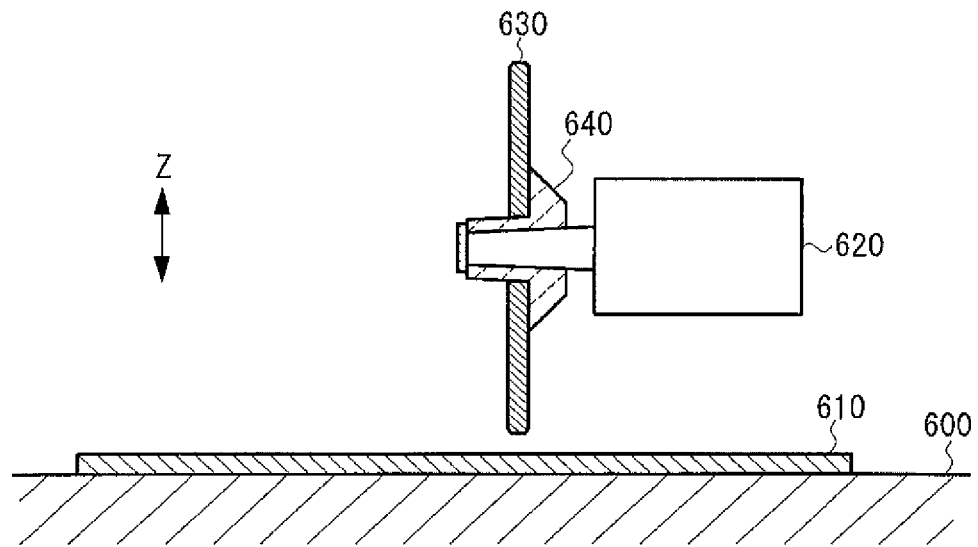
FIG. 23B is a schematic cross-sectional view showing the processing apparatus.

FIGS. 23A and 23B show an example of a typical processing apparatus for processing the tip end section of dicing blade. FIG. 23A is a schematic plan view thereof, and FIG. 23B is a schematic cross-sectional view thereof. The processing apparatus has a shaping board 610 for processing the tip end shape of the dicing blade mounted on a flat supporting base 600, a motor 620 being movable above the shaping board 610 in three-dimensional directions, and a chuck 640 for detachably installing a dicing blade 630 on the rotation shaft of the motor 620.

The shaping board 610 is the so-called dress board for processing the tip end shape of the dicing blade and is made of a material suited for the processing of the dicing blade. For example, the shaping board 610 is made using a bond harder than that of the dicing blade and is formed of abrasive grains larger than those of the dicing blade. The motor 620 is movable in the X, Y and Z directions by a drive mechanism, not shown. Hence, the dicing blade 630 fixed to the motor 620 is positioned on the shaping board 610 and cuts the shaping board 610 when the motor 620 is moved in the Z direction.

In the case that the tapered degree of the tip end section of the dicing blade 630 is made smaller, first, such a dicing blade as shown in one of FIGS. 21A to 21E is installed on the rotation shaft of the motor 620. Next, the dicing blade 630 is positioned on the shaping board 610 by moving the motor 620 in the X and Y directions, and the motor 620 is rotated at a constant speed. Next, the motor 620 is lowered in the Z direction so that the dicing blade 630 cuts the shaping board 610 at a constant depth of cutting. The depth of cutting is, for example, approximately several μm. Then, the motor 620 is moved in the X direction (in a direction parallel to the rotation shaft of the motor 620), and the motor 620 is further lowered in the Z direction, thereby making the dicing blade 630 to perform cutting at a depth of cutting of several μm. The tapered degree of the tip end section of the dicing blade 630 is made smaller by repeating the cutting in the Z and X directions as described above.

Figure 24A:
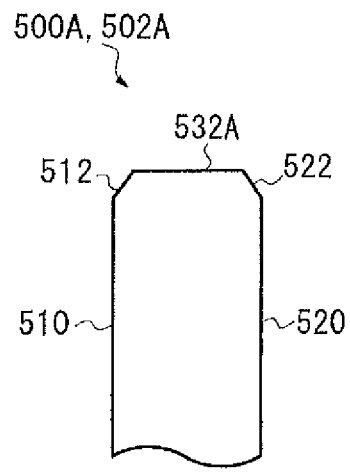
FIGS. 24A, 24B and 24C are views showing examples in which the top sections of the dicing blades shown in FIGS. 21A, 21B, 21C, 21D and 21E are processed so that the tapered degrees thereof are made smaller.
Figure 24B:
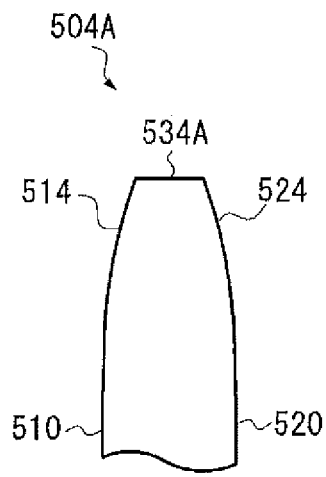
Figure 24C:
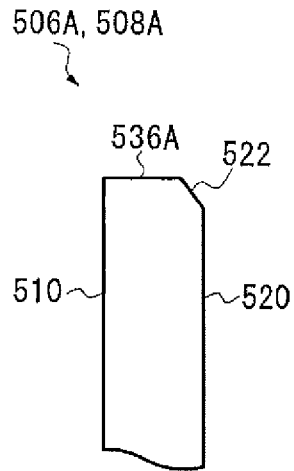

The states of the tip end sections of the dicing blades shown in FIGS. 21A to 21E after they have been processed so that the tapered degrees thereof are made smaller are shown in FIGS. 24A to 24C. The dicing blades 500A and 502A shown in FIG. 24A respectively correspond to the dicing blades 500 and 502 shown in FIGS. 21A and 21B. At the tip end section of each of the dicing blades 500A and 502A, inclined faces 512 and 522 are formed and a flat face (top face) 532A is formed between the inclined faces by making the tapered degree of the tip end section smaller. When the tapered degree is made further smaller, the inclined faces 512 and 522 are removed, and the tip end shape can be formed into such a nearly rectangular shape as shown in FIG. 5G. The dicing blade 504A shown in FIG. 24B corresponds to the dicing blade 504 shown in FIG. 21C. A flat face 534A is formed between the inclined faces 514 and 524 by making the tapered degree of the tip end section smaller. The dicing blades 506A and 508A shown in FIG. 24C respectively correspond to the dicing blades 506 and 508 shown in FIGS. 21D and 21E. A flat face 536A is formed at the top section by making the tapered degree of the tip end section smaller.

The shapes shown in FIGS. 24A to 24C are examples of the shapes in which the tapered degrees of the tip end sections are made smaller, but the shapes are not limited to these shapes. For example, the tapered degree can be changed by appropriately adjusting the widths of the flat faces 532A, 534A and 536A, the distance between the inclined faces 512 and 522, etc, depending on the material of the shaping board 610 and processing conditions (the depth of cutting in the Z direction, the number of cutting times in the X direction, the setting angle of the shaping board, etc.). Furthermore, if the tapered degree of the tip end section is made too small (that is, the shape of the tip end section is formed into a shape excessively close to a rectangular shape), the maximum stress is generated in the root region of the stepped section although the maximum stress is not generated in the region of the top section, and the stress may cause breakage at the root region of the stepped section in some cases. In such a case, the tapered degree may merely be made smaller to the extent that breakage does not occur at the root region of the stepped section. For example, after the tip end section is formed into the shape shown in one of FIGS. 24A to 24C, the tip end section may further be formed into such a shape having such a curved face as shown in FIG. 5B by using the semiconductor substrate for processing the tip end section described previously. Moreover, the tip end section may be formed into a desired shape by using only the semiconductor substrate for processing of the tip end section, instead of using the processing method described referring to FIGS. 23A and 23B.

In the case that the dicing blade having a tapered degree in which the maximum stress is applied at the region of the top section is used for mass production, the dicing blade in which the rate of breakage of the stepped section is suppressed so as to be suited for mass production can be obtained by making the tapered degree of the tip end section smaller as necessary. In the above-mentioned first processing method, the conditional branch step at S600 in FIG. 22 may be a judgment step in which a person in charge of the processing of the tip end shape actually makes a "Yes" or "No" judgment or may be a simple conditional branch in which the person in charge of the processing of the tip end shape does not make any judgment. In other words, in each conditional branch, the "Yes" or "No" judgment may be a judgment as to whether the condition in the branch has been satisfied eventually, and the judgment by the person in charge of the processing of the tip end shape is not always required.

Figure 25:
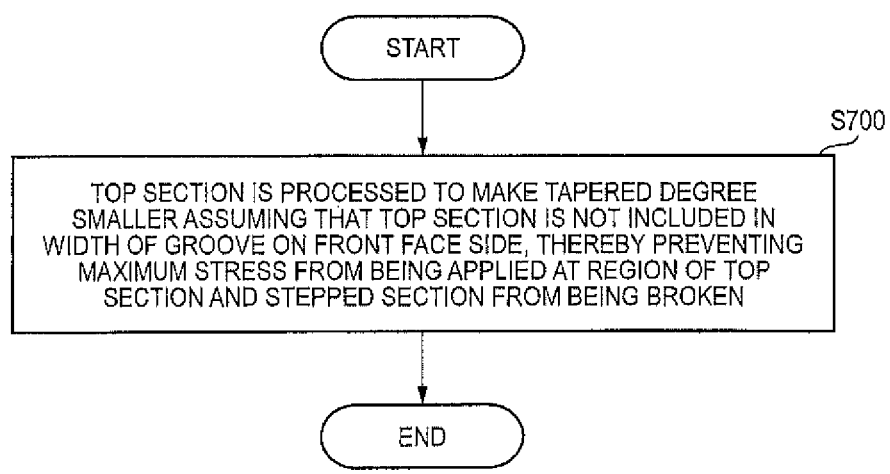
FIG. 25 is a flowchart illustrating a second processing method for processing the tip end shape of the dicing blade according to the Example of the present invention.

Next, in a dicing blade having a tapered degree in which the maximum stress is applied at the region of the top section of the dicing blade and in the case that it is assumed that the top section (the thickness direction center) thereof becomes away from the width of the groove 140 on the front face side of the semiconductor substrate, a second processing method in the case that the dicing blade having a tapered degree in which the stepped section is broken by the maximum stress is used will be described below. FIG. 25 is a flowchart illustrating the second processing method. Unlike the case of the first processing method, in the second processing method, it is assumed that the top section is not included in the groove width on the front face side regardless of whether the top section (the thickness direction center) of the dicing blade is included in the groove width on the front face side, and the top section is processed so that the tapered degree becomes smaller, whereby the tapered degree in which the maximum stress is not provided at the region of the top section and the stepped section is not broken is obtained (at S700), and this method is used for mass production. As an example, in the case that a dicing blade having such a tip end shape as shown in one of FIGS. 21A to 21E is used, the tip end section is formed into a shape having such a curved face as shown in FIG. 5B, for example, by using a method similar to the first processing method, and the dicing blade is used for a mass-production process. As described above, with the second processing method, the confirmation as to whether the top section (the thickness direction center) of the dicing blade is included in the groove width on the front face side is not required.

In the above-mentioned first and second processing methods, in the case that the tip end sections of dicing blades acquired from other entities have been tapered, an example in which the tip end shape of the dicing blade is processed so that the shape is suited for mass production has been described above. However, the first and second processing methods are not limited to the example but can also be applied to the processing for making the tapered degree smaller again in the case that the tapered degree of the tip end section becomes large as the dicing blade is used continuously. In that case, for example, the above-mentioned processing methods may merely be applied at the timing of replacing the dicing blade as described below. Furthermore, the processing steps may not be performed in-house but may be performed by other entities.

F) Example Relating to the Replacement of the Blade

Figure 26:
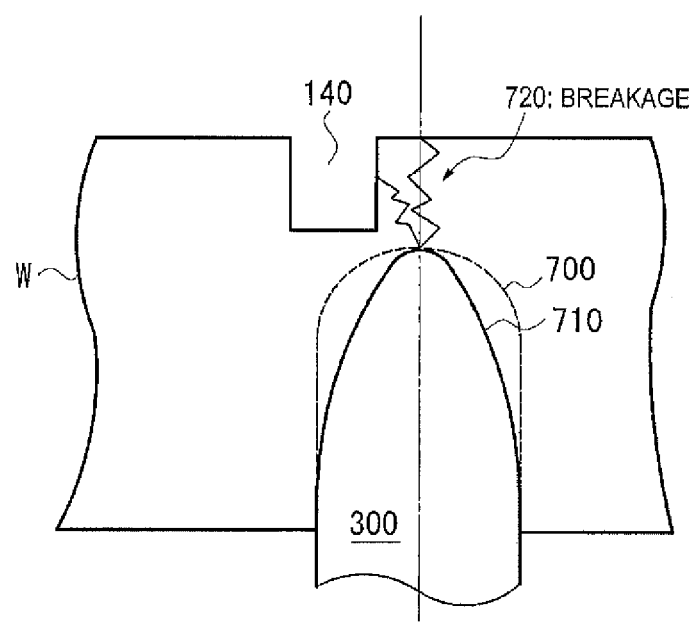
FIG. 26 is a cross-sectional view illustrating the relationship between the wear of the tip end section of the dicing blade and the breakage of the stepped section.

Next, the replacement timing of the dicing blade will be described below. When the dicing blade is used continuously, it wears gradually and its tip end is formed into a tapered shape as shown in FIG. 26. Even in the case that the tip end wears into such a tapered shape, in the manufacturing conditions in which the top section at the tip end of the dicing blade does not become away from the width of the groove 140 on the front face side of the semiconductor substrate, the breakage of the stepped section is suppressed even if the worn dicing blade is used continuously, as understood from the results of the simulation shown in FIG. 13. However, in the case of the manufacturing conditions regarding positional accuracy in which the top section at the tip end of the dicing blade becomes away from the width of the groove on the front face side of the semiconductor substrate, the rate of breakage of the stepped section becomes higher as the dicing is performed continuously.

The broken line 700 in the figure indicates an example of the initial shape of the dicing blade 300 according to the Example, and the solid line 710 in the figure indicates the tapered shape of the worn dicing blade 300. In the case of the shape 700 of the dicing blade 300, the stress is dispersed by the curved face of the tip end section even in the case that the top section of the dicing blade 300 becomes away from the width of the groove 140 on the front face side of the semiconductor substrate W due to variation in manufacturing and the like. Hence, a large stress is not concentratedly applied to one point of the stepped section, and the possibility of the breakage of the stepped section is low. On the other hand, in the case of the shape 710 of the worn dicing blade, the tip end section is tapered although the tip end section has a curved face. Hence, the stress is liable to be concentratedly applied to one point of the stepped section, and breakage 720 is liable to occur at the stepped section around the portion.

Therefore, in the Example, before the tip end section is formed into a tapered shape in which the maximum stress is applied at the region of the top section and the stepped section is broken due to the wear of the dicing blade, the use of the dicing blade is stopped and the dicing blade is replaced with a new one. In other words, in the case that the stress applied to the stepped section at the time of dicing reaches a predetermined stress due to the wear of the dicing blade, the dicing blade is replaced with a new one even before the life of the dicing blade expires. As an example, in the manufacturing conditions regarding positional accuracy in which the top section at the tip end of the dicing blade becomes away from the width of the groove on the front face side of the semiconductor substrate, the dicing blade is replaced at the above-mentioned timing that is different from the expiration of the life of the dicing blade. In the ordinary full dicing, in the state in which the tip end section is tapered due to wear, breakage, such as chipping, may occur, for example, due to the vibration at the time of dicing and the impact generated at the time when the dicing blade passes through the semiconductor substrate. Hence, in the ordinary full dicing, the timing is grasped experimentally and empirically, the expiration of the life of the dicing blade is determined, and the dicing blade is replaced on the basis of the life. On the other hand, in the Example, the dicing blade is replaced even before the expiration of the life of the dicing blade determined on the basis of breakage, such as chipping.

Furthermore, for the judgment as to whether the tip end shape has reached a predetermined tapered shape and for the judgment as to whether the stress has reached a predetermined stress, the relationship between the degree of breakage (breakage rate or the like) allowable in a mass-production process and the shape of the tip end section and the relationship between the degree of breakage and the stress are grasped, and the manufacturing conditions (the number of the dicing blades to be used) including, for example, the total dicing time, the total distance of the dicing and the total number of semiconductor substrates to be subjected to the dicing and required until the above-mentioned shape of the tip end section and the above-mentioned stress are reached are obtained beforehand, through preliminary experiments, simulations, etc. Then, in a mass-production process, in the case that the manufacturing conditions indicating the degrees of wear of these dicing blades have reached the predetermined conditions, it may merely be judged that the tip end shape has reached the predetermined tapered shape and that the stress has reached the predetermined stress.

Moreover, without grasping the specific shape of the tip end section and the specific stress corresponding to the breakage rate allowable in a mass-production process through preliminary experiments, simulations, etc., the relationship between the manufacturing conditions representing the degree of wear, such as the total time, the total distance and the total number of substrates in the dicing, and the state of breakage may be obtained through experiments, and the timing of the replacement may be judged on the basis of the obtained relationship. What's more, as another method, the judgment as to whether the predetermined tapered shape has been reached may be made while the actual tip end shape is measured in the middle of a mass-production process. In this case, the judgment may merely be made by measuring the thickness at a predetermined distance from the top section of the dicing blade, the angle of the tip end section, etc.

In the case that the manufacturing conditions in which the top section at the tip end of the dicing blade does not become away from the width of the groove on the front face side of the semiconductor substrate are selected or in the case that the thickness of the stepped section that is not broken even if the top section becomes away from the width is selected, the breakage of the stepped section is further suppressed. In this case, the dicing blade may merely be replaced on the basis of the life of the dicing blade. Still further, in order that the top section of the dicing blade does not become away from the width of the groove on the front face side, the relationship between the manufacturing conditions having influence on the variation range of the dicing blade in the groove width direction and the width of the groove on the front face side of the semiconductor substrate may merely be selected so that the combination of the manufacturing conditions and the width of the groove in which the dicing blade does not become away from the width of the groove is obtained. For example, in the case that the accuracy of the manufacturing apparatus is low, the width of the groove on the front face side of the semiconductor substrate may merely be made wider, and in the case that the accuracy of the manufacturing apparatus is high, the width of the groove may merely be made narrower according to the accuracy.

Beside, in the case that it is unknown whether the manufacturing conditions to be used are the manufacturing conditions in which the top section becomes away from the width of the groove, it may be assumed that the manufacturing conditions to be used are the manufacturing conditions in which the top section becomes away from the width of the groove, and the dicing blade may be replaced regardless of the life of the dicing blade. In other words, before the tapered degree reaches the range of the tapered degrees in which the maximum stress is applied at the region of the top section and the stepped section is broken, the use of the dicing blade may be stopped and the dicing blade may be replaced with a new one.

Next, the timing of the replacement in the case that the top section at the tip end of the dicing blade becomes away from the width of the groove on the front face side as the wear of the dicing blade advances will be described below. It is assumed that the top section of the dicing blade becomes away from the width of the groove on the front face side in two cases. In a first case, the top section is away from the width at the start time of the use of the dicing blade. In a second case, the state of the top section of the dicing blade changes from a state in which the top section is not away from the width to a state in which the top section is away from the width as the wear of the dicing blade advances. The former case corresponds to a case in which the range of the positional accuracy is away from the groove width on the front face side at the start time of the use of the dicing blade because the positional accuracy of the manufacturing apparatus is low or the groove width on the front face side is narrow, for example. The latter case corresponds to a case in which the top section becomes away from the width of the groove on the front face side in the middle of the use of the dicing blade because the thickness of the dicing blade becomes thinner as the wear of the dicing blade advances, whereby the strength of the dicing blade becomes weaker and the warping amount of the dicing blade becomes larger gradually due to the stress at the time of the cutting.

Hence, in the case that the state changes from the state in which the top section is not away from the width to the state in which the top section is away from the width as the wear of the dicing blade advances, the use of the dicing blade may be stopped and the dicing blade may be replaced with a new one before the top section becomes away from the width. In this case, the use of the dicing blade may be stopped under the condition that the shape of the tip end section of the dicing blade has been formed into the tapered shape in which the maximum stress is applied at the region of the top section and the stepped section is broken, or the use of the dicing blade may be stopped before the top section becomes away from the width, regardless of the shape of the tip end section of the dicing blade. The timing of the change of the state from the state in which the top section is not away from the width to the state in which the top section is away from the width may merely be preliminarily obtained on the basis of, for example, the relationship between the use frequency of the dicing blade and the breakage rate at the periphery around the groove on the front face side. At the time, a confirmation as to whether the top section of the dicing blade is actually away from the width of the groove on the front face side may be made. The "periphery" of the groove on the front face side in the Example is a range in which the stress is received from the dicing blade directly or indirectly.

In the method of manufacturing semiconductor chips according to the Example, even though the stepped section is in a state of not being broken at the start time of the use of the dicing blade, the stepped section becomes a state of being broken due to the wear of the dicing blade in some cases as described above. In such a case, for some time after the start of the use of the dicing blade, the rate of breakage of semiconductor chips is stable and falls into a constant range because the breakage of the semiconductor chips occurs because of only factors other than the wear of the dicing blade. However, when the same dicing blade is used continuously, the tapered degree reaches the range of the tapered degrees in which the stepped section is broken or the top section becomes away from the groove width on the front face side, whereby the rate of breakage rises gradually. Then, the rate of breakage may finally reach the rate of breakage unallowable in a mass-production process.

Hence, in consideration of the change in the rate of breakage described above, as the timing of the replacement of the dicing blade, the dicing blade may be replaced, for example, before the rate of breakage of the semiconductor chips (the rate of breakage of the stepped section) starts rising, or the dicing blade may be replaced after the rate of breakage of the semiconductor chips starts rising and before the rate of breakage reaches the rate of breakage unallowable in a mass-production process.

The explanation concerning the replacement of the blade has been given above, and the explanation is summarized as described below. That is to say, as a first mode concerning the replacement of the blade, a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the thickness direction center of the tip end section of the cutting member in the groove width direction becomes away from the groove on the front face side and the periphery of the groove on the front face side is broken by the stress from the region of the top section of the cutting member that has been tapered due to wear, the use of the cutting member may be stopped and the cutting member may be replaced with a new one before the tip end shape of the cutting member is formed into a tapered shape in which the periphery of the groove on the front face side is broken due to wear.

As a second mode, a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the thickness direction center of the tip end section of the cutting member becomes away from the groove on the front face side and the periphery of the groove on the front face side is broken by the stress from the region of the top section of the cutting member that has been tapered due to wear, the use of the cutting member may be stopped and the cutting member may be replaced with a new one before the rate of breakage of the periphery of the groove on the front face side starts rising as the wear of the cutting member advances.

As a third mode, a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the thickness direction center position of the tip end section of the cutting member becomes away from the groove on the front face side and the periphery of the groove on the front face side is broken by the stress from the region of the top section of the cutting member that has been tapered due to wear, the use of the cutting member may be stopped and the cutting member may be replaced with a new one after the rate of breakage of the periphery of the groove on the front face side starts rising as the wear of the cutting member advances and before the rate of breakage reaches the rate of breakage unallowable in a mass-production process. It is herein assumed that the rate of breakage of the semiconductor chips rises in the middle of manufacturing due to the wear of the dicing blade mainly in two cases. In a first case, the tip end shape having a tapered degree in which the stepped section is not broken is formed into a shape having a tapered degree in which the stepped section is broken as the wear of the dicing blade advances in the case that the center (top section) of the thickness of the dicing blade may become away from the width of the groove on the front face side from the early stage of the use of the dicing blade, for example, in the case that the groove width on the front face side is narrow or the positional accuracy of the dicing apparatus is low. In a second case, the amounts of warping and bending of the dicing blade increase and the state of the dicing blade changes from a state in which the center (top section) of the thickness of the dicing blade is not away from the width of the groove on the front face side to a state in which the center of the thickness is away from the width as the wear of the dicing blade advances. The second mode and the third mode are based on these findings.

As a fourth mode, a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the rate of breakage of the periphery of the groove on the front face side rises due to the wear of the cutting member as the wear of the cutting member advances, the use of the cutting member may be stopped before the rate of breakage reaches the rate of breakage unallowable in a mass-production process.

As a fifth mode, the use of the cutting member may be stopped and the cutting member may be replaced with a new one after the rate of breakage starts rising and before the rate of breakage reaches the rate of breakage unallowable in a mass-production process in the fourth mode.

As a sixth mode, the use of the cutting member may be stopped and the cutting member may be replaced with a new one before the tip end shape of the cutting member is formed into a tapered shape in which the maximum stress is applied at the region of the top section and the periphery of the groove on the front face side is broken as the wear of the cutting member advances in the fourth and fifth modes.

As a seventh mode, the use of the cutting member may be stopped and the cutting member may be replaced with a new one before the variation range of the thickness direction center of the tip end section of the cutting member in the groove width direction changes from the range included in the groove on the front face side to the range away from the groove on the front face side as the wear of the cutting member advances in the fourth and fifth modes.

As an eighth mode, the use of the cutting member may be stopped and the cutting member may be replaced with a new one before the variation range of the top section of the cutting member having no top face in the groove width direction changes from the range included in the groove on the front face side to the range away from the groove on the front face side as the wear of the cutting member advances in the fourth and fifth modes.

As a ninth mode, a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the thickness direction center of the tip end section of the cutting member in the groove width direction changes from the range included in the groove on the front face side to the range away from the groove on the front face side as the wear of the cutting member advances, the use of the cutting member may be stopped and the cutting member may be replaced with a new one before the variation range changes from the range included in the groove on the front face side to the range away from the groove on the front face side.

As a tenth mode, a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the top section of the cutting member having no top face in the groove width direction changes from the range included in the groove on the front face side to the range away from the groove on the front face side as the wear of the cutting member advances, the use of the cutting member may be stopped and the cutting member may be replaced with a new one before the variation range changes from the range included in the groove on the front face side to the range away from the groove on the front face side.

As an 11th mode, a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the thickness direction center of the tip end section of the cutting member in the groove width direction changes from the range included in the groove on the front face side to the range away from the groove on the front face side as the wear of the cutting member advances, the use of the cutting member may be stopped and the cutting member may be replaced with a new one before the tip end section of the cutting member having a tapered shape and having no top face at the top section is formed into a tapered shape in which the maximum stress is applied at the region of the top section and the stepped section is broken.

As a 12th mode, a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the top section of the cutting member having a tapered tip end shape and having no top face in the groove width direction changes from the range included in the groove on the front face side to the range away from the groove on the front face side as the wear of the cutting member advances, the use of the cutting member may be stopped and the cutting member may be replaced with a new one before the tip end shape of the cutting member is formed into a tapered shape in which the maximum stress is applied at the region of the top section and the stepped section is broken. With the 12th mode, the use of the dicing blade is stopped, for example, before the top section of the dicing blade having such a tapered tip end section having no top face as shown in FIG. 5B is worn and is formed into a tapered shape in which the maximum stress is applied at the region of the top section as shown in FIG. 14 and the stepped section is broken.

As a 13th mode, in the first to 12th modes, the use of the cutting member may be stopped and the cutting member may be replaced with a new one on the basis of the relationship between the use amount of the cutting member and the rate of breakage at the periphery of the groove on the front face side as a predetermined relationship. In other words, the change in the rate of breakage at the periphery of the groove on the front face side due to the change in the use amount of the cutting member may be preliminarily obtained, and the timing of stopping the use of the cutting member may be determined by using the obtained relationship. The "rate of breakage" is the ratio of the amount of broken products to the production amount of semiconductor chips obtained in the case that it is assumed that no breakage occurs. In the Example, the rate of breakage includes not only the rate of breakage itself but also other characteristics that change in proportion to the rate of breakage and change indirectly in synchronization with the rate of breakage.

In the above-mentioned first to third modes, "the manufacturing conditions in which the periphery of the groove on the front face side is broken" represent manufacturing conditions in which the periphery of the groove on the front face side can be broken before the life of the dicing blade expires (before breakage, such as chipping, occurs) in the case that it is assumed that the cutting member, such as the dicing blade, is used continuously. Furthermore, in the above-mentioned eighth to 12th modes, "the manufacturing conditions in which the variation range changes from the range included in the groove on the front face side to the range away from the groove on the front face side" represent manufacturing conditions in which the variation range becomes away from the groove on the front face side before the life of the dicing blade expires (before breakage, such as chipping, occurs) in the case that it is assumed that the cutting member, such as the dicing blade, is used continuously.

G) Example Concerning a Treatment for Thinning a Substrate

Next, a treatment for thinning a semiconductor substrate will be described below. Unlike the case of the general full dicing, in the case of the above-mentioned dicing method according to the Example, the stress applied to the stepped section varies significantly in some cases even if the position of the top section of the dicing blade deviates by only approximately 1.2 µm in the groove width direction. For example, when the groove on the back face side is formed, as the thickness of the substrate is thicker, the stress from the substrate during dicing becomes larger, the dicing blade is liable to be deformed, for example, warped, and the position of the tip end section of the dicing blade deviates in the groove width direction, whereby the stress applied to the stepped section becomes larger.

Hence, a thinning treatment for making the thickness of the substrate thinner may be performed before the groove on the back face side is formed to lower the stress applied to the stepped section. As an example of the treatment, back grinding is performed to make the thickness of the substrate thinner as a whole in the direction from the back face to the front face of the substrate at any step before step S110 in FIG. 1. In the back grinding, the substrate is disposed so that its back face can be seen as in the case of the half-dicing according to the Example described earlier, and, for example, a rotating grinder is moved in the horizontal and vertical directions, whereby the thickness of the substrate is made thinner as a whole until the fine grooves on the front face side are exposed. In the case that the strength of the substrate becomes a problem after the back grinding, the substrate may be fainted into the so-called rib-structured substrate by not grinding only the periphery of the substrate.

As described earlier, the stress applied to the stepped section changes significantly in the case that the variation range of the top section (the center of the thickness) of the dicing blade in the groove width direction becomes away from the groove on the front face side. Hence, in manufacturing conditions in which the variation range of the thickness direction center of the tip end section of the dicing blade in the groove width direction becomes away from the width of the groove on the front face side in the case that it is assumed that the groove on the back face side has been formed without performing the back grinding, the back grinding may merely be performed. Furthermore, the substrate may merely be made thinner by the back grinding to the thickness in which the variation range of the top section (the center of the thickness) of the dicing blade in the groove width direction is included in the width of the groove on the front face side.

The Example described above can be summarized and described as follows. That is to say, the Example is a method of manufacturing semiconductor chips in which a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the thickness direction center of the tip end section of the cutting member in the groove width direction becomes away from the groove on the front face side in the case that it is assumed that the groove on the back face side is fainted without performing the treatment for making the thickness of the substrate thinner, the treatment for making the thickness of the substrate thinner is performed so that the range is included in the width on the front face side before the groove on the back face side is formed.

The Example can also be described as follows. That is to say, the Example is a method of manufacturing semiconductor chips in which a step of forming grooves on the front face side of a substrate and a step of forming grooves on the back face side communicating with the grooves on the front face side using a rotating cutting member having a thickness thicker than the width of the inlet portions of the grooves on the front face side from the back face side of the substrate and dicing the substrate into semiconductor chips are provided, and in manufacturing conditions in which the variation range of the top section of the tapered cutting member having no top face in the groove width direction becomes away from the groove on the front face side in the case that it is assumed that the groove on the back face side is formed without performing the treatment for making the thickness of the substrate thinner, the treatment for making the thickness of the substrate thinner is performed so that the range is included in the width on the front face side before the groove on the back face side is formed.

In the case that the thinning treatment according to the Example is performed as described above, the breakage of the stepped section is suppressed in comparison with the case in which the thinning treatment is not performed. In the thinning treatment according to the Example, in a state in which the thinning treatment is not performed, a confirmation as to whether the top section or the center of the thickness of the dicing blade deviates from the groove width on the front face side may be made, and the thinning treatment may be performed only in the case that the top section deviates, or the substrate may be made thinner to a desired thickness by preliminarily grasping the thickness of the substrate in which no deviation occurs and without making the confirmation as to whether the deviation occurs in the state in which the thinning treatment is not performed. In other words, the state in which the top section or the center of the thickness of the dicing blade deviates from the groove width on the front face side in the case that the thinning treatment is not performed may merely be changed eventually to the state in which the top section or the center does not deviate from the groove width on the front face side by performing the thinning treatment. Furthermore, the timing for performing the thinning treatment may be any time before the groove on the back face side is formed. For example, in FIG. 1, the thinning treatment may be performed before the light-emitting elements are formed or may be performed after the light-emitting elements are formed and before fine grooves are formed.

H) Modification of the Fine Grooves on the Front Face Side

Next, a modification of the fine grooves that are formed on the back face side of the substrate will be described below. Although the fine groove 140 shown in FIG. 2D is formed into a straight groove having side faces extending from the front face of the substrate in a nearly vertical direction by anisotropic dry etching, the fine groove may be formed into other shapes.

FIGS. 27A to 27D show other configuration examples of the fine grooves according to this Example. These grooves are formed such that the lower sides thereof become wider, whereby the stepped sections thereof hardly receive stress even if the position of the top section of the dicing blade varies in the groove width direction. The fine groove 800 shown in FIG. 27A has a first groove portion 810 including linear side faces forming a nearly uniform width Sa1 and a depth D1 and also has a second groove portion 820 having spherical side faces with a depth D2 and a bottom face, the second groove portion 820 being connected to the lower portion of the first groove portion 810. The width Sa2 of the second groove portion 820 is the inside diameter between the side walls opposed to each other in a direction parallel to the front face of the substrate, and a relationship of Sa2>Sa1 is established. In the example shown in the figure, the width Sa2 has the maximum value in the vicinity of the center of the second groove portion 820.

Figure 27A:
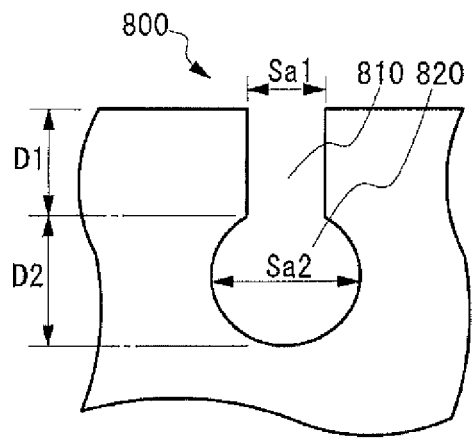
FIGS. 27A, 27B, 27C and 27D are cross-sectional views showing typical configurations of fine grooves according to the Example of the present invention.
Figure 27B:
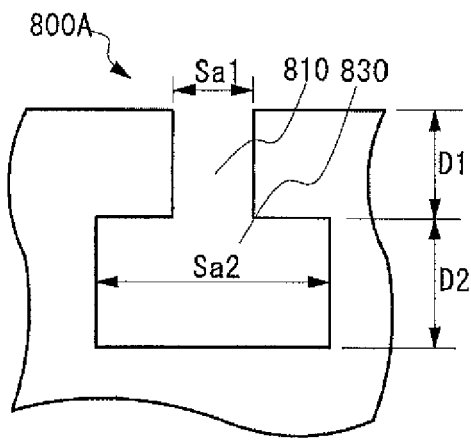

The fine groove 800A shown in FIG. 27B has a first groove portion 810 including linear side faces forming a nearly uniform width Sa1 and a depth D1 and also has a rectangular second groove portion 830 having nearly linear side faces with a depth D2, the second groove portion 830 being connected to the lower portion of the first groove portion 810. The second groove portion 830 is obtained by changing the spherical side faces and the spherical bottom face of the second groove portion 820 shown in FIG. 27A into linear shapes. The width Sa2 of the second groove portion 830 is the distance between the side walls opposed to each other in a direction parallel to the front face of the substrate, and the distance is nearly constant (Sa2>Sa1). The shape of the second groove portion shown here is taken as an example, and the shape of the second groove portion may merely be a shape having a width larger than the width Sa1 of the first groove portion. For example, the shape may merely be an intermediate shape between the second groove portion 820 shown in FIG. 27A and the second groove portion 830 shown in FIG. 27B, that is, the shape may merely be an oval shape. Furthermore, the second groove portion may merely have a shape having a space wider than the width (the width of the groove at the depth D1) of the groove at the boundary portion between the first groove portion and the second groove portion.

Figure 27C:
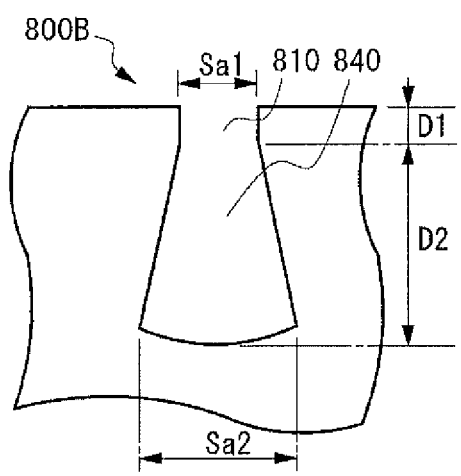

The fine groove 800B shown in FIG. 27C has a first groove portion 810 having side faces forming a nearly uniform width Sa1 and a depth D1 and also has a second groove portion 840 having a reversely tapered shape with a depth D2, the second groove portion 840 being connected to the lower portion of the first groove portion 810. The side faces of the second groove portion 840 are inclined so that the width therebetween increases gradually toward the bottom section. The width Sa2 of the second groove portion 840 is the distance between the side faces opposed to each other in a direction parallel to the front face of the substrate, and the distance has the maximum value in the vicinity of the lowest section (in the vicinity of the lower end) of the second groove portion 840.

Figure 27D:
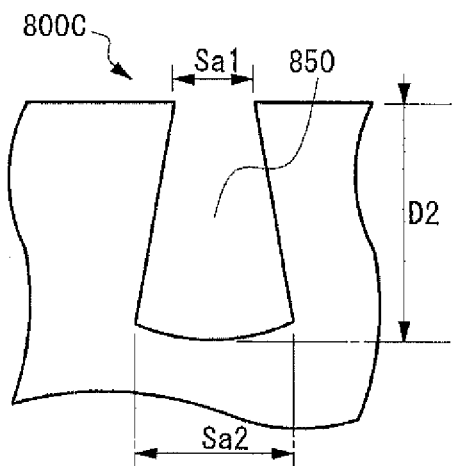

The fine groove 800C shown in FIG. 27D has a shape, the width of which increases gradually from the opening width Sa1 on the front face of the substrate to the width Sa2 in the vicinity of the lowest section. In other words, the fine groove 800C is a reversely tapered groove having a depth D2. The fine groove 800C is obtained by making the depth D1 of the first groove portion 810 shown in FIG. 27C as small as possible. In the shapes shown in FIGS. 27A to 27C, the angles of the side faces of the first groove portion and the second groove portion are changed at the boundary between the first groove portion and the second groove portion. However, in the shape shown in FIG. 27D, the angles of the side faces are unchanged, and the width of the lower section of the groove is wider than that of the upper section, whereby the fine groove has a first groove portion (upper section) and a second groove portion (lower section) that is wider than a first groove portion.

As the shape of the first groove portion, such vertical shapes as shown in FIGS. 27A to 27C are more favorable than such a shape (reversely tapered shape) becoming gradually wider in width from the front face to the back face of the substrate as shown in FIG. 27D in order to suppress the remaining of the adhesive layer of the dicing tape 160 generated when the dicing tape is removed. This is based on the following reasons. In the case of the groove having the reversely tapered shape, ultraviolet rays are difficult to be transmitted to the adhesive layer that has deeply entered the groove, and the adhesive layer is difficult to be hardened. Even if the adhesive layer is hardened, stress is liable to be applied to the root portion of the adhesive layer that has deeply entered the groove and the adhesive layer is liable to be torn to pieces at the time of removal in comparison with the case of the grooves having the vertical shapes.

Furthermore, from the viewpoint of suppressing the remaining of the adhesive layer, it is preferable that the shape of the side faces of the first groove portion should be a shape (forward tapered shape) in which the width becomes gradually narrower from the front face to the back face of the substrate, rather than the vertical shapes shown in FIGS. 27A to 27C. In other words, it is preferable that the shape of the first groove portion should be a shape not having a portion (reversely tapered shape) in which the width becomes wider from the front face to the back face of the substrate.

The fine groove 800, 800A, 800B and 800C shown in FIGS. 27A to 27D are preferably configured so as to be linearly symmetrical with respect to the center line orthogonal to the substrate. Moreover, the fine grooves shown in FIGS. 27A to 27D are drawn using straight lines and curved faces for easy understanding of the characteristics of the fine grooves. However, it should be noted that the side faces of the fine grooves to be formed actually may have steps or concave and convex portions and that the corners are not necessarily formed into angular shapes in a strict sense but can be formed into curved faces. What's more, the fine grooves shown in FIGS. 27A to 27D are just examples and may have other shapes, provided that the second groove portion wider than the first groove portion is formed below the first groove portion so as to communicate therewith. For example, the respective shapes shown in FIGS. 27A to 27D may be combined, or the shapes may be combined and then further modified. Still further, the angles of the forward/reverse mesa shapes shown in FIGS. 27C and 27D are also just examples. The shape may merely have faces inclined with respect to the face vertical to the face of the substrate, and the degree of the inclination does not matter.

Figure 28:
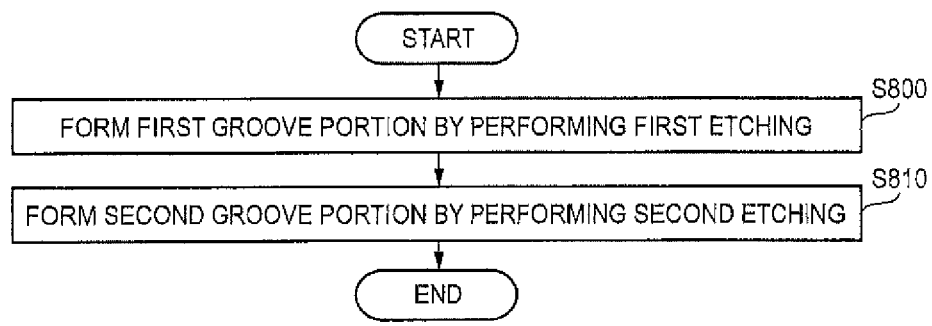
FIG. 28 is a flowchart illustrating a manufacturing method of forming the fine grooves according to the Example of the present invention.

Next, a method of manufacturing the fine grooves according to the Example will be described below. FIG. 28 is a flowchart illustrating the method of manufacturing the fine grooves according to the Example. The method of manufacturing such fine grooves as shown in FIGS. 27A to 27D includes a step (S800) of forming a first groove portion having a width Sa1 by performing first etching and a step (S810) of forming a second groove portion having a width Sat wider than the width Sa1 below the first groove portion by performing second etching. The intensity of the second etching is higher than that of the first etching. A case in which anisotropic etching is used as the first etching and isotropic etching is used as the second etching will be described below as an example.

Figure 29A:
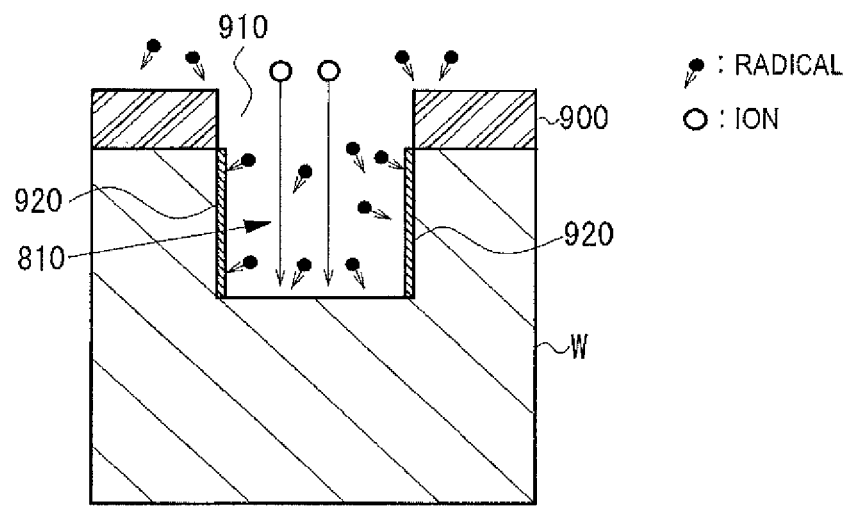
FIGS. 29A and 29B are schematic cross-sectional views showing a process of manufacturing a fine groove having a flask shape by using the manufacturing method according to the Example of the present invention.
Figure 29B:
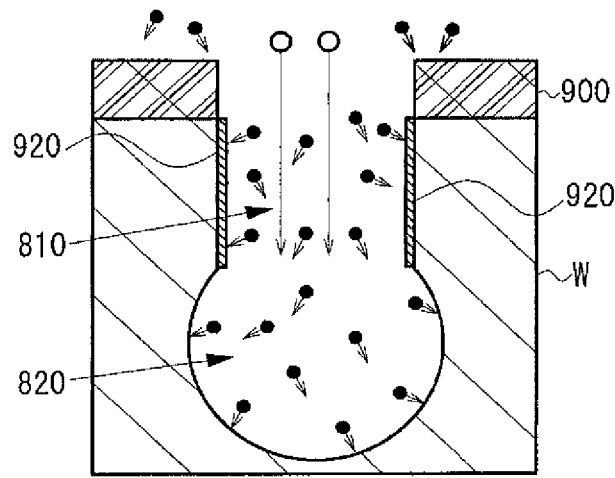

FIGS. 29A and 29B are schematic cross-sectional views illustrating a process of manufacturing the fine groove 800 shown in FIG. 27A. A photoresist 900 is formed on the front face of a GaAs substrate W. The photoresist is an i-ray resist having a viscosity of 100 cpi and is coated to a thickness of approximately 8 μm, for example. An opening 910 is formed in the photoresist 900 by a known photolithographic process using an i-ray stepper and a developer solution of TMAH 2.38%, for example. The width of this opening 910 is set to the width Sa1 of the first groove portion.

A first groove portion 810 is formed on the front face of the substrate by anisotropic etching by using the photoresist 900 as an etching mask. In a preferable mode, an induction coupling plasma (ICP) is used as a reactive ion etching (RIE) apparatus. The etching conditions are as follows: an induction coupling plasma (ICP) power of 500 W, a bias power of 50 W, a pressure of 3 Pa, an etching gas composed of $Cl_2$=150 sccm, $BCl_3$=50 sccm and $C_4F_8$=20 sccm, and an etching time of 20 minutes, for example. A protection film 920 is formed on the side walls of the groove at the same time when the etching is performed by adding a CF-based gas using a known method. Radicals and ions are generated from the plasma of a reaction gas. Although the side walls of the groove are attacked only by the radicals, the side walls are not etched since the protection film 920 is provided for protection. On the other hand, the protection film is removed from the bottom section of the groove by the ions being incident in the vertical direction at the bottom section, and the portion from which the protection film has been removed is etched by the radicals. As a result, anisotropic etching is accomplished.

Next, the etching conditions are changed and isotropic etching is performed. In this case, for example, the supply of $C_4F_8$ for forming the protection film 920 to be used to protect the side walls is stopped. The etching conditions are as follows: an induction coupling plasma (ICP) power of 500 W, a bias power of 50 W, a pressure of 3 Pa, an etching gas composed of $Cl_2$=150 sccm and $BCl_3$=50 sccm, and an etching time of 10 minutes. Since the supply of $C_4F_8$ is stopped, the protection film 920 for protecting the side walls is not formed. Hence, isotropic etching is accomplished at the bottom section of the first groove portion 810. As a result, a second groove portion 820 is formed below the first groove portion 810. The second groove portion 820 has spherical side faces and a spherical bottom face expanding further sideways and downward from the width Sa1 of the first groove portion 810. The above-mentioned etching conditions are only examples and can be changed appropriately depending on the width, depth, shape, etc. of the fine groove.

Such a shape as shown in FIG. 27C is formed by merely making the intensity of the etching lower in the direction of the side walls at the time when the second groove portion is formed than that at the time when the second groove portion shown in FIG. 27A is formed. The intensity of the etching in the direction of the side walls can be changed by changing the etching conditions, such as the output of an etching apparatus and the type of the etching gas. More specifically, for example, the supply of $C_4F_8$ serving as the gas for protecting the side walls may not be stopped completely but the flow rate thereof may be made lower than that at the time when the first groove portion is formed, or the flow rate of, for example, $Cl_2$ serving as the gas for performing the etching may be increased, or these may be combined. In other words, in both the case in which the first groove portion is formed and the case in which the second groove portion is formed, although both the gas for protecting the side walls and the gas for performing the etching contained in the etching gas are supplied, the groove portions may merely be formed by changing the respective flow rates. Furthermore, the first groove portion and the second groove portion can be formed in a series of continuous etching steps by preliminarily setting the above-mentioned flow rates before the formation of the first groove portion. In the case that the first groove portion is formed into a shape (forward tapered shape) so as to become narrower from the front face to the back face of the substrate to suppress the remaining of the adhesive layer, the flow rates of $C_4F_8$ and $Cl_2$ and the output of the etching apparatus may merely be optimized or the flow rates may merely be switched so that such a shape is obtained. Moreover, such a shape as shown in FIG. 27D can be formed by omitting the formation of the first groove portion shown in FIG. 27C. What's more, this kind of etching is generally accomplished as isotropic etching.

Although the method of manufacturing the fine grooves according to the Example has been described above, other methods may also be used, provided that the first groove portion and the second groove portion wider than the first groove portion can be formed. For example, the combination of dry etching and wet etching may also be used to form the groove portions. Furthermore, the first groove portion is not required to be formed by only the first etching, and the second groove portion is not required to be formed by only the second etching. In other words, if the first etching is main etching for the first groove portion, etching other than the first etching may be included, and if the second etching is main etching for the second groove portion, etching other than the second etching may be included. Moreover, since at least the first groove portion and the second groove portion may merely be required to be formed, for example, third and fourth groove portions may also be provided between the first groove portion and the second groove portion or at a position closer to the back face side of the substrate than the position of the second groove portion, and these groove portions may be formed by third etching and fourth etching.

The exemplary embodiment according to the present invention has been described above in detail. "The stepped section to be formed due to the difference between the width of the groove on the front face side and the width of the groove on the back face side" in each Example includes not only the stepped section in a state in which the width of the groove on the back face side is wider than the width of the groove on the front face side, but also a stepped section that is formed when the width of the groove on the front face side is formed so as to be wider than the width of the groove on the back face side, for example, in the case that such a groove as shown in each of FIGS. 27A to 27D, that is, a groove on the front face side having a non-constant width, is adopted. Furthermore, "the width of the groove on the front face side" in the description of "forming grooves on the back face side communicating with the grooves on the front face side using a rotating cutting member having a thickness thicker than the width of the grooves on the front face side" in each Example is the width of the inlet portion of the groove on the front face side. In other words, "the width of the groove on the front face side" is used to clearly describe the configuration for increasing the number of semiconductor chips that can be acquired from a single substrate in comparison with the case of full dicing. This is because the number of semiconductor chips that can be acquired from a single substrate is determined by the width of the groove near the front face of the substrate on which function elements are formed instead of the width of the groove on the back face side below the groove on the front face side, that is, the width of the inlet portion of the groove on the front face side. On the other hand, the width of the groove on the front face side that is required for the judgment as to whether the top section is included or becomes away from the width of the groove on the front face side is the maximum width from the position of the bottom section of the groove on the front face side to the position at which the top section of the dicing blade arrives as described earlier. Furthermore, the suppression of the breakage in this specification is not limited to suppression in which chipping, cracking, etc. are suppressed to the extent that they are not recognized visually but the suppression includes suppression for suppressing breakage to some extent and suppression capable of reducing the possibility of the occurrence of breakage to some extent. The degree of the suppression does not matter.

The method of designing the tip end shape of the dicing blade having been described referring to FIG. 17 can also be described as follows. That is to say, the method is a method of manufacturing semiconductor chips, provided with a step of forming grooves on the back face side communicating with grooves on the front face side using a rotating cutting member having a thickness thicker than the width of the grooves on the front face side from the back face of a substrate and dicing the substrate into semiconductor chips having stepped sections that are formed due to the difference between the width of the grooves on the front face side and the width of the grooves on the back face side, wherein the process is a process in which the grooves on the back face side are formed using dicing blades having a plurality of tip end shapes with different tapered degrees for the grooves on the front face side having a shape to be adopted in a mass-production process, and in the case that, as the result of the formation of the grooves on the back face side, both a first tapered degree range in which the stepped section is broken due to the small tapered degree of the tip end shape and a second tapered degree range in which the tapered degree is larger than that in the first tapered degree range and the stepped section is not broken are present, the grooves on the back face side are formed by using a cutting member having a tapered degree included in the second tapered degree range in a mass-production process.

Moreover, the present invention is not limited to a specific exemplary embodiment but can be modified and changed variously within the scope of the gist of the present invention described in the claims. For example, the present invention may also be applied to a case in which elements are individualized from a substrate made of glass, polymer, etc. not containing semiconductors. For example, the present invention may also be applied to substrates for MEMS not containing semiconductors. Moreover, at least some of the respective steps in the exemplary embodiment of the present invention may be performed in a design stage prior to a mass-production process or all of the steps may be performed as part of a mass-production process, provided that there is no contradiction in sequence. Still further, the respective steps according to the exemplary embodiment of the present invention may be performed by a plurality of entities (others). For example, a first entity forms grooves on the front face side of a substrate, the first entity supplies the substrate in which the grooves on the front face side have been formed to a second entity, thereby preparing the substrate, and the second entity forms grooves on the back face side of the prepared substrate and then dices (divides) the substrate. In other words, the first entity may prepare the substrate in which the grooves on the front face side have been formed or the second entity may prepare the substrate by itself.

What is claimed is:

1. A method of manufacturing semiconductor chips comprising:
    forming first grooves on a front face side of a substrate;
    forming second grooves on a back face side of the substrate, the second grooves being opened to the first grooves, respectively, by using a rotating cutting member having a tip end section that has a cutting width wider than each width of the first grooves;
    dicing the substrate into semiconductor chips having stepped sections that are formed due to the difference between widths of the first grooves and widths of the second grooves;
    preliminarily processing an unprocessed tip end section before forming the second grooves to form the tip end section,
    the tip end section having a first tapered degree which does not break the stepped section, and the unprocessed tip end section having a second tapered degree which does break the stepped section.

2. A method of manufacturing semiconductor chips according to claim 1, wherein the first grooves are formed by dry etching.

3. A method of manufacturing semiconductor chips according to claim 1, wherein the cutting member is a dicing blade.

4. A method of manufacturing semiconductor chips comprising:
    forming first grooves on a front face side of a substrate;
    forming second grooves on a back face side of the substrate, the second grooves being opened to the first grooves, respectively, by using a rotating cutting member having a processed tip end section that has a cutting width wider than each width of the first grooves;
    dicing the substrate into semiconductor chips having stepped sections that are formed due to the difference between widths of the first grooves and widths of the second grooves;
    preliminarily processing an unprocessed tip end section before forming the second grooves to form the processed tip end section,
    the processed tip end section being formed by tapering the unprocessed tip end section such that the processed tip end section is formed to have a tapered degree which applies to root regions of the stepped sections a stress less than a yield stress of breaking the stepped sections, and
    the unprocessed tip end section applying to the root regions in which a stress not less than the yield stress of breaking the stepped sections.

5. A method of manufacturing semiconductor chips according to claim 4, wherein the step of preliminary processing includes tapering the unprocessed cutting member more than a cutting member having a semicircular tip end section.

6. The method of manufacturing semiconductor chips according to claim 4, wherein the step of preliminary processing includes processing the unprocessed tip end section into a tapered tip end shape having no top face at a top section of the tapered tip, and
    a position of the top section in a width direction of the first grooves is within a range of the first grooves.

7. The method of manufacturing semiconductor chips according to claim 4, wherein a center of the cutting width is within a range of the first grooves.

8. The method of manufacturing semiconductor chips according to claim 4, the method further comprising:
    preparing a cutting member having a substantially rectangular shape in cross section as viewed from the rotation direction; and
    confirming the state of breakage of the stepped sections when the second grooves on the back face side are formed using the prepared cutting member, wherein
    when a stepped section is broken by the prepared cutting member, the step of preliminarily processing is performed.

9. A method of manufacturing semiconductor chips comprising:
    forming first grooves on a front face side of a substrate;
    forming second grooves on a back face side of the substrate, the second grooves being opened to the first grooves, respectively, using a rotating cutting member having a tip end section that has a cutting width wider than each width of the first grooves;
    dicing the substrate into semiconductor chips having stepped sections that are formed due to the difference between widths of the first grooves and widths of the second grooves; and
    preliminarily processing an unprocessed tip end section before forming the second grooves to form the tip end section,
    the unprocessed tip end section having a tapered degree to form a top section of the unprocessed tip end section which applies a maximum stress which breaks the stepped sections,
    wherein the tapered degree of the unprocessed tip end section is made smaller so that the cutting member has a tapered degree forming a top section of the cutting member which applies a maximum stress which does not break the stepped section.

10. The method of manufacturing semiconductor chips according to claim 9, wherein the step of preliminarily processing is performed in a manufacturing condition in which a position of the top section of the cutting member in a width direction of the first grooves is not included in a range of the first grooves.

11. The method of manufacturing semiconductor chips according to claim 9, wherein the method further comprises:
    confirming whether there is a case in which a position of the top section of the cutting member in a width direction of the first grooves is not included in a range of the first grooves, wherein
    the step of preliminarily processing is performed in manufacturing conditions in which the position is not included in a range of the first grooves.

* * * * *